(12) United States Patent
Mukao

(10) Patent No.: US 6,606,080 B2
(45) Date of Patent: Aug. 12, 2003

(54) SEMICONDUCTOR DISPLAY DEVICE AND ELECTRONIC EQUIPMENT

(75) Inventor: Kyouichi Mukao, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 172 days.

(21) Appl. No.: 09/739,673

(22) Filed: Dec. 20, 2000

(65) Prior Publication Data

US 2001/0045932 A1 Nov. 29, 2001

(30) Foreign Application Priority Data

Dec. 24, 1999 (JP) .......................................... 11-365717

(51) Int. Cl.$^7$ ............................... G09G 3/36; G09G 5/00
(52) U.S. Cl. ........................... 345/98; 345/92; 345/100; 345/206
(58) Field of Search ................................ 345/57, 59, 62, 345/66, 69, 92, 98, 100, 206, 540–546

(56) References Cited

U.S. PATENT DOCUMENTS

| 5,247,190 A | | 9/1993 | Friend et al. ................. 257/40 |
| 5,399,502 A | | 3/1995 | Friend et al. ................. 437/1 |
| 5,434,599 A | * | 7/1995 | Hirai et al. ................. 345/100 |
| 5,643,826 A | | 7/1997 | Ohtani et al. ............... 438/150 |
| 5,923,962 A | | 7/1999 | Ohtani et al. ................. 437/88 |
| 6,040,826 A | * | 3/2000 | Furukawa ................... 345/100 |
| 6,147,667 A | * | 11/2000 | Yamazaki et al. ............ 257/59 |
| 6,232,945 B1 | * | 5/2001 | Moriyama et al. .......... 345/100 |
| 6,271,818 B1 | * | 8/2001 | Yamazaki et al. ............ 257/59 |
| 6,407,730 B1 | * | 6/2002 | Hori ............................ 345/100 |

FOREIGN PATENT DOCUMENTS

WO WO90/13148 11/1990

OTHER PUBLICATIONS

Herman Schenk et al., "Polymers for Light Emitting Diodes", EuroDisplay '99 Proceedings, pp. 33–37; Sep. 6–9, 1999.
Japanese Patent Application Laid–Open No. 07–130652 (English Abstract attached).
Japanese Patent Application Laid–Open No. 10–092576 (English Abstract attached).

* cited by examiner

*Primary Examiner*—Bipin Shalwala
*Assistant Examiner*—Prabodh M. Dhara
(74) *Attorney, Agent, or Firm*—Fish & Richardson P.C.

(57) ABSTRACT

A semiconductor device capable of displaying images having many tones with a high precision and with a high resolution is provided. The semiconductor device is characterized in that the order of m divided video signals changes before they are inputted to buffer circuits, and, after the m divided video signals are outputted from the buffer circuits, the order of the m divided video signals returns to the original order.

21 Claims, 33 Drawing Sheets

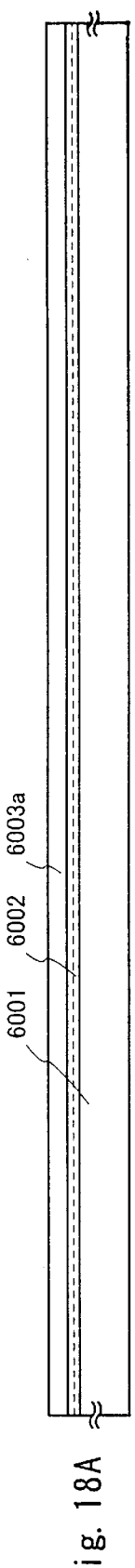
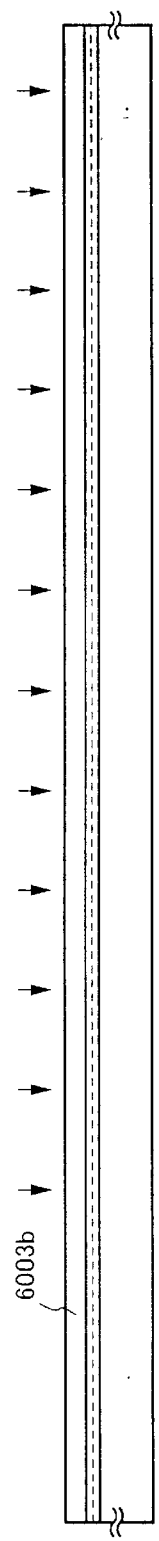
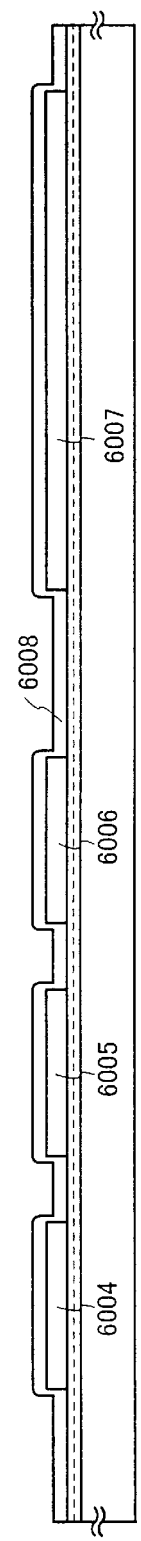
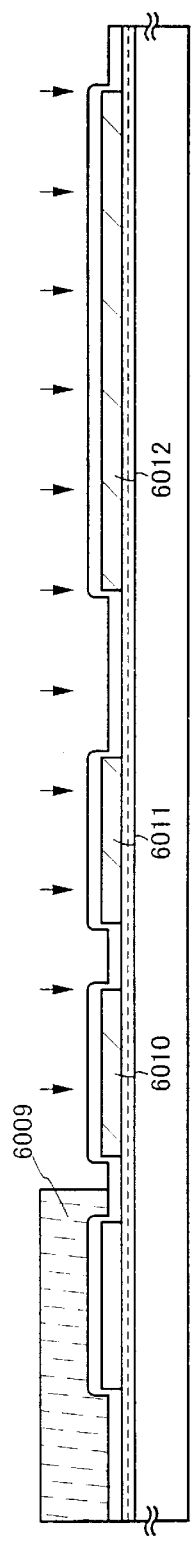

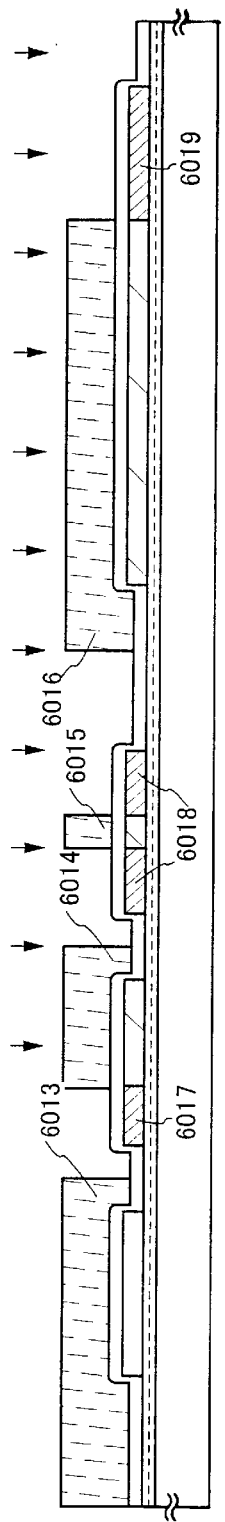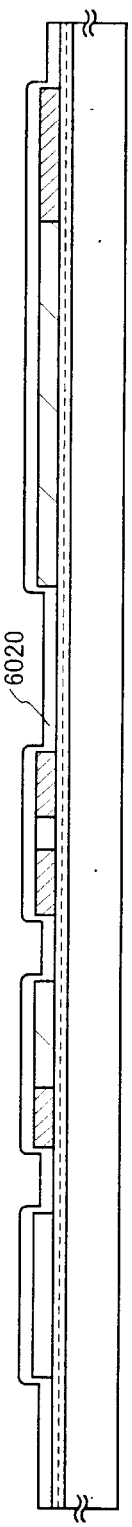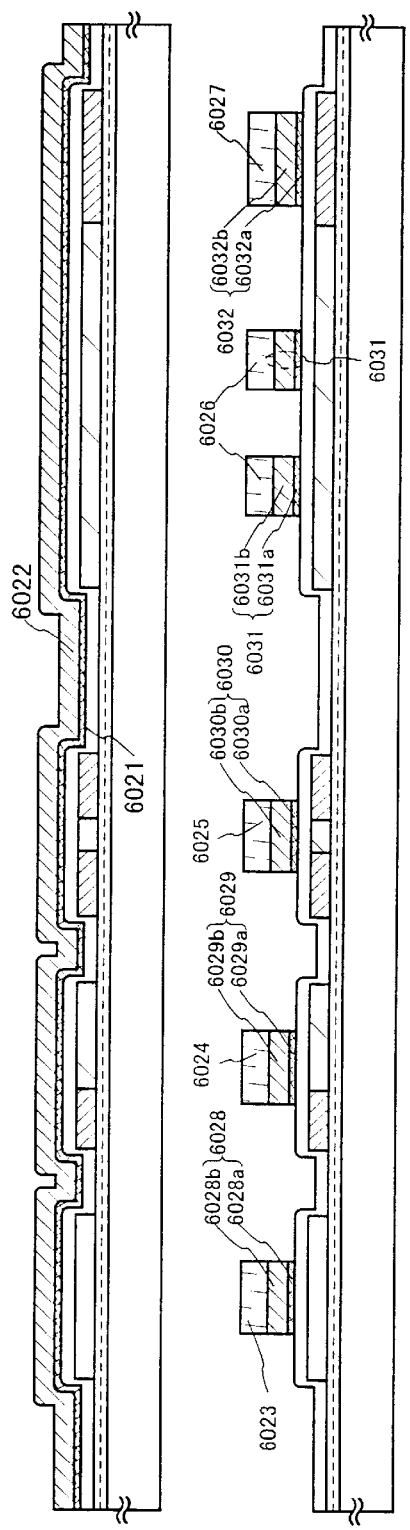

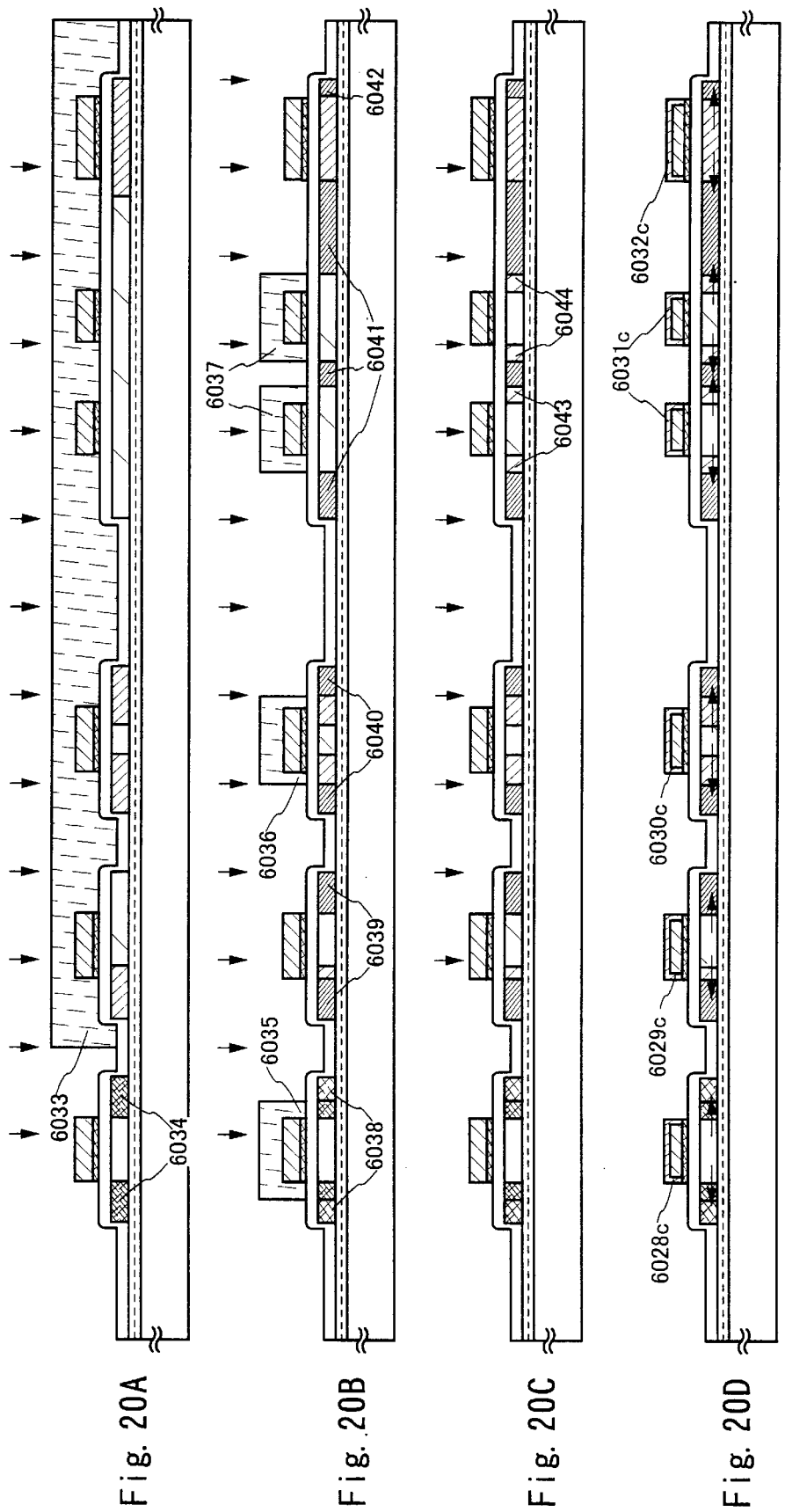

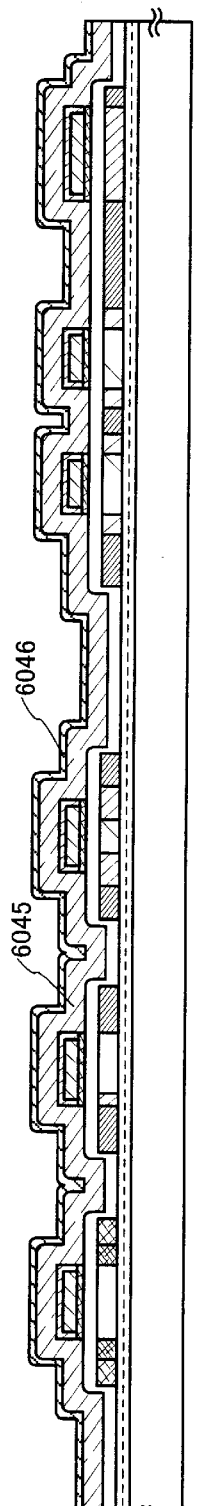
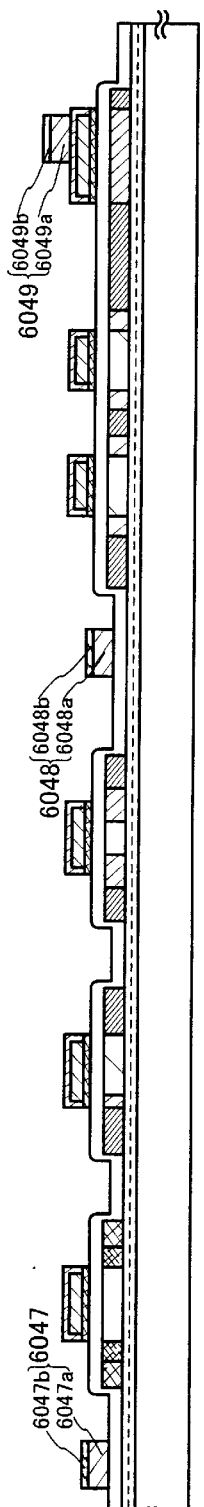
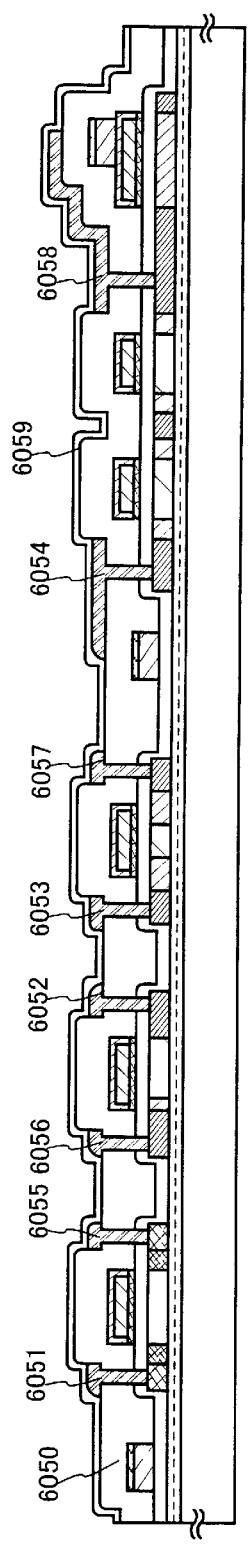
Fig. 21A
Fig. 21B
Fig. 21C

SEMICONDUCTOR DISPLAY DEVICE AND ELECTRONIC EQUIPMENT

BACKGROUND OF THE INVENTION

1. Field of the Invention

The present invention relates to a driving circuit of a semiconductor display device. More particularly, the present invention relates to a circuit for generating an analog signal or a digital signal to be inputted to a source signal line driving circuit of a semiconductor display device. More particularly, the present invention relates to a circuit for processing a parallel analog or a digital divided signal outputted from a dividing circuit for performing serial-to-parallel conversion (Serial-to-Parallel Conversion Circuit: SPC) before it is inputted to a source signal line driving circuit. The present invention also relates to a semiconductor display device having a circuit for generating an analog signal or a digital signal to be inputted to a source signal line driving circuit.

2. Description of the Related Art

Technology for manufacturing a semiconductor device formed on an insulating substrate using a semiconductor thin film, for example, a thin film transistor (TFT), has rapidly developed these days. The reason for it is the growing demand for a semiconductor display device using semiconductor devices (representatively, an active matrix semiconductor display device). It is to be noted that an insulating substrate having a semiconductor device formed on the surface thereof is herein referred to as an active matrix substrate.

An active matrix semiconductor display device displays an image by controlling, with TFTs of the pixels, charge of several hundreds of thousands of or several million pixel electrodes arranged to be matrix-like.

A driving circuit of an active matrix semiconductor display device is required to operate at high speed. Among driving circuits, in particular, a source signal line driving circuit is required to input signals sequentially to all the pixel TFTs connected to a gate signal line during a time period when a signal is inputted to the gate signal line. The source signal line driving circuit is thus required to operate at higher speed than the speed at which the gate signal line driving circuit operates. For example, in case of a VGA active matrix semiconductor display device, the driving frequency of the source signal line driving circuit is typically about 20 MHz.

An active matrix semiconductor display device is expected to display images having many tones with a high precision and with a high resolution, which invokes the tendency for the number of pixels in the horizontal direction (horizontal number of pixels: Hn) of the active matrix semiconductor display device to increase.

As the horizontal number of pixels Hn increases, the source signal line driving circuit is required to be operated at higher speed. If the operating speed of the source signal line driving circuit is lowered, the image display speed is lowered, and thus, various problems such as flicker of the displayed image are caused.

In order to increase the horizontal number of pixels of the active matrix semiconductor display device while the above-mentioned various problems are avoided, it is necessary to make higher the driving frequency of the source signal line driving circuit. However, as the driving frequency of the source signal line driving circuit is made higher, the response time of TFTs of the source signal line driving circuit may not keep up with the driving frequency of the source signal line driving circuit, which may make the operation impossible or may lower the reliability.

Accordingly, in order to suppress the driving frequency of the source signal line driving circuit without lowering the image display speed, a dividedly driving method is conventionally used. Divided driving is a driving method where pixels arranged in the horizontal direction are divided into m groups, and a signal having image information is simultaneously inputted to the respective groups of the pixels during one line period.

It is to be noted that, as used herein, the term "one line period" means a time period from a time point when a signal having image information is inputted to a first pixel of pixels in one line arranged in the horizontal direction to a time point just before a signal having image information is inputted to a first pixel of the next line.

In case of driving divided into m (m is a positive number larger than 1, generally a natural number), if the length of one line period is the same as in the case where no dividing is performed, the period where a signal having image information (an image signal) is inputted per pixel is m times as long as that in the case where no dividing is performed. This means that the driving frequency of the source signal line driving circuit becomes 1/m, and thus, it is possible to lower the driving frequency of the source signal line driving circuit such that the source signal line driving circuit is completely operable.

In case of driving divided into m, video signals (divided video signals) having image information corresponding to m pixels, respectively are sampled by the source signal line driving circuit, and are simultaneously inputted as m image signals to the respective m pixels.

Divided video signals to be inputted to the source signal line driving circuit are, generally, generated by a circuit group provided on an IC chip (a semiconductor circuit formed of MOSFETs formed on single crystalline silicon) connected through an FPC (a flexible print circuit) to an active matrix substrate. FIG. 17 illustrates a circuit group for generating divided video signals to be inputted to a source signal line driving circuit in an analog-driven active matrix semiconductor display device.

Reference numerals 901, 902, 903, 904, 905, and 906 denote a control circuit, an A/D conversion circuit, a γ correction circuit, a D/A conversion circuit, a dividing circuit, and a buffer circuit group, respectively.

An Hsync signal and a Vsync signal are inputted to the control circuit 901. A clock signal (CK), a start pulse signal (SP), and the like for driving the source signal line driving circuit are inputted from the control circuit 901 to the source signal line driving circuit. Further, signals for driving the A/D conversion circuit 902, the γ correction circuit 903, the D/A conversion circuit 904, and the dividing circuit 905 are inputted from the control circuit 901 to the respective circuits.

An analog video signal having image information is inputted to the A/D conversion circuit 902. The analog video signal inputted to the A/D conversion circuit 902 is converted to a digital video signal and is inputted to the γ correction circuit 903. The digital video signal inputted to the γ correction circuit 903 is inputted to the D/A conversion circuit 904 after γ correction. The digital video signal inputted to the D/A conversion circuit 904 is again converted to an analog video signal and is inputted to the dividing circuit 905.

The analog video signal inputted to the dividing circuit 905 is subject to serial-parallel conversion, and is converted to divided video signals into the number of which is the same as the number of divisions of the divided driving. In case of driving divided into m, the analog video signal is converted to m divided video signals.

The m divided video signals are inputted to the buffer circuit group 906. The buffer circuit group 906 has buffer circuits 906_1-906_m, and the m divided video signals are inputted to the corresponding buffer circuits 906_1 to 906_m, respectively.

By the way, when a signal outputted from a certain circuit is inputted to another circuit, the leading edge or the trailing edge of the signal is sometimes obtuse such that the waveform of the signal can not be rectangular or the potential and the amplitude of the signal may be changed. This is because of the existence of load capacity (parasitic capacitance) in the circuit where the signal is inputted. This is a phenomenon which is observed more outstandingly as the number of circuit elements of the circuit where the signal is inputted increases and the structure of the circuit becomes more complicated accordingly. A buffer circuit is a circuit which, when a signal outputted from a certain circuit is inputted to another circuit, performs buffering and amplification without change in the waveform, potential, and amplitude in the signal.

The m divided video signals are buffered and amplified by the buffer circuits 906_1 to 906_m, and are inputted to the source signal line driving circuit. Then, in case of an analog-driven active matrix semiconductor display device, the m divided video signals are sampled by the source signal line driving circuit, and are inputted as m image signals to the corresponding pixels through the source signal lines.

All of the buffer circuits 906_1 to 906_m of the buffer circuit group 906 are theoretically of the same structure. However, actually, the characteristics of the individual buffer circuits are not completely the same. Depending on the buffer circuit, the extent of the amplification of the amplitude (amplification ratio) of the outputted signal may be different from that of the inputted signal, or the outputted signal may have an offset potential. The characteristics of a buffer circuit depend on the manufacturing error of circuit elements of the buffer circuit and the ambient temperature of the buffer circuit.

Therefore, the potential and the amplitude of a divided video signal outputted from a buffer circuit is always influenced by the characteristics of the buffer circuit. It follows that a divided video signal outputted from a buffer circuit having different characteristics has amplitude different from those of other divided video signals or has an offset potential, and has potential difference from other divided video signals.

When a divided video signal having potential difference is sampled by the source signal line driving circuit, the image signal inputted to a pixel by the sampling also has potential difference. The potential difference of the image signal is displayed as a brighter or darker portion, and a stripe due to the brightness/darkness (a division stripe) is visually recognized by an observer.

SUMMARY OF THE INVENTION

In view of the above, an object of the present invention is to provide an active matrix semiconductor display device capable of displaying an image having many tones with a high precision and with a high resolution where a division stripe is unliable to be visually recognized by an observer during dividedly driving.

The inventor of the present invention thought that a division stripe was visually recognized by an observer because a brighter portion or a darker portion displayed on a screen due to the potential difference in the image signal always appeared in pixels connected to a particular source signal line. The inventor of the present invention further thought that this was because a plurality of divided video signals outputted from a dividing circuit are always inputted to particular buffer circuits corresponding to the respective divided video signals.

According to the present invention, a plurality of divided video signals outputted from a dividing circuit are not always inputted to particular buffer circuits, respectively, but are inputted to different buffer circuits in every different time period. More specifically, a plurality of divided video signals to be inputted biuniquely correspond to a plurality of buffer circuits to which the divided video signals are inputted, respectively, and the plurality of buffer circuits corresponding to the plurality of divided video signals, respectively, replace one another every time when a predetermined time period elapses. In other words, the combination of the divided video signals and the buffer circuits is changed every time when a predetermined time period elapses.

Because of the above-described structure, even if a division stripe is displayed on the screen due to potential difference between a divided video signal outputted from a buffer circuit having different characteristics and other divided video signals, since the place where the division stripe is displayed moves every time when a predetermined time period elapses, the division stripe is unliable to be visually recognized by an observer.

It is to be noted that, in the present invention, to set the number of patterns of the combination of the divided video signals and the buffer circuits, and the time period until the combination changes such that a division stripe is unliable to be visually recognized by an observer is important. The larger the number of patterns of the combination of the divided video signals and the buffer circuits is, the more unliable a division stripe is to be visually recognized by an observer, which is preferable. The time period until the combination changes is preferably as short as possible, and is preferably ½₀ sec. or shorter.

According to the present invention, when divided driving is performed, a division stripe is unliable to be visually recognized by an observer. Further, since divided driving is performed, images having many tones can be displayed with a high precision and with a high resolution.

The structure of the present invention is as follows.

According to an aspect of the present invention, a semiconductor display device comprising m buffer circuits and a source signal line driving circuit is provided, wherein the m buffer circuits correspond to m divided video signals as parallel data, respectively, the m buffer circuits corresponding to the m divided video signals, respectively, replace one another every time when a predetermined time period elapses, the m divided video signals inputted to the m buffer circuits are outputted from the m buffer circuits to be inputted to the source signal line driving circuit, and the m divided video signals inputted to the source signal line driving circuit are sampled and are inputted to given m source signal lines corresponding to the m divided video signals, respectively.

According to another aspect of the present invention, a semiconductor display device comprising a dividing circuit, a first replacing circuit, a second replacing circuit, m buffer circuits, and a source signal line driving circuit is provided, wherein m divided video signals formed by serial-parallel conversion of a video signal are outputted from the dividing circuit, the m divided video signals outputted from the dividing circuit are inputted to the first replacing circuit, the m divided video signals inputted to the first replacing circuit are inputted to the corresponding m buffer circuits, respectively, the m divided video signals inputted to the m buffer circuits are outputted from the m buffer circuits to be inputted to the second replacing circuit, the m divided video signals inputted to the second replacing circuit are inputted to given m divided video signal lines corresponding to the m divided video signals, respectively, the m divided video signals inputted to the m divided video signal lines are inputted to the source signal line driving circuit, sampled, and inputted to given m source signal lines corresponding to the m divided video signals, respectively, and the m buffer circuits corresponding to the m divided video signals replace one another every time when a predetermined time period elapses.

According to still another aspect of the present invention, a semiconductor display device comprising a dividing circuit, a first replacing circuit, m buffer circuits, and a source signal line driving circuit is provided, wherein the source signal line driving circuit has a second replacing circuit, m divided video signals formed by serial-parallel conversion of a video signal are outputted from the dividing circuit, the m divided video signals outputted from the dividing circuit are inputted to the first replacing circuit, the m divided video signals inputted to the first replacing circuit are inputted to the corresponding m buffer circuits, respectively, the m divided video signals inputted to the m buffer circuits are outputted from the m buffer circuits to be inputted to the second replacing circuit, the m divided video signals inputted to the second replacing circuit are sampled and inputted to given m source signal lines corresponding to the m divided video signals, respectively, and the m buffer circuits corresponding to the m divided video signals replace one another every time when a predetermined time period elapses.

The semiconductor display device may be characterized in that replacement of the m buffer circuits corresponding to the m divided video signals, respectively, is controlled by a replacement data circuit.

The semiconductor display device may be characterized in that how the m buffer circuits corresponding to the m divided video signals, respectively, replace one another is determined by a replacement data circuit.

The semiconductor display device may be characterized in that the replacement data circuit comprises a memory circuit and a counter circuit, and a plurality of replacement data having information with regard to the combination of the m buffer circuits corresponding to the m divided video signals, respectively, are stored in the memory circuit, and one of the replacement data is selected by the counter circuit.

According to another aspect of the present invention, a semiconductor display device comprising a multiplexer circuit, 1 D/A conversion circuit, and 1 dividing circuit is provided, wherein the 1 D/A conversion circuit corresponds to 1 digital distribution signal outputted from the multiplexer circuit, respectively, the 1 D/A conversion circuits corresponding to the 1 digital distribution signals, respectively, replace one another every time when a predetermined time period elapses, and the 1 digital distribution signal inputted to the 1 D/A conversion circuit is converted to 1 analog distribution signal and are inputted to the corresponding given 1 dividing circuit, respectively.

The semiconductor display device may be characterized in that liquid crystal is used.

The semiconductor display device may be characterized in that EL is used.

The present invention may be implemented in a computer using the semiconductor display device.

The present invention may be implemented in a video camera using the semiconductor display device.

The present invention may be implemented in a DVD player using the semiconductor display device.

BRIEF DESCRIPTION OF THE DRAWINGS

In the accompanying drawings:

FIGS. 18A to 18D illustrate a manufacturing process of a TFT used in the present invention;

FIGS. 19A to 19D illustrate the manufacturing process of the TFT used in the present invention;

FIGS. 20A to 20D illustrate the manufacturing process of the TFT used in the present invention;

FIGS. 21A to 21C illustrates the manufacturing process of the TFT used in the present invention;

DETAILED DESCRIPTION OF THE PREFERRED EMBODIMENTS

Figure 1:
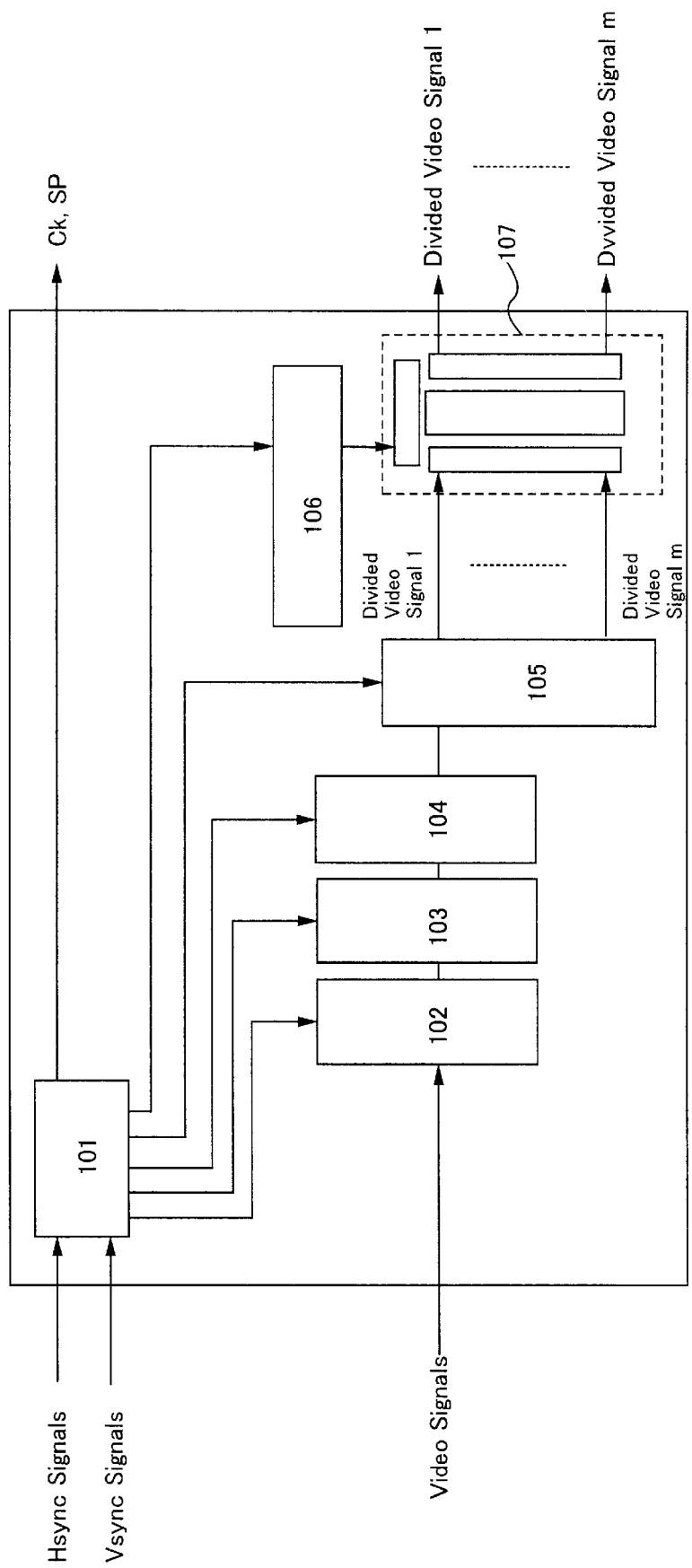
FIG. 1 is a block diagram of a circuit group for generating divided video signals according to the present invention.

A circuit group for generating divided video signals according to the present invention is described with reference to FIG. 1. It is to be noted that, here, a case where an analog-driven active matrix semiconductor display device is dividedly driven into m divisions is described.

Reference numerals 101, 102, 103, 104, 105, and 106 denote a control circuit, an A/D conversion circuit, a γ correction circuit, a D/A conversion circuit, a dividing circuit, and a replacement data circuit, respectively.

An Hsync signal and a Vsync signal are inputted to the control circuit 101. A clock signal (CK), a start pulse signal (SP), and the like for driving the source signal line driving circuit are inputted from the control circuit 101 to the source signal line driving circuit. Further, signals for driving the A/D conversion circuit 102, the γ correction circuit 103, the D/A conversion circuit 104, the dividing circuit 105, and the replacement data circuit 106 are inputted from the control circuit 101 to the respective circuits.

An analog video signal having image information is inputted to the A/D conversion circuit 102. The analog video signal inputted to the A/D conversion circuit 102 is converted to a digital video signal by the A/D conversion circuit 102 and is inputted to the γ correction circuit 103. The digital video signal inputted to the γ correction circuit 103 is, after γ correction, inputted to the D/A conversion circuit 104. The digital video signal inputted to the D/A conversion circuit 104 after the r correction is again converted to an analog video signal and is inputted to the dividing circuit 105.

The analog video signal inputted to the dividing circuit 105 is subject to serial-parallel conversion, and is converted to divided video signals the number of which is the same as the number of divisions of the divided driving. In case of driving divided into m, the analog video signal is converted to m divided video signals.

Figure 2:
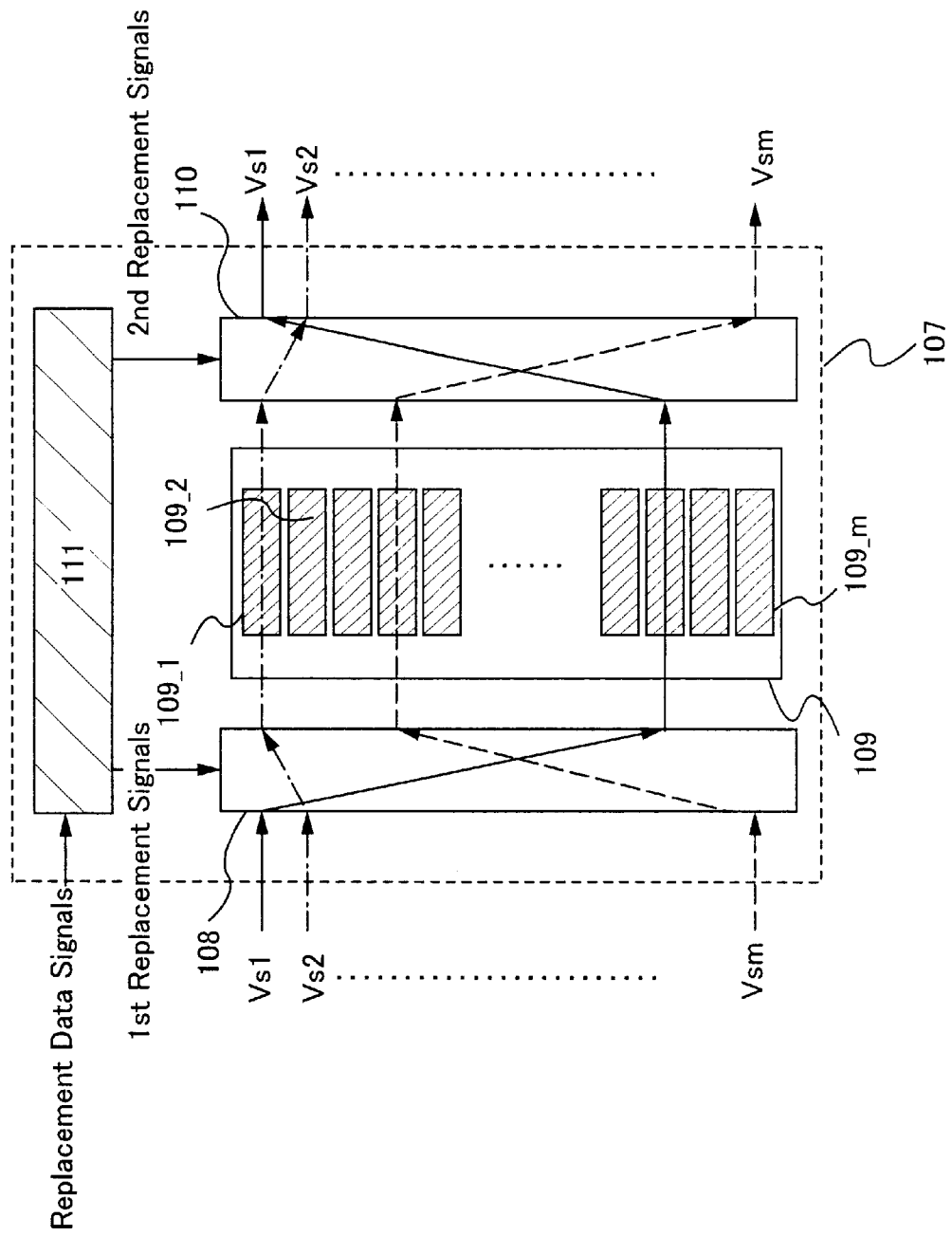
FIG. 2 is a block diagram of part of the circuit group for generating divided video signals.

The m divided video signals are simultaneously inputted to a first replacing circuit 108. FIG. 2 is a detailed block diagram of a portion 107 surrounded by a dashed line. Reference numerals 108, 109, 110, and 111 denote the first replacing circuit, a buffer circuit group, a second replacing circuit, and a replacement data processing circuit, respectively. The buffer circuit group 109 has at least m buffer circuits (109_1 to 109_m).

The first replacing circuit 108 inputs the inputted divided video signals (Vs1 to Vsm) to the buffer circuits (109_1 to 109_m), respectively, using a first replacement signal inputted from the replacement data processing circuit 111. Here, the m divided video signals (Vs1 to Vsm) to be inputted biuniquely correspond to the m buffer circuits (109_1 to 109_m), respectively. Further, which divided video signal of the m divided video signals is inputted to which buffer circuit of the m buffer circuits is determined by the first replacement signal inputted from the replacement data processing circuit 111.

The m divided video signals (Vs1 to Vsm) inputted to the buffer circuits (109_1 to 109_m) are buffered and amplified by the respective buffer circuits, and are inputted to the second replacing circuit 110.

The second replacing circuit 110 inputs the m divided video signals (Vs1 to Vsm) outputted from the buffer circuits (109_1 to 109_m) to particular divided video signal lines (Vl1 to Vlm), respectively, using a second replacement signal inputted from the replacement data processing circuit 111. More specifically, independently of which of the m divided video signals (Vs1 to Vsm) is inputted to which of the buffer circuits (109_1 to 109_m) using the first replacement signal, the m divided video signals (Vs1 to Vsm) outputted from the m buffer circuits (109_1 to 109_m) are inputted to the predetermined divided video signal lines (Vl1 to Vlm), respectively.

The m divided video signals (Vs1 to Vsm) inputted to the divided video signal lines (Vl1 to Vlm) are inputted to the source signal line driving circuit. Then, in case of an analog-driven active matrix semiconductor display device, the m divided video signals are sampled by the source signal line driving circuit, and are inputted to m source signal lines connected to corresponding m pixels, respectively, as m signals having image information (image signals) corresponding to the pixels, respectively.

Next, the replacement data circuit 106 is described. By inputting a replacement data signal generated by the replacement data circuit 106 to the replacement data processing circuit 111, the first replacement signal and the second replacement signal are generated.

Figure 3:
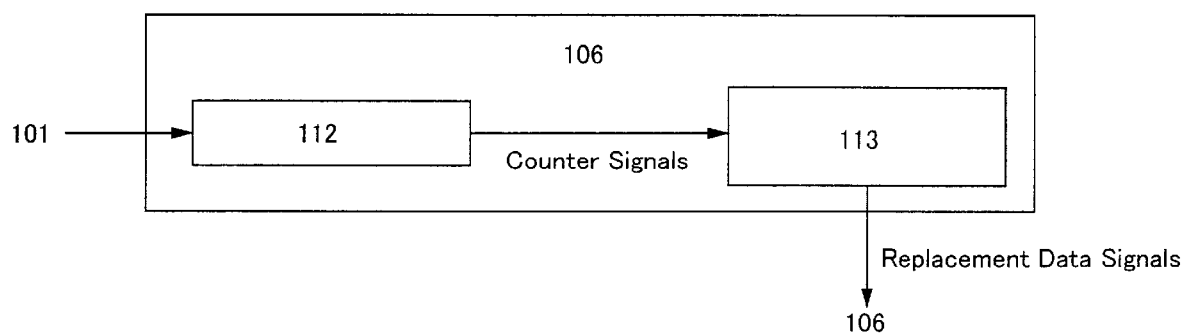
FIG. 3 is a block diagram of a replacement data circuit.

FIG. 3 is a block diagram of the replacement data circuit 106. Reference numerals 112 and 113 denote a counter circuit and a memory circuit, respectively. The memory circuit 113 stores q (q is a natural number which is 2 or larger) kinds of data with regard to which of the divided video signals is inputted to which of the buffer circuits, in other words, data with regard to the combination of the divided video signals (Vs1 to Vsm) and the buffer circuits (109_1 to 109_m) (replacement data).

The q kinds of combination of the divided video signals and the buffer circuits are stored as replacement data at Address 0 to Address (q−1), respectively, in a memory address of the memory circuit 113.

The counter circuit 112 is driven by a signal inputted from the control circuit 101, and determines a counter value for designating the address in the memory address of the memory circuit 113. For example, when the counter value is 0, 1, 2, or (q−1), the memory address of the memory circuit 113 is designated to be Address 0, Address 1, Address 2, or Address (q−1), respectively. The information with regard to the counter value is inputted as a counter signal from the counter circuit 112 to the memory circuit 113.

The address in the memory address is designated by the counter signal inputted to the memory circuit 113. Replacement data which is information with regard to the combination of the divided video signals and the buffer circuits stored in the designated address is inputted as the replacement data signal to the replacement data processing circuit 106.

It is to be noted that the counter value changes every time when a predetermined time period elapses. Every time when the counter value changes, information with regard to the counter value is transmitted as a counter signal to the memory circuit 113. The time period until the counter value changes corresponds to the time period until the combination of the divided video signals and the buffer circuits changes.

When the counter value completes the cycle from 0 to q−1, the counter value again goes through the cycle from 0 to q−1. More specifically, when the address in the memory address of the memory circuit 113 completes the cycle from Address 0 to Address (q−1), designation from Address 0 to Address (q−1) starts again. The order of the counter values is not specifically limited. The counter value may be 0, . . . q−1 in this order, or may be randomly changed.

The number q of the kinds of replacement data as the data with regard to the combination of the divided video signals (Vs1-Vsm) and the buffer circuits (109_1 to 109_m) is preferably as large as possible. However, the number q is sufficiently large if a division stripe can become more unliable to be visually recognized by an observer, compared with the conventional case illustrated in FIG. 17 where the combination of the divided video signals and the buffer circuits is not changed.

Figure 17:
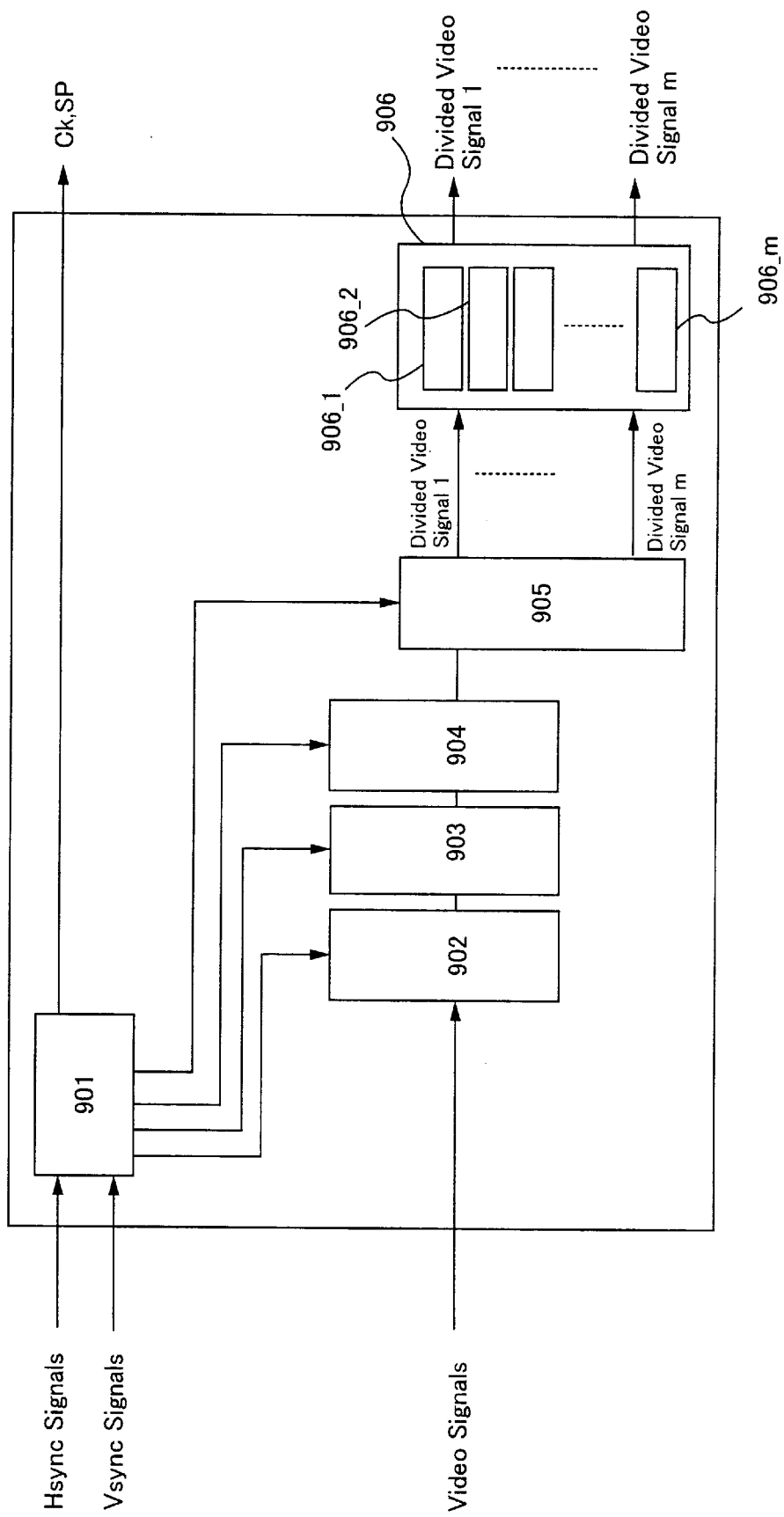
FIG. 17 is a block diagram of a conventional circuit group for generating divided video signals.

Further, the combination of the divided video signals and the buffer circuits to be stored in the memory circuit 113 may be anything with which a division stripe can become more unliable to be visually recognized by an observer, compared with the conventional case illustrated in FIG. 17 where the combination of the divided video signals and the buffer circuits is not changed. The combination of the divided video signals and the buffer circuits may be set using random numbers or other functions.

The combination of the divided video signals and the buffer circuits may be at random, but does not necessarily have to be at random, and may have certain regularity. For example, suppose that, in a certain time period, a divided video signal Vsp (p is an arbitrary number from 1 to m) is inputted to a buffer circuit 109_p. In the next time period, the divided video signal Vsp is inputted to a buffer circuit 109_(p+1) (if p=m, to the buffer circuit 109_1). Then, in the next time period, the divided video signal Vsp is inputted to a buffer circuit 109_(p+2) (if p=m, to the buffer circuit 109_2, and, if p=m+1, to the buffer circuit 109_1). In this way, it may be that, with regard to a certain divided video signal, the corresponding buffer circuit may be replaced with certain regularity.

It is to be noted that, in the present invention, to set the time period from a time point when the combination of the divided video signals and the buffer circuits changes to a time point when the combination changes again, such that a division stripe is unliable to be visually recognized by an observer is important. The time period from a time point when the combination of the divided video signals and the buffer circuits changes to a time point when the combination changes again is, in other words, a time period from a time point when the counter value changes to a time point when the counter value changes again. The time period also corresponds to the time period from a time point when the information of the first replacement signal and the second replacement signal changes to a time point when the information of the first replacement signal and the second replacement signal changes again.

The time period until the combination of the divided video signals and the buffer circuits is preferably as short as possible. The shorter the time period is, the more unliable a division stripe is to be visually recognized by an observer. The time period until the combination of the divided video signals and the buffer circuits is preferably ½₀ sec or shorter. In the present embodiment mode, the combination of the divided video signals and the buffer circuits is set to be changed every time when one frame period elapses.

It is to be noted that, in the present embodiment mode, the circuit group illustrated in FIG. 1 for generating the divided video signals is provided on an IC chip (a semiconductor circuit formed of MOSFETs formed on single crystalline silicon) as an externally attached circuit. The circuit group is connected through an FPC (a flexible print circuit) to the source signal line driving circuit provided on the active matrix substrate. However, the present invention is not limited to the above-described structure, and the source signal line driving circuit as well as the circuit group may be structured to be provided on the IC chip. Further, part of or the whole of the portion 107 of the circuit group may be provided on the active matrix substrate.

By the above structure according to the present invention, even if a stripe due to the brightness/darkness (a division stripe) is displayed on the screen caused by potential difference between a divided video signal outputted from a buffer circuit having different characteristics and other divided video signals, since the place where the division stripe is displayed moves every time with a predetermined time period elapses, the division stripe is unliable to be visually recognized by an observer.

Therefore, according to the present invention, when divided driving is performed, a division stripe is unliable to be visually recognized by an observer. Further, since divided driving is performed, even if the horizontal number of pixels of the active matrix semiconductor display device increases, flicker of the displayed image can be prevented while the driving frequency of the source signal line driving circuit is suppressed, and images having many tones can be displayed with a high precision and with a high resolution.

It is to be noted that the present invention is not limited to the structure illustrated in FIG. 1. All what is required is a structure where the combination of a plurality of divided video signals and a plurality of buffer circuits to which the plurality of divided video signals are inputted, respectively, is changed every time when a predetermined time period elapses, and the plurality of divided video signals outputted from the plurality of buffer circuits are sampled and are inputted to particular predetermined source signal lines, respectively.

Examples according to the present invention are now described in the following.

[Embodiment 1]

Figure 4:
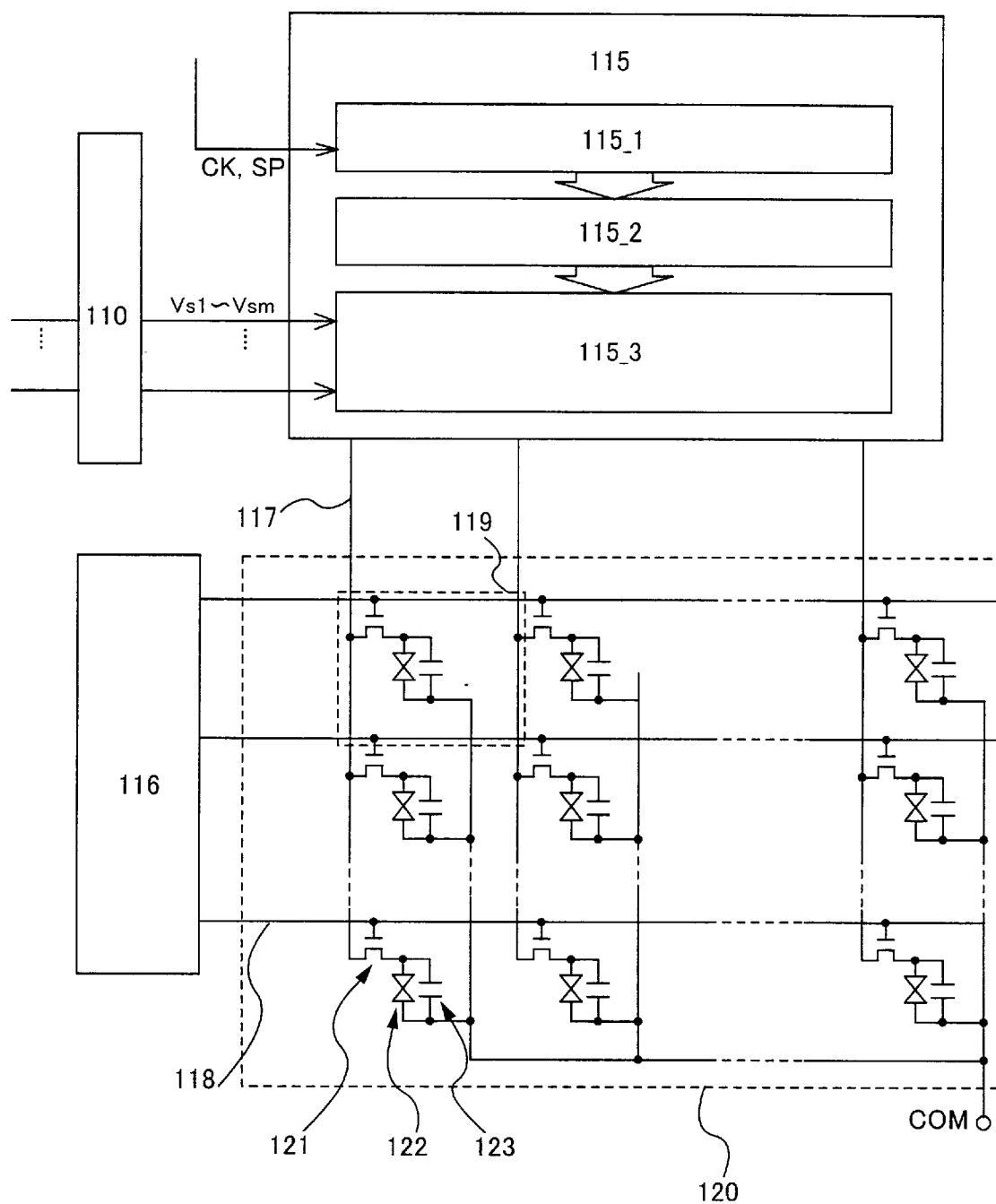
FIG. 4 is a schematic plan view of an active matrix liquid crystal semiconductor display device according to the present invention.

The structure of an active matrix semiconductor display device using liquid crystal (an active matrix liquid crystal display device) and having the circuit group for generating the divided video signals according to the present invention is described in the following. FIG. 4 is a block diagram of an exemplary active matrix liquid crystal display device having the circuit group for generating the divided video signals according to the present invention, although the present invention is not limited thereto.

It is to be noted that, though the present embodiment uses the circuit group for generating the divided video signals structured as illustrated in FIG. 1, the circuit group for generating the divided video signals used in the present embodiment is not limited to the structure illustrated in FIG. 1. All what is required is a structure where the combination of a plurality of buffer circuits and a plurality of divided video signals inputted to the plurality of buffer circuits, respectively, is changed every time when a predetermined time period elapses, and the plurality of divided video signals outputted from the plurality of buffer circuits are inputted to particular predetermined divided video signal lines, respectively.

Reference numerals 115, 116, and 120 denote a source signal line driving circuit, a gate signal line driving circuit, and a pixel portion, respectively. The second replacing circuit 110 is in the circuit group for generating the divided video signals. Though, in the present embodiment, one source signal line driving circuit and one gate signal line driving circuit are provided, the present invention is not limited thereto, and two source signal line driving circuits may be provided and two gate signal line driving circuits may be provided.

The source signal line driving circuit 115 has a shift register circuit 115_1, a level shift circuit 115_2, and a sampling circuit 115_3. It is to be noted that the level shift circuit is used when necessary, and is not essential. Further, though, in the present embodiment, the level shift circuit 115_2 is structured to be provided between the shift register circuit 115_1 and the sampling circuit 115_3, the present invention is not limited thereto, and may be structured such that the level shift circuit 115_2 is incorporated in the shift register circuit 115_1.

The clock signal (CLK) and the start pulse signal (SP) are inputted from the control circuit 101 illustrated in FIG. 1 to the shift register circuit 115_1. In the present embodiment, the circuit group for generating the divided video signals is provided on the IC chip, and is connected through the FPC to the source signal line driving circuit 115 on the active matrix substrate.

A sampling signal for sampling the divided video signals is outputted from the shift register circuit 115_1. The outputted sampling signal is inputted to the level shift circuit 115_2, and is outputted after the amplitude of the potential thereof is amplified.

The sampling signal outputted from the level shift circuit 115_2 is inputted to the sampling circuit 115_3. Simultaneously with this, the divided video signals (Vs1-Vsm) are inputted from the second replacing circuit 110 through the divided video signal lines to the sampling circuit 115_3. The second replacing circuit 110 is included in the circuit group for generating the divided video signals illustrated in FIG. 1.

In the sampling circuit 115_3, the inputted divided video signals (Vs1 to Vsm) are sampled using the sampling signal, and are inputted as m image signals through source signal lines 117 to predetermined pixels.

In the pixel portion 120, the source signal lines 117 connected to the source signal line driving circuit 115 and gate signal lines 118 connected to the gate signal line driving circuit 116 intersect each other. Each of the regions surrounded by the source signal lines 117 and the gate signal lines 118 is provided with a thin film transistor 121 for a pixel 119 (a pixel TFT 121), a liquid crystal cell 122 where liquid crystal is sandwiched between an opposing electrode and a pixel electrode, and a storage capacitor 123.

The pixel TFTs 121 are operated by a selection signal inputted from the gate signal line driving circuit 116 through the gate signal lines 118. The m image signals inputted to the corresponding m source signal lines of the source signal lines 117 are selected by the pixel TFTs 121, and are simultaneously written in the predetermined pixel electrodes.

Exemplary operation of the active matrix liquid crystal display device where the source signal lines are dividedly driven into m divisions is described in the following with reference to FIG. 5.

Figure 5:
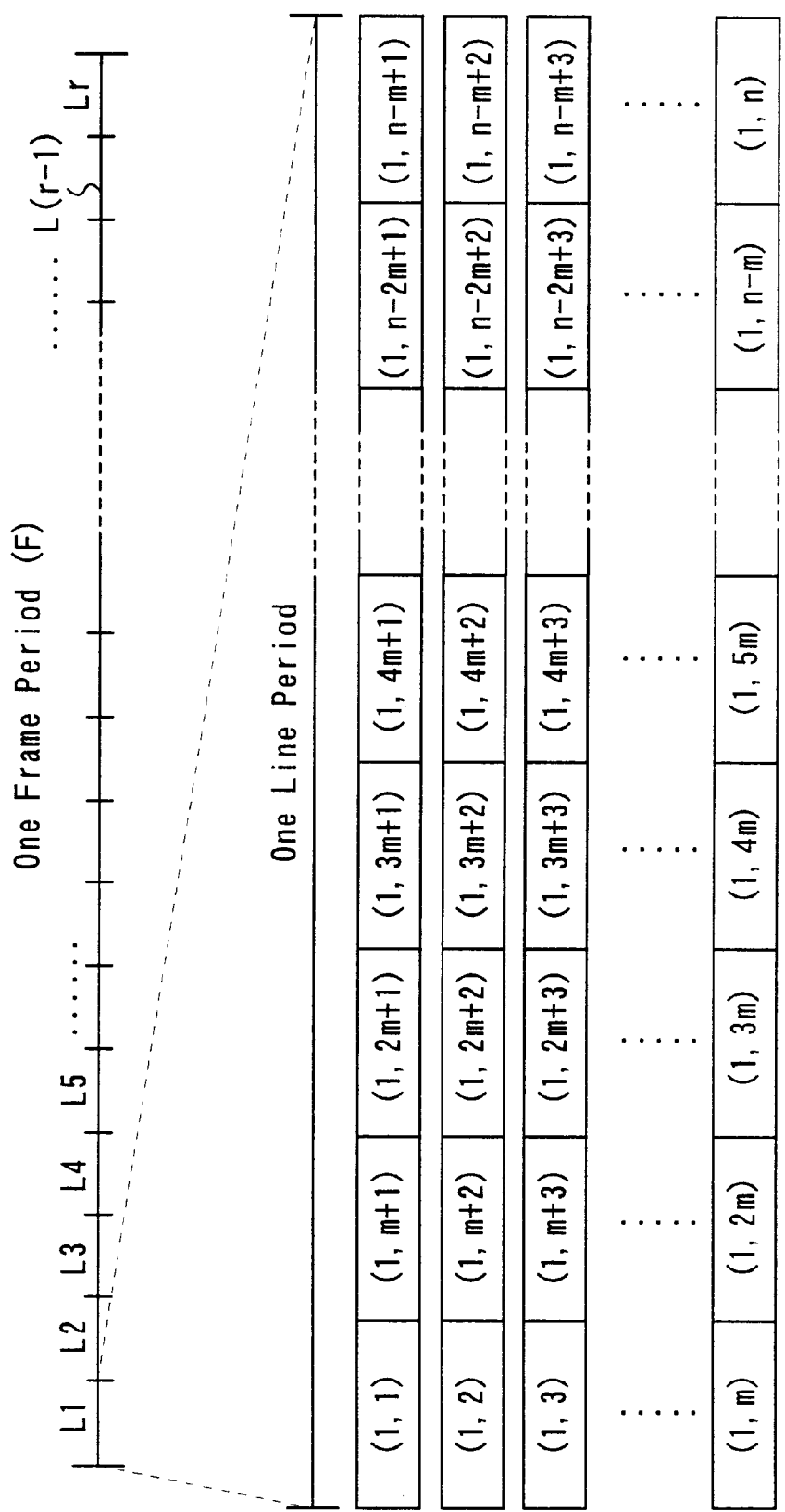
FIG. 5 illustrates a method of driving the analog active matrix liquid crystal semiconductor display device according to the present invention.

As illustrated in FIG. 5, one frame period is formed of a plurality of line periods. It is to be noted that, as used herein, the term "one frame period (F)" means a time period from a time point when data for displaying one frame starts to be inputted in the pixel portion to a time point when data for displaying the next frame starts to be inputted. Further, as used herein, the term "one line period (L)" means a time period from a time point when the selection signal starts to be inputted to a certain gate signal line to a time point when the selection signal starts to be inputted to the next gate signal line.

In the present embodiment, there are first to nth source signal lines, and there are first to rth gate signal lines. Therefore, there are line periods L1–Lr in one frame period. It is to be noted that both n and r are arbitrary positive integers.

In the line period Li, the selection signal is inputted from the gate signal line driving circuit 116 to the first gate signal line. As a result, the pixel TFTs of the pixels connected to the first gate signal line are all turned ON. More specifically, the pixel TFTs of all the pixels (1,1), (1,2), . . . , (1,m), . . . , (1,n) connected to the first gate signal line are turned ON.

Then, from the source signal line driving circuit 115, the m image signals are simultaneously inputted to the m source signal lines, i.e., from the first to the mth source signal lines, respectively. More specifically, the m image signals are simultaneously inputted to the pixels (1,1), (1,2), . . . , (1,m) which are connected to the first gate signal line and connected to any one of the m source signal lines, i.e., from the first to the mth source signal lines, respectively. As a result, the liquid crystal is driven by the potential of the inputted m image signals, the quantity of transmitted light is controlled, and part of an image (image corresponding to the pixels (1,1), (1,2), . . . , (1,m)) is displayed in the pixels (1,1), (1,2), . . . , (1,m).

Then, with the state where image is displayed in the pixels (1,1), (1,2), . . . , (1,m) being retained by storage capacitors or the like, the m image signals are simultaneously inputted from the source signal line driving circuit 115 to m source signal lines, i.e., from the (m+1)th to the 2mth source signal lines, respectively. More specifically, the m image signals are simultaneously inputted to the pixels (1,m+1), (1,m+2), . . . , (1,2m) which are connected to the first gate signal line and connected to any one of the m source signal lines, i.e., from the (m+1)th to the 2mth source signal lines, respectively. As a result, the liquid crystal is driven by the potential of the inputted m image signals, the quantity of transmitted light is controlled, and part of the image (image corresponding to the pixels (1,m+1), (1,m+2), . . . , (1,2m)) is displayed in the pixels (1,m+1), (1,m+2), . . . , (1,2m).

Such display operation is sequentially performed, and part of the image is sequentially displayed in all the pixels (1,1), (1,2), . . . , (1,m), . . . , (1,n) connected to the first gate signal line. During the first line period L1, the selection signal continues to be inputted to the first gate signal line. Once part of the image is displayed in a pixel, the pixel continues to retain the displayed state using the storage capacitor or the like until another image signal is inputted to the pixel.

When signals having image information are inputted to all the pixels connected to the first gate signal line, the first line period L1 ends, and the selection signal is no longer inputted to the first gate signal line. The second line period L2 follows after the first line period L1, and the selection signal is inputted to only the second gate signal line. Then, similarly to the case of the line period L1, image signals are inputted to all the pixels connected to the second gate signal line. As a result, part of the image is sequentially displayed in all the pixels connected to the second gate signal line. During this period, the selection signal continues to be inputted to the second gate signal line.

When the second line period L2 ends, the third line period L3 follows, and the same operation is repeated sequentially until the rth line period Lr. When the rth line period Lr ends, one image (frame) is displayed in the pixel portion 120. Though not illustrated in FIG. 5, a retrace line period may be provided between the rth line period Lr and the first line period L1 of the next frame period. When such a retrace line period is provided, one frame period consists of the line periods L1 to Lr and the retrace line period.

By repeating such display operations sequentially, images are displayed in the pixel portion 120.

It is to be noted that, in the present embodiment, the image signals were inputted to the first to the mth source signal lines during L1, to the (m+1)th to the 2mth source signal lines during L2, to the (2m+1)th to the 3mth source signal lines during L3, and so on, and the image signals were inputted in due order with regard to every m source signal lines. However, the present invention is not limited to this structure. In the respective line periods, the m source signal lines to which the image signals are inputted may be selected in any order.

In the present invention, as described in the above, divided driving is performed. Further, in the present invention, since there is the circuit group for generating the divided video signals illustrated in FIG. 1, even if a stripe due to the brightness/darkness (a division stripe) is displayed on the screen caused by potential difference between a divided video signal outputted from a buffer circuit having different characteristics and other divided video signals, the place where the division stripe is displayed moves every time a predetermined time period elapses. Therefore, even if a division stripe is displayed on the screen, the division stripe is unliable to be visually recognized by an observer.

Therefore, according to the present invention, when divided driving described in the above is performed, a division stripe is unliable to be visually recognized by an observer. Further, since divided driving is performed, images having many tones can be displayed with a high precision and with a high resolution.

[Embodiment 2]

In the present embodiment, the detailed circuit structure of the source signal line driving circuit illustrated in Embodiment 1 is described. It is to be noted that the source signal line driving circuit illustrated in Embodiment 1 is not limited to the structure described in the present embodiment. In the present embodiment, divided driving into four divisions is described.

Figure 6:
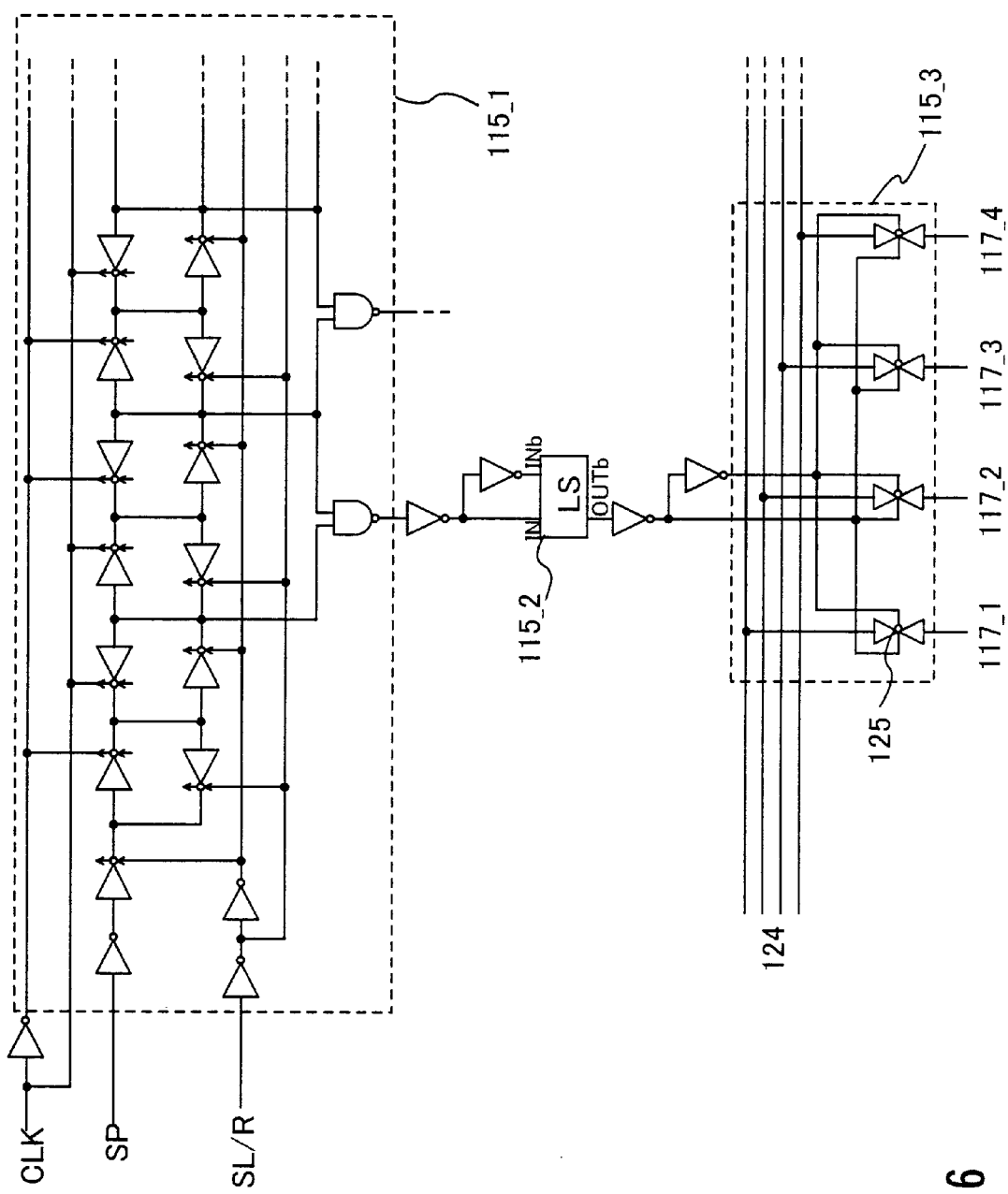
FIG. 6 is a circuit diagram of a source signal line driving circuit.

FIG. 6 is a circuit diagram of the source signal line driving circuit of the present embodiment. The reference numerals 115_1, 115_2, and 115_3 denote the shift register circuit, the level shift circuit, and the sampling circuit, respectively.

The clock signal CLK, the start pulse signal SP, and a driving direction switch signal SL/R are inputted to the shift register circuit 115_1 from the wirings illustrated in FIG. 6, respectively. The divided video signals are inputted through divided video signal lines 124 to the sampling circuit 115_3. Since the divided driving is performed into four divisions, the number of the divided video signal lines 124 is four.

The divided video signals inputted to the respective divided video signal lines 124 are sampled by the sampling circuit 115_3 using a sampling signal inputted from the level shift circuit 115_2. More specifically, the divided video signals are sampled by an analog switch 125 of the sampling circuit 115_3, and are simultaneously inputted as four image signals to corresponding source signal lines 117_1 to 117_4, respectively.

By repeating the above operation, image signals are inputted to all the source signal lines.

Figure 7A:
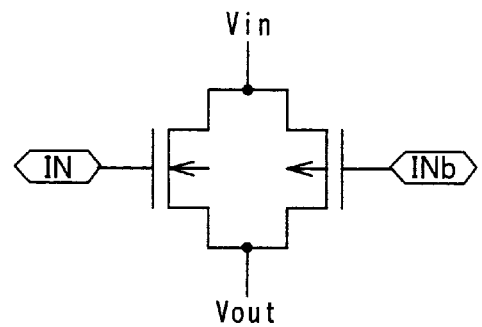
FIGS. 7A and 7B are equivalent circuit diagrams of an analog switch and of a level shift circuit.

FIG. 7A is an equivalent circuit diagram of the analog switch 125. The analog switch 125 has an n channel type TFT and a p channel type TFT. A divided video signal is inputted as Vin from a wiring illustrated in FIG. 7A. A sampling signal and a signal having the opposite polarity to that of the sampling signal which are outputted from the level shift circuit 115_2 are inputted from IN or INb, respectively. The divided video signal is sampled using the sampling signal, and an image signal is outputted as Vout from the analog switch 125.

Figure 7B:
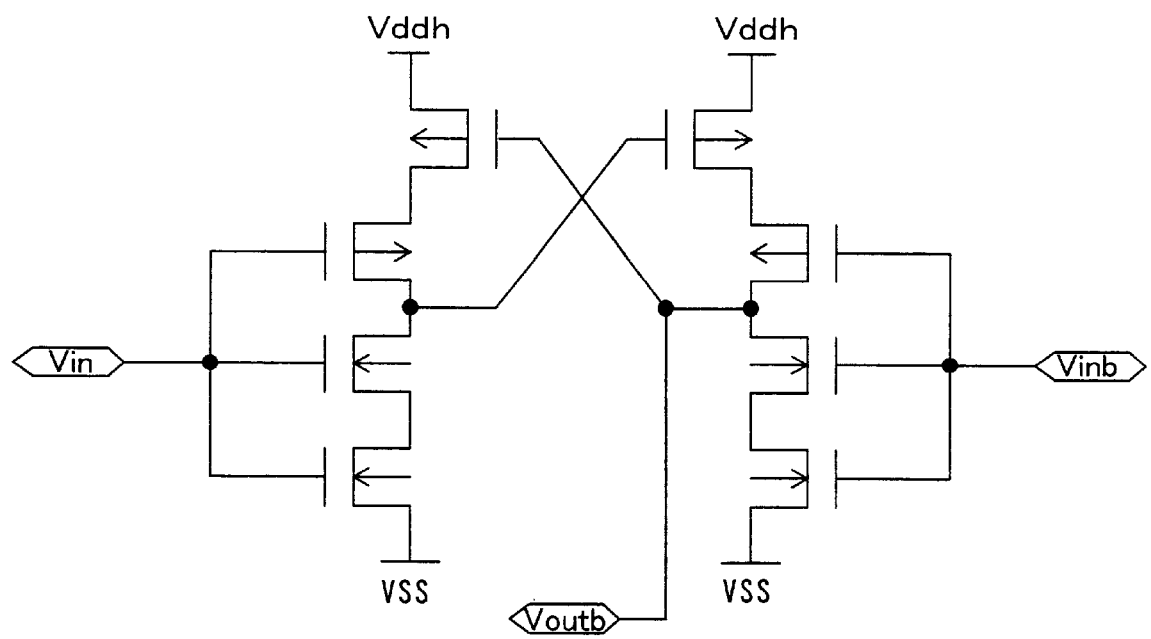

FIG. 7B is an equivalent circuit diagram of the level shift circuit 115_2. The sampling signal and the signal having the opposite polarity to that of the sampling signal which are outputted from the shift register circuit 115_1 are inputted from Vin or Vinb, respectively. Vddh and Vss denote application of positive voltage and that of negative voltage, respectively. The level shift circuit 115_2 is designed to output from Voutb a signal which is generated by making higher the voltage of the signal inputted to Vin and by inverting that signal. More specifically, when Hi is inputted to Vin, a signal corresponding to Vss is outputted from Voutb, while, when Lo is inputted to Vin, a signal corresponding to Vddh is outputted from Vout.

It is to be noted that the structure of the present embodiment can be implemented in free combination with Embodiment 1.

[Embodiment 3]

In the present embodiment, an analog-driven active matrix semiconductor display device according to the present invention which has a different form from that of the embodiment mode, Embodiment 1, and Embodiment 1 is described.

Figure 8:
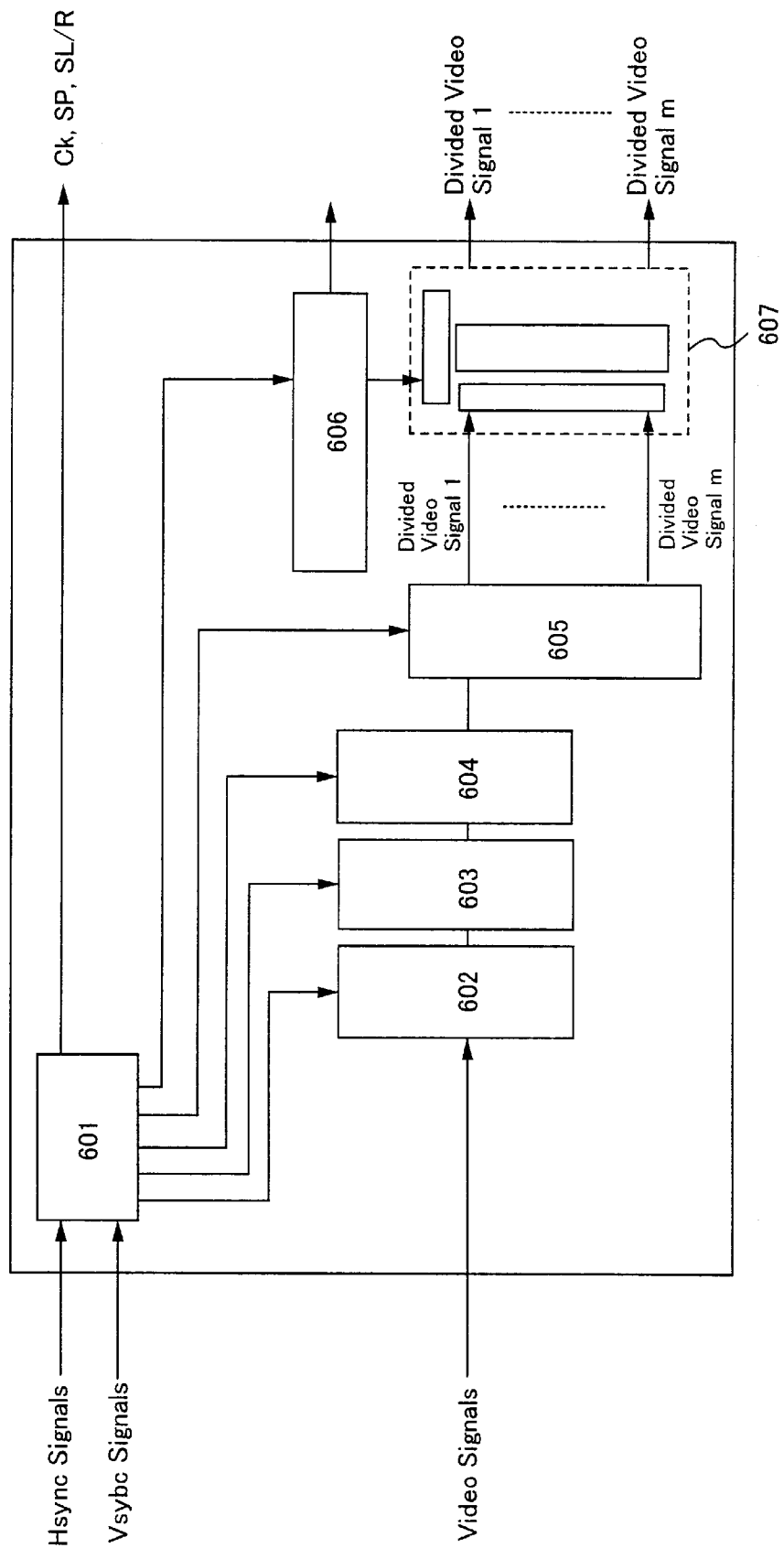
FIG. 8 is a block diagram of a circuit group for generating divided video signals according to the present invention.

A circuit group for generating divided video signals according to the present embodiment is described with reference to FIG. 8. It is to be noted that, here, a case where an analog-driven active matrix semiconductor display device is dividedly driven into m divisions is described.

Reference numerals 601, 602, 603, 604, 605, and 606 denote a control circuit, an A/D conversion circuit, a γ correction circuit, a D/A conversion circuit, a dividing circuit, and a replacement data circuit, respectively.

An Hsync signal and a Vsync signal are inputted to the control circuit 601. A clock signal (CK), a start pulse signal (SP), and the like for driving the source signal line driving circuit are inputted from the control circuit 601 to the source signal line driving circuit. Further, signals for driving the A/D conversion circuit 602, the γ correction circuit 603, the D/A conversion circuit 604, the dividing circuit 605, and the replacement data circuit 606 are inputted from the control circuit 601 to the respective circuits.

An analog video signal having image information is inputted to the A/D conversion circuit 602. The analog video signal inputted to the A/D conversion circuit 602 is converted to a digital video signal to be inputted to the γ correction circuit 603. The digital video signal inputted to the γ correction circuit 603 is, after γ correction, inputted to the D/A conversion circuit 604. The digital video signal inputted to the D/A conversion circuit 604 after the γ correction is again converted to an analog video signal to be inputted to the dividing circuit 605.

The analog video signal inputted to the dividing circuit 605 is subject to serial-parallel conversion, and is converted to divided video signals the number of which is the same as the number of divisions of the divided driving. In case of driving divided into m, the analog video signal is converted to m divided video signals.

Figure 9:
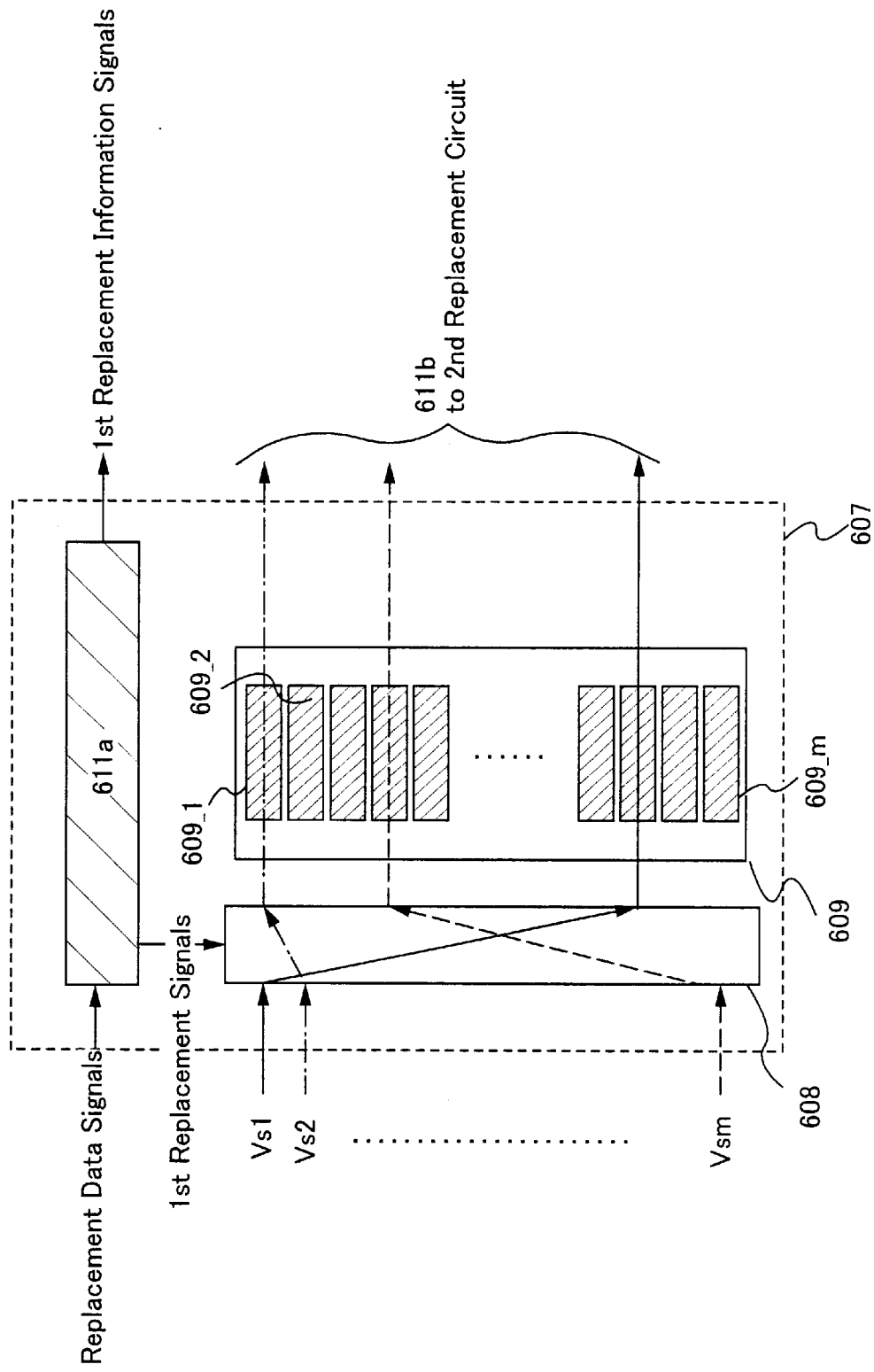
FIG. 9 is a block diagram of part of the circuit group for generating divided video signals.

The m divided video signals are simultaneously inputted to a first replacing circuit 608. FIG. 9 is a detailed block diagram of a portion 607 surrounded by a dashed line. Reference numerals 608, 609, and 611a denote a first replacing circuit, a buffer circuit group, and a first replacement data processing circuit, respectively. The buffer circuit group 609 has at least m buffer circuits (609_1 to 609_m).

The first replacing circuit 608 inputs the inputted divided video signals (Vs1 to Vsm) to the buffer circuits (609_1 to 609_m), respectively, using a first replacement signal inputted from the first replacement data processing circuit 611a. Here, the m divided video signals (Vs1 to Vsm) to be inputted biuniquely correspond to the m buffer circuits (609_1 to 609_m), respectively. Further, which divided video signal of the m divided video signals is inputted to which buffer circuit of the m buffer circuit is determined by the first replacement signal inputted from the first replacement data processing circuit 611a.

The m divided video signals (Vs1 to Vsm) inputted to the buffer circuits (609_1 to 609_m) are buffered and amplified by the respective buffer circuits, and are inputted to a second replacing circuit 615_3. Further, simultaneously, a first replacement information signal is inputted from the first replacement data processing circuit 611a to the second replacing circuit 615_3. The first replacement information signal is a signal which includes information with regard to how the combination of the divided video signals (Vs1 to Vsm) and the buffer circuits (609_1 to 609_m) has been changed by the first replacing circuit 608 using the first replacement signal. It is to be noted that, in the present embodiment, the second replacing circuit 615_3 is incorporated in the source signal line driving circuit.

Next, operation of the second replacing circuit 615_3 and a second replacement data processing circuit 611b is described with reference to FIG. 11. It is to be noted that the structure illustrated in FIG. 11 is merely an example of an active matrix liquid crystal display device having a circuit group for generating divided video signals according to the present invention, and the present invention is not limited thereto.

Figure 11:
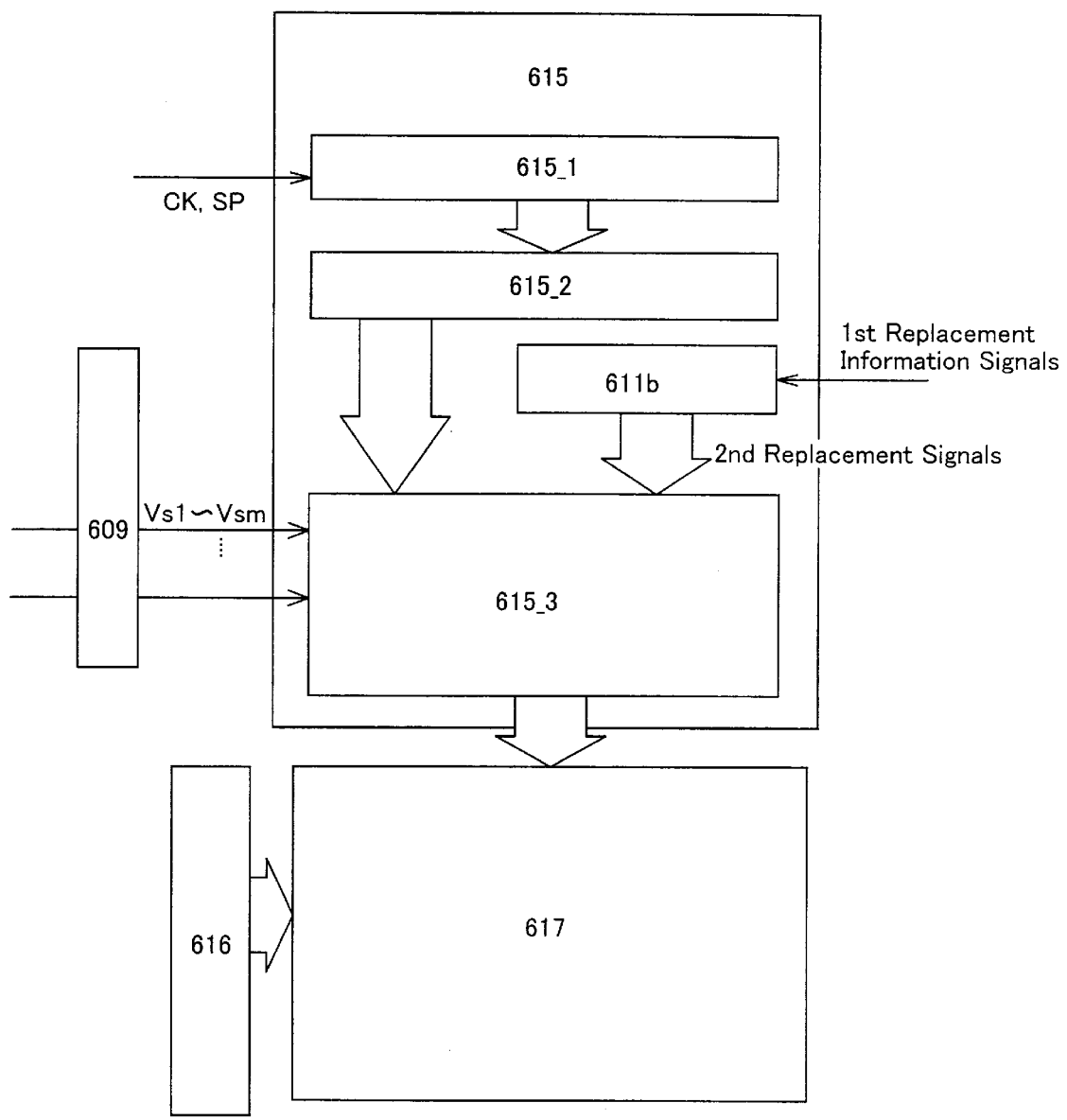
FIG. 11 is a schematic plan view of an active matrix liquid crystal semiconductor display device according to the present invention.

In the active matrix liquid crystal display device illustrated in FIG. 11, the second signal replacing circuit 615_3 and the second replacement data processing circuit 611b as part of the circuit group for generating the divided video signals are provided in a source signal line driving circuit 615 on an active matrix substrate. It is to be noted that the second replacement data processing circuit 611b may be structured not to be provided in the source signal line driving circuit 615.

A clock signal (CLK), a start pulse signal (SP), and the like are inputted from the control circuit 601 to a shift register circuit 615_1 in the source signal line driving circuit 615.

A sampling signal for sampling the divided video signals is outputted from the shift register circuit 615_1. The outputted sampling signal is inputted to a level shift circuit 615_2 which is also in the source signal line driving circuit 615, and is outputted after the amplitude thereof is amplified.

It is to be noted that the level shift circuit is used when necessary, and is not essential. Further, though, in the present embodiment, the level shift circuit 615_2 is structured to be provided between the shift register circuit 615_1 and the second replacing circuit 615_3, the present invention is not limited thereto, and may be structured such that the level shift circuit 615_2 is incorporated in the shift register circuit 615_1.

The sampling signal outputted from the level shift circuit 615_2 is inputted to the second replacing circuit 615_3 in the source signal line driving circuit 615.

On the other hand, the first replacement information signal outputted from the first replacement data processing circuit 611a is inputted to the second replacement data processing circuit 611b. A second replacement signal outputted from the second replacement data processing circuit 611b is inputted to the second replacing circuit 615_3 using the first replacement information signal.

At the same time, the divided video signals (Vs1-Vsm) outputted from the buffer circuit group 609 are inputted through divided video signal lines to the second replacing circuit 615_3.

Using the second replacement signal, the second replacing circuit 615_3 selects each one of divided video signal lines l1 to Vlm) to which divided video signals (Vs1 to Vsm) to be inputted to the respective m source signal lines are inputted. Then, using the sampling signal, the m divided video signals (Vs1 to Vsm) are sampled, and are inputted as m image signals to predetermined m source signal lines, respectively. More specifically, independently of which of the m divided video signals (Vs1 to Vsm) is inputted to which of the buffer circuits (609_1 to 609_m) using the first replacement signal, the m image signals generated by sampling the m divided video signals (Vs1 to Vsm) outputted from the m buffer circuits (609_1 to 609_m) are inputted to the predetermined m source signal lines, respectively.

The m image signals inputted to the source signal lines are inputted to predetermined pixels.

In the pixel portion 617, source signal lines connected to the second replacing circuit 611b and gate signal lines connected to a gate signal line driving circuit 616 intersect each other. Each of the regions surrounded by the source signal lines and the gate signal lines is provided with a thin film transistor for a pixel (a pixel TFT), a liquid crystal cell where liquid crystal is sandwiched between an opposing electrode and a pixel electrode, and a storage capacitor.

The pixel TFTs are operated by a selection signal inputted from the gate signal line driving circuit through the gate signal lines. The m image signals respectively he corresponding m source signal lines of the source signal lines are selected by the pixel TFTs, and are simultaneously written in the predetermined pixel electrodes.

Next, the replacement data circuit 606 is described. By inputting a replacement data signal generated by the replacement data circuit 606 to the first replacement data processing circuit 611a, the first replacement signal and the first replacement information signal are generated.

Figure 10:
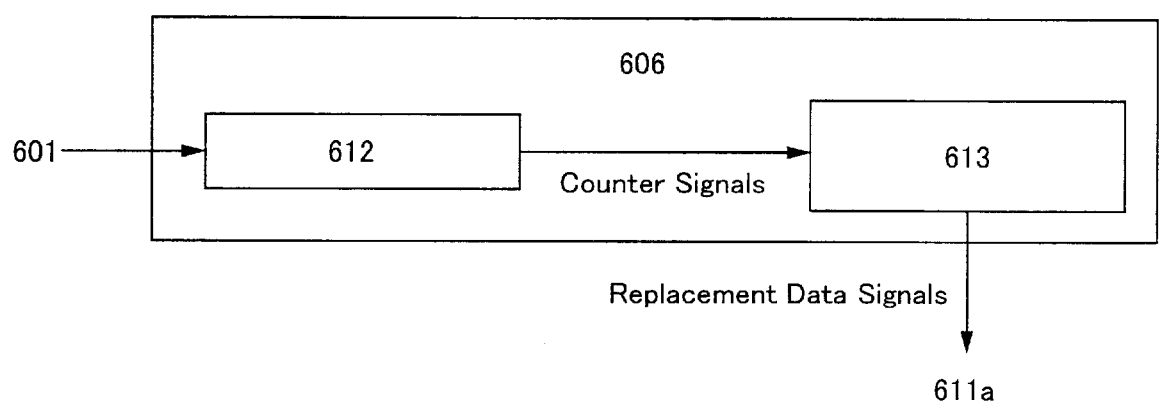
FIG. 10 is a block diagram of a replacement data circuit.

FIG. 10 is a block diagram of the replacement data circuit 606. Reference numerals 612 and 613 denote a counter circuit and a memory circuit, respectively. The memory circuit 613 stores q kinds of data with regard to which of the divided video signals is inputted to which of the buffer circuits, in other words, data with regard to the combination of the divided video signals (Vs1-Vsm) and the buffer circuits (609_1 to 609_m) (replacement data).

The q kinds of combination of the divided video signals and the buffer circuits are stored as replacement data at Address 0 to Address (q−1), respectively, in a memory address of the memory circuit 613.

The counter circuit 612 is driven by a signal inputted from the control circuit 601, and determines a counter value for designating the address in the memory address of the memory circuit 613. For example, when the counter value is 0, 1, 2, or (q−1), the memory address of the memory circuit 613 is designated to be Address 0, Address 1, Address 2, or Address (q−1), respectively. The information with regard to the counter value is inputted as a counter signal from the counter circuit 612 to the memory circuit 613.

The address in the memory address is designated by the counter signal inputted to the memory circuit 613. Replacement data which is information with regard to the combination of the divided video signals and the buffer circuits stored in the designated address is inputted as the replacement data signal to the first replacement data processing circuit 611*a*.

It is to be noted that the counter value changes every time a predetermined time period elapses. Every time the counter value changes, information with regard to the counter value is transmitted as a counter signal to the memory circuit 613. The time period until the counter value changes corresponds to the time period until the combination of the divided video signals and the buffer circuits changes.

When the counter value completes the cycle from 0 to (q−1), the counter value again goes through the cycle from 0 to (q−1). More specifically, when the address in the memory address of the memory circuit 613 completes the cycle from Address 0 to Address (q−1), designation from Address 0 to Address (q−1) starts again. The order of the counter values is not specifically limited. The counter value may be 0, . . . (q−1) in this order, or may be randomly changed.

The number q of the kinds of replacement data as the data with regard to the combination of the divided video signals (Vs1 to Vsm) and the buffer circuits (609_1 to 609_m) is preferably as large as possible. However, the number q is sufficiently large if a division stripe can become more unliable to be visually recognized by an observer compared with the conventional case illustrated in FIG. 17 where the combination of the divided video signals and the buffer circuits is not changed.

Further, the combination of the divided video signals and the buffer circuits to be stored in the memory circuit 613 may be anything with which a division stripe can become more unliable to be visually recognized by an observer compared with the conventional case illustrated in FIG. 17 where the combination of the divided video signals and the buffer circuits is not changed. The combination of the divided video signals and the buffer circuits may be set using random numbers or other functions.

The combination of the divided video signals and the buffer circuits may be at random, but does not necessarily have to be at random. That the combination of the divided video signals and the buffer circuits may have certain regularity is as described in the description of the embodiment mode. What is important in the present invention is to make a division stripe unliable to be visually recognized by an observer by changing the combination of the divided video signals and the buffer circuits every time a predetermined time period elapses.

Though, in the present invention, one source signal line driving circuit and one gate signal line driving circuit are provided, the present invention is not limited thereto, and two source signal line driving circuits may be provided, and two gate signal line driving circuits may be provided.

It is to be noted that, in the present invention, to set the time period from a time point when the combination of the divided video signals and the buffer circuits changes to a time point when the combination changes again such that a division stripe is unliable to be visually recognized by an observer is important. The time period from a time point when the combination of the divided video signals and the buffer circuits changes to a time point when the combination changes again is, in other words, a time period from a time point when the counter value changes to a time point when the counter value changes again. The time period also corresponds to the time period from a time point when the information of the first replacement signal and the second replacement signal changes to a time point when the information of the first replacement signal and the second replacement signal changes again.

The time period until the combination of the divided video signals and the buffer circuits change is preferably as short as possible. The shorter the time period is, the more unliable a division stripe is to be visually recognized by an observer. The time period until the combination of the divided video signals and the buffer circuits is preferably 1/20 sec or shorter. In the present embodiment, the combination of the divided video signals and the buffer circuits is set to be changed every time one frame period elapses.

In the present embodiment, the second replacing circuit, which is, in Embodiment 1, a part of the circuit group for generating divided video signals, is formed in the source signal line driving circuit, and at the same time, also functions as a sampling circuit. However, the present invention is not limited to this structure. The second replacing circuit may not function as the sampling circuit and a sampling circuit may be separately provided in the source signal line driving circuit. Further, the second replacing circuit may be formed on the active matrix substrate separately from the source signal line driving circuit. In this case, the second replacing circuit may be structured to be provided between the circuit group for generating the divided video signals provided on an IC chip as an externally attached circuit and the source signal line driving circuit provided on the active matrix substrate, with the circuit group for generating the divided video signals provided on the IC chip and the second replacing circuit being connected through an FPC.

Further, though, in the present embodiment, the second replacement data processing circuit is provided in the source signal line driving circuit, it goes without saying that the second replacement data processing circuit may be formed on the active matrix substrate separately from the source signal line driving circuit. Further, the structure may be that the first replacement data processing circuit and the second replacement data processing circuit are collected together as one and provided on an IC chip, with the second replacement signal being inputted to the second replacing circuit on the active matrix substrate through an FPC.

Still further, in the present embodiment, the structure is such that the replacement data signal is inputted only to the first replacement data processing circuit and the first replacement information signal is inputted from the first replacement data processing circuit to the second replacement data processing circuit. However, the present invention is not limited to this structure, and the structure may be such that the replacement data signal is inputted to both the first replacement data processing circuit and to the second replacement data processing circuit, and the second replacement signal is generated by the second replacement data processing circuit, not from the first replacement information signal, but from the replacement data signal.

By the above structure according to the present invention, even if a stripe due to the brightness/darkness (a division stripe) is displayed on the screen caused by potential difference between a divided video signal outputted from a buffer circuit having different characteristics and other divided video signals, since the place where the division stripe is displayed moves every time a predetermined time period elapses, the division stripe is unliable to be visually recognized by an observer.

Therefore, according to the present invention, when divided driving is performed, a division stripe is unliable to be visually recognized by an observer. Further, by performing divided driving, even if the horizontal number of pixels of the active matrix semiconductor display device increases, flicker of the displayed image can be prevented, while the driving frequency of the source signal line driving circuit is suppressed, and images having many tones can be displayed with a high precision and with a high resolution.

It is to be noted that the present invention is not limited to the structure illustrated in FIGS. 8–11. All which is required is a structure where the combination of a plurality of buffer circuits and a plurality of divided video signals to be inputted to the plurality of buffer circuits, respectively, is changed every time a predetermined time period elapses, and the plurality of divided video signals are sampled and are inputted to particular predetermined source signal lines, respectively.

[Embodiment 4]

In the present embodiment, the detailed circuit structure of the source signal line driving circuit illustrated in Embodiment 3 is described. It is to be noted that the source signal line driving circuit illustrated in Embodiment 3 is not limited to the structure described in the present embodiment. In the present embodiment, for the sake of simplicity of the description, divided driving into four divisions is described.

Figure 12:
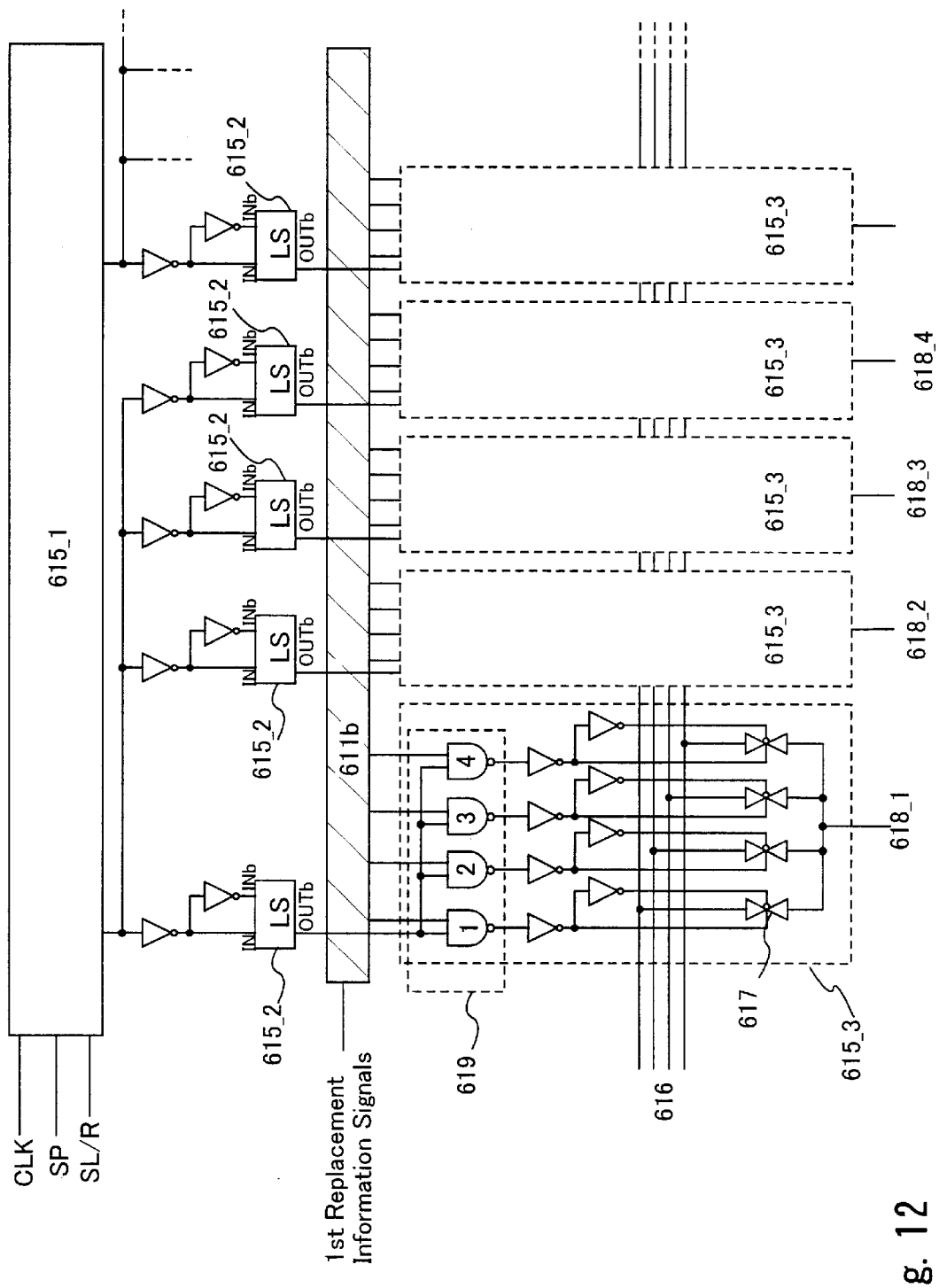
FIG. 12 is a circuit diagram of a source signal line driving circuit.

FIG. 12 is a circuit diagram of the source signal line driving circuit of the present embodiment. The reference numerals 615_1, 615_2, 615_3, and 611b denote the shift register circuit, the level shift circuit, the second replacing circuit, and the second replacement data processing circuit, respectively.

The clock signal CLK, the start pulse signal SP, and a driving direction switch signal SL/R are inputted to the shift register circuit 615_1 from the wirings illustrated in the figure, respectively.

The divided video signals are inputted through divided video signal lines 616 to the second replacing circuit 615_3. Since the divided driving is performed into four divisions, the number of the divided video signal lines 616 is four.

Further, the first replacement information signal is inputted to the second replacement data processing circuit 611b, and the second replacement signal is outputted. The outputted second replacement signal is inputted to a NAND circuit 619 of the second replacing circuit 615_3. At the same time, the sampling signal outputted from the level shift circuit 615_2 is inputted to the NAND circuit 619.

One of the divided video signal lines is selected using the second replacement signal and the sampling signal inputted to the NAND circuit 619, and the divided video signal inputted to the divided video signal line is sampled. The sampled divided video signal is inputted as an image signal to the source signal line. More specifically, the divided video signals are sampled by an analog switch 617 of the second replacing circuit 615_3, and are simultaneously inputted as image signals to corresponding source signal lines 618_1 to 618_4, respectively.

By repeating the above operation, image signals are inputted to all the source signal lines.

It is to be noted that the analog switch 617 and the level shift circuit 615_2 used in the present embodiment have the structure illustrated in FIG. 7. However, it goes without saying that the present embodiment is not limited to this structure.

[Embodiment 5]

In the present embodiment, an example case is described where the structure according to the present invention is used in a digital-driven active matrix liquid crystal display device. It is to be noted that, here, a case where divided driving into m divisions is performed is described.

Figure 13:
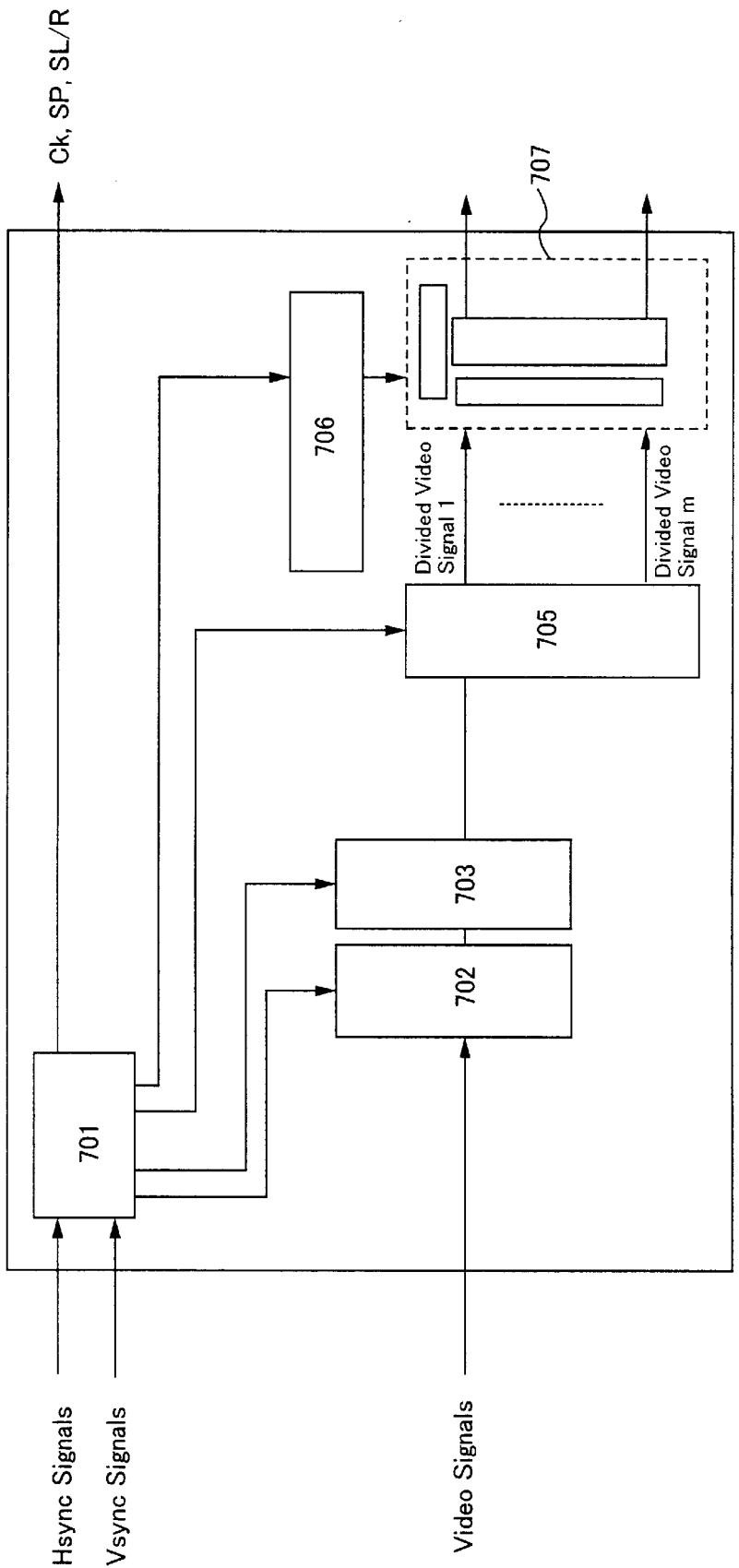
FIG. 13 is a block diagram of a circuit group for generating divided video signals according to the present invention.

FIG. 13 is a block diagram of a circuit group for generating divided video signals according to the present embodiment. Reference numerals 701, 702, 703, 705, and 706 denote a control circuit, an A/D conversion circuit, a γ correction circuit, a dividing circuit, and a replacement data circuit, respectively.

An Hsync signal and a Vsync signal are inputted to the control circuit 701. A clock signal (CK), a start pulse signal (SP), and the like for driving the source signal line driving circuit are inputted from the control circuit 701 to the source signal line driving circuit. Further, signals for driving the A/D conversion circuit 702, the γ correction circuit 703, the dividing circuit 705, and the replacement data circuit 706 are inputted from the control circuit 701 to the respective circuits.

An analog video signal having image information is inputted to the A/D conversion circuit 702. The inputted analog video signal is converted to a digital video signal and is inputted to the γ correction circuit 703. The digital video signal inputted to the γ correction circuit 703 is, after γ correction, inputted to the dividing circuit 705.

The inputted digital video signal is subject to serial-parallel conversion by the dividing circuit 705, and is converted to divided video signals the number of which is the same as the number of divisions of the divided driving. In a case of driving divided into m, the digital video signal is converted to m divided video signals. In a case of digital driving of s bits (s is a positive integer), each of the m divided video signals consists of s digital divided video signals $D_0$ to $D_3$.

Figure 14:
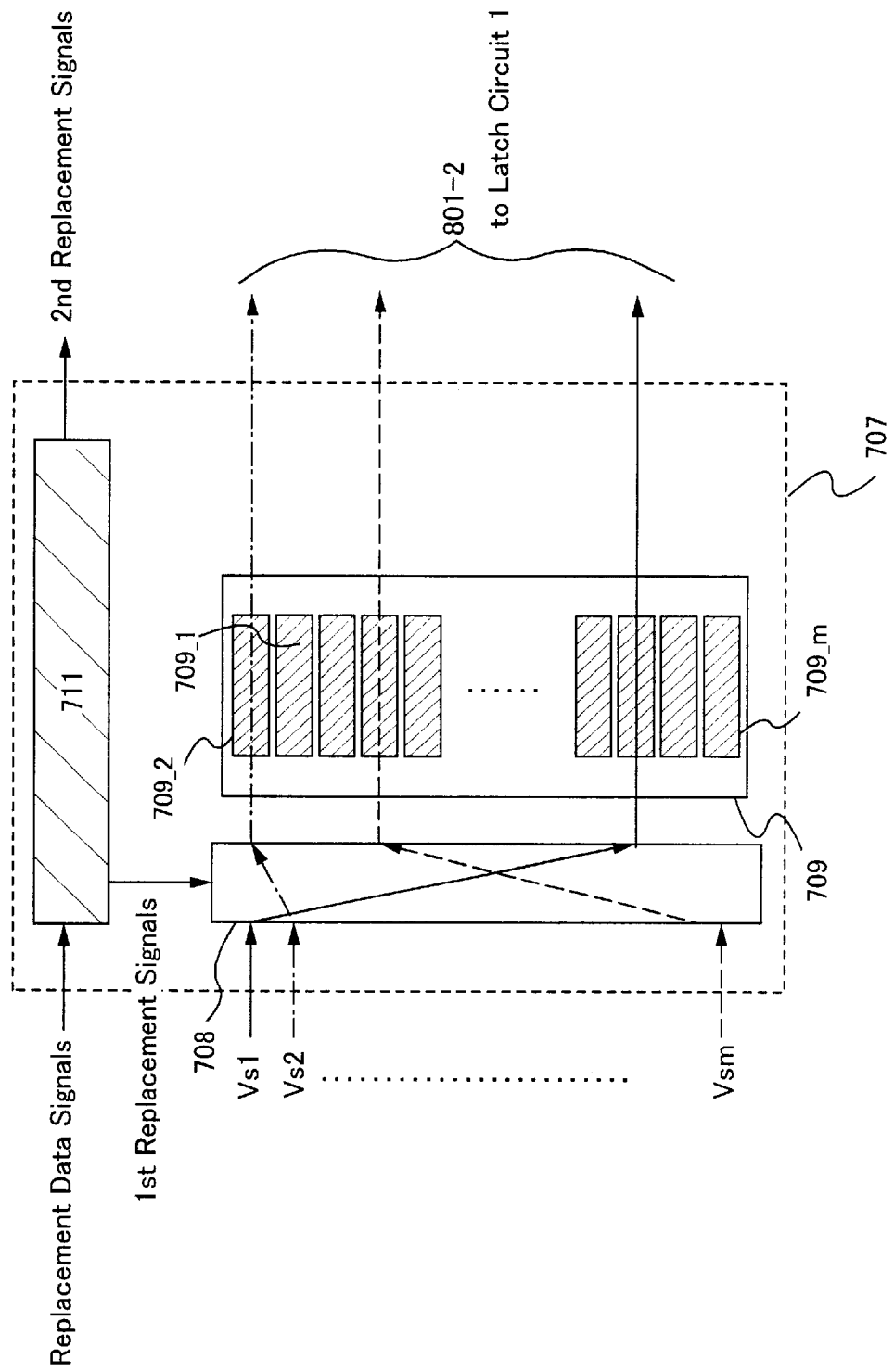
FIG. 14 is a block diagram of part of the circuit group for generating divided video signals.

The m divided video signals are inputted to a first replacing circuit 708. FIG. 14 is a detailed block diagram of a portion 707 surrounded by a dashed line. Reference numerals 708, 709, and 711 denote the first replacing circuit, a buffer circuit group, and a replacement data processing circuit, respectively. The buffer circuit group 709 has at least m buffer circuits (709_1 to 709_m).

The first replacing circuit 708 inputs the inputted divided video signals (Vs1 to Vsm) to the buffer circuits (709_1 to 709_m), respectively, using a first replacement signal inputted from the replacement data processing circuit 711. Here, the m divided video signals (Vs1 to Vsm) to be inputted uniquely correspond to the m buffer circuits (709_1 to 709_m), respectively. Further, which divided video signal of the m divided video signals is inputted to which buffer circuit of the m buffer circuit is determined by the first replacement signal inputted from the replacement data processing circuit 711.

The m divided video signals (Vs1 to Vsm) inputted to the buffer circuits (709_1 to 709_m) are buffered and amplified by the respective buffer circuits, and are inputted to a latch circuit 1 801-2 of the source signal line driving circuit.

Figure 15:
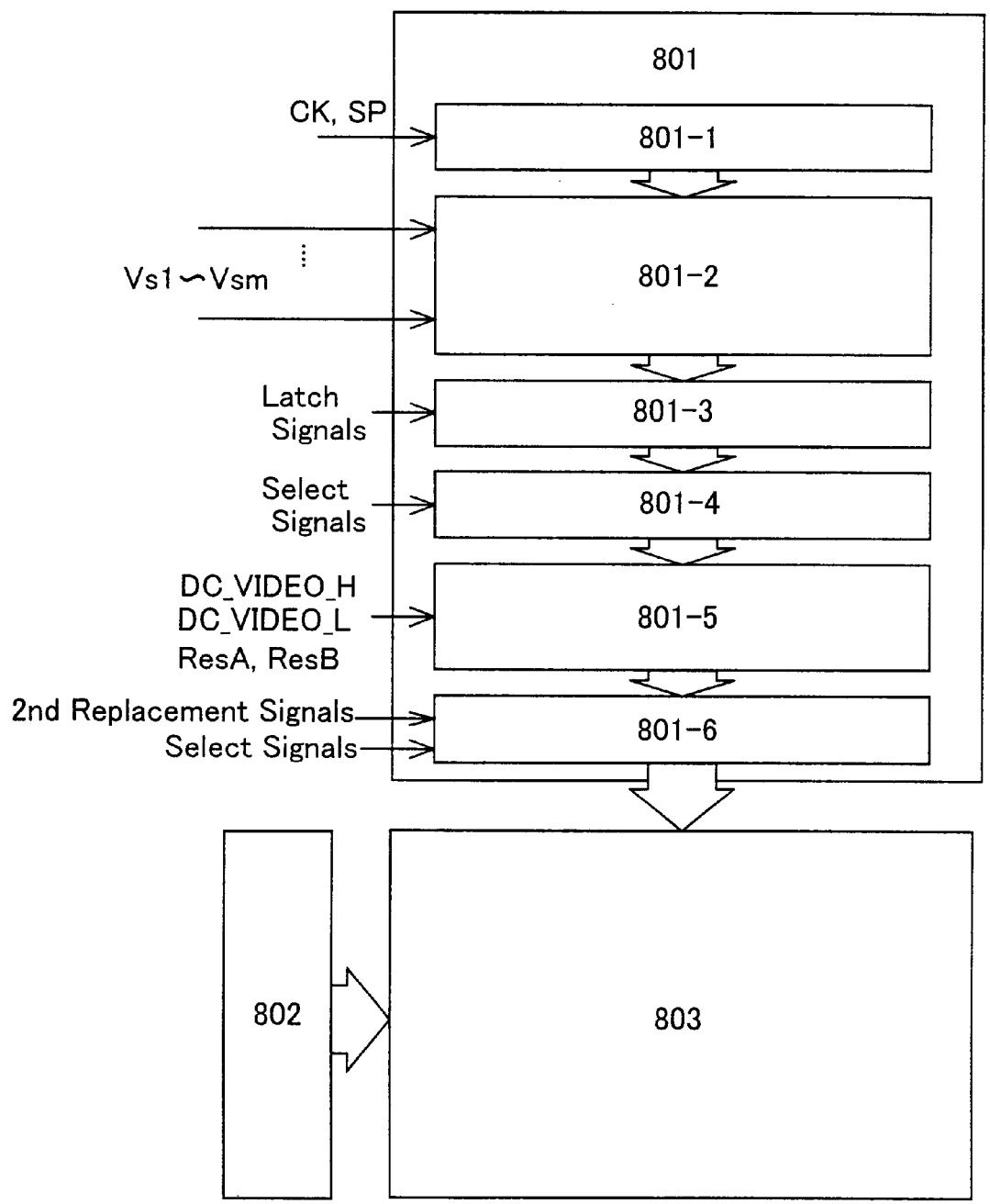
FIG. 15 is a schematic plan view of an active matrix liquid crystal display device according to the present invention.

FIG. 15 is a schematic black diagram of an active matrix liquid crystal display device according to the present embodiment. Reference numerals 801, 802, and 803 denote a source signal line driving circuit, a gate signal line driving circuit, and a pixel portion, respectively.

The source signal line driving circuit 801 has a shift register circuit 801_1, the latch circuit 1 (801-2), a latch circuit 2 (801-3), a selector circuit 1 (801-4), a D/A conversion circuit 801-5, and a selector circuit 2 (801-6). The source signal line driving circuit 801 may further have a buffer circuit and a level shift circuit (both not shown). Further, the D/A conversion circuit 801-5 may include a level shift circuit.

Though, in the present embodiment, one source signal line driving circuit and one gate signal line driving circuit are provided, the present invention is not limited thereto, and two source signal line driving circuits may be provided, and two gate signal line driving circuits may be provided.

Further, the gate signal line driving circuit 802 has a shift register circuit and a buffer circuit (both not shown). The gate signal line driving circuit 802 may further have a level shift circuit.

The pixel portion 803 has a plurality of pixels. A pixel TFT is disposed in each of the pixels. A source signal line and a gate signal line are electrically connected to a source region and a gate electrode, respectively, of each pixel TFT. Further, a pixel electrode is electrically connected to a drain region of each pixel TFT. Each pixel TFT controls supply of an image signal (analog signal) to a pixel electrode electrically connected to each pixel TFT. An image signal (analog signal) is supplied to each pixel electrode, voltage is applied to liquid crystal sandwiched between each pixel electrode and an opposing electrode, and the liquid crystal is driven.

Operation of the source signal line driving circuit 801 is now described. A clock signal (CK) and a start pulse (SP) are inputted to the shift register circuit 801-1. Based on the clock signal (CK) and the start pulse (SP), the shift register circuit 801-1 sequentially generates timing signals, and sequentially supplies the timing signals to the latch circuit 1 (801-2).

The latch circuit 1 (801-2) has latch circuits for processing the m divided video signals each consisting of digital divided video signals of s bits. When the timing signal is inputted, the latch circuit 1 (801-2) sequentially takes in the divided video signals supplied from the buffer circuit 709 illustrated in FIG. 13, i.e., m divided video signals at a time, and retains them.

A time period until a cycle for writing the divided video signals in all the stages of the latch circuits of the latch circuit 1 (801-2) is completed, is referred to as a line period. In other words, a line period is a time period from a time point when writing of a divided video signal in the latch circuit of the leftmost stage in the latch circuit 1 (801-2) starts to a time period when writing of a divided video signal in the latch circuit of the rightmost stage ends. Actually, a time period which is the sum of the above line period and a horizontal retrace line period may also be referred to as a line period.

After one line period ends, a latch signal is supplied to the latch circuit 2 (801-3). At this instant, the divided video signals written and retained in the latch circuit 1 (801-2) are all sent at once to the latch circuit 2 (801-3), and written and retained in all stages of the latch circuits of the latch circuit 2 (801-3).

After the latch circuit 1 (801-2) completes sending of the divided video signals to the latch circuit 2 (801-3); based on the timing signals from the shift register circuit 801-1, writing of the divided video signals, i.e., m divided video signals at a time, supplied from the buffer circuit 709 through the divided video signal lines is again sequentially performed.

During the second cycle of one line period, the divided video signals written and retained in the latch circuit 2 (801-3) are sequentially selected by the selector circuit 1 801-4 and are supplied to the D/A conversion circuit (DAC) 801-5.

The divided video signals selected by the selector circuit (801-4) are supplied to the DAC 801-5.

The DAC 801-5 converts the digital divided video signals to m analog divided video signals, and sequentially supplies them to the source signal lines selected by the selector circuit 2 801-6.

In the present embodiment, the second replacement signal is inputted from the replacement data processing circuit 711 to the selector circuit 2 (801-6). Then, using the second replacement signal inputted from the replacement data processing circuit 711, the selector circuit 1 (801-4) the m analog divided video signals outputted from the DAC 801-5 inputs to predetermined source signal lines, respectively. More specifically, independently of which of the m divided video signals (Vs1 to Vsm) is inputted to which of the buffer circuits (709_1 to 709_m) using the first replacement signal, the m analog divided video signals (Vs1 to Vsm) outputted from the DAC 801-5 are inputted to the predetermined m source signal lines, respectively.

The first replacement signal and the second replacement signal are generated by inputting a replacement data signal to the replacement data processing circuit 711. The replacement data signal is generated by the replacement data circuit 706. It is to be noted that operation of the replacement data circuit 706 is the same as that of the replacement data circuit in the case of the analog driving described in the above with regard to the embodiment mode of the present embodiment.

The analog divided video signal supplied to a source signal line is supplied to the source region of the pixel TFT of the pixel portion connected to the source signal line.

In the gate signal line driving circuit 802, a timing signal from the shift register (not shown) is supplied to the buffer circuit (not shown), and is supplied to a corresponding gate signal line (scanning line). Gate electrodes of pixel TFTs for one line are connected to the gate signal line. Since all the pixel TFTs for one line have to be simultaneously turned ON, a buffer circuit having a large current-carrying capacity is used as the buffer circuit.

In this way, using a selection signal from the gate signal line driving circuit 802, a corresponding pixel TFT is switched, an analog divided video signal from the source signal line driving circuit is supplied to the pixel TFT, and the liquid crystal molecules are driven.

By the above structure according to the present invention, even if a stripe due to the brightness/darkness (a division stripe) is displayed on the screen caused by potential difference between a divided video signal outputted from a buffer circuit having different characteristics and from the D/A conversion circuit of the source signal line driving circuit and other divided video signals, since the place where the division stripe is displayed moves every time a predetermined time period elapses, the division stripe is unliable to be visually recognized by an observer.

It is to be noted that, in the present invention, to set the time period from a time point when the combination of the divided video signals and the buffer circuits changes to a time point when the combination changes again such that a division stripe is unliable to be visually recognized by an observer, is important. The time period from a time point when the combination of the divided video signals and the buffer circuits changes to a time point when the combination changes again is, in other words, a time period from a time point when the counter value changes to a time point when the counter value changes again. The time period also corresponds to the time period from a time point when the information of the first replacement signal and the second replacement signal changes to a time point when the information of the first replacement signal and the second replacement signal changes again.

The time period until the combination of the divided video signals and the buffer circuits, is preferably as short as possible. The shorter the time period is, the more unliable a division stripe is to be visually recognized by an observer. The time period until the combination of the divided video signals and the buffer circuits is preferably 1/20 sec or shorter. In the present embodiment mode, the combination of the divided video signals and the buffer circuits is set to be changed every time one frame period elapses.

Therefore, according to the present invention, when divided driving is performed, a division stripe is unliable to be visually recognized by an observer. Further, since divided driving is performed, even if the horizontal number of pixels of the active matrix semiconductor display device increases, flicker of the displayed image can be prevented while the driving frequency of the source signal line driving circuit is suppressed, and images having many tones can be displayed with a high precision and with a high resolution.

It is to be noted that the present invention is not limited to the structure illustrated in FIGS. 13 to 15. All which is required is a structure where the combination of a plurality of buffer circuits and a plurality of divided video signals to be inputted to the plurality of buffer circuits, respectively, is arbitrarily changed every time a predetermined time period elapses, and the plurality of divided video signals are sampled and are inputted to particular predetermined source signal lines, respectively.

[Embodiment 6]

Figure 16:
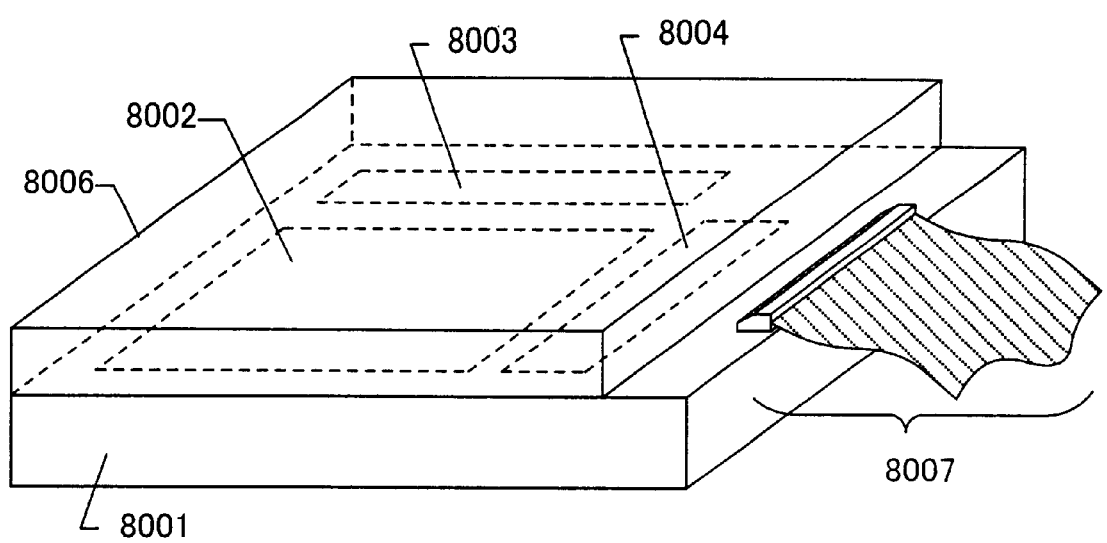
FIG. 16 is a perspective view of a semiconductor display device according to the present invention.

FIG. 16 illustrates a case where an active matrix liquid crystal display device is formed using the active matrix substrate having the structure described in Embodiment 1, 2, 3, 4, or 5. FIG. 16 illustrates a portion which corresponds to a display of an active matrix liquid crystal display device, which is also referred to as a liquid crystal panel. It is to be noted that, in the present embodiment, for the purpose of describing the portion where the liquid crystal panel is affixed to an FPC, a sealing material and a cell forming portion are not illustrated in the figure for convenience' sake.

In FIG. 16, a plurality of TFTs are formed on an active matrix substrate 8001. These TFTs form on the substrate a pixel portion 8002, a gate signal line driving circuit 8003, and a source signal line driving circuit 8004. An opposing substrate 8006 is affixed to the active matrix substrate. Liquid crystal (not shown) is sandwiched between the active matrix substrate and the opposing substrate 8006.

In the structure illustrated in FIG. 16, it is preferable that the side surfaces of the active matrix substrate 8001 and the side surfaces of the opposing substrate 8006 are all aligned except for one side. By this, the number of pieces which can be taken from one large substrate can be increased efficiently. With regard to the above-mentioned one side, a part of the opposing substrate 8006 is removed to expose a part of the active matrix substrate 8001, and an FPC (flexible print circuit) 8007 is attached to that portion. The circuit group for generating the divided video signals according to the present invention which is provided on the IC chip is connected through the FPC 8007 to the gate signal line driving circuit 8003 and the source signal line driving circuit 8004 of the active matrix substrate 8001.

[Embodiment 7]

In this embodiment, an example of manufacturing an active matrix liquid crystal display device which is one of semiconductor display devices according to the present invention will now be explained with reference to FIGS. 18 to 22. The detailed description that follows will deal with the steps of a process whereby the pixel TFT in the pixel portion and the driver circuit TFT formed in the periphery of the pixel portion are fabricated on the same substrate. To simplify the explanation, however, the driver circuit will be illustrated with a CMOS circuit as the basic circuit, such as a shift register circuit, a buffer circuit, and D/A conversion circuit, and an n-channel TFT.

In FIG. 18A, a low alkali glass substrate or a quartz substrate may be used as a substrate (an active matrix substrate) 6001. In this embodiment, a low alkali glass substrate was used. It may be heat treated beforehand at a temperature about 10–20° C. lower than the glass strain temperature. On the surface of the substrate 6001 on which the TFT is formed, there is formed a base film 6002 such as a silicon oxide film, a silicon nitride film or a silicon oxynitride film, in order to prevent diffusion of the impurity from the substrate 6001. For example, the plasma CVD method is used to form a laminate of a silicon oxynitride film made from $SiH_4$, $NH_3$ and $N_2O$ to a thickness of 100 nm and a silicon oxynitride film made from $SiH_4$ and $N_2O$ to a thickness of 200 nm.

Next, a semiconductor film 6003a having an amorphous structure with a thickness of 20–150 nm (preferably 30–80 nm) is formed by a publicly known method such as plasma CVD or sputtering. In this embodiment, an amorphous silicon film was formed to a thickness of 55 nm by plasma CVD). Semiconductor films with amorphous structures include amorphous semiconductor films and fine crystalline semiconductor films, and a compound semiconductor film with an amorphous structure, such as an amorphous silicon-germanium film, may also be used. Since the base film 6002 and the amorphous silicon film 603a can be formed by the same film forming method, they may be made by continuous formation. After forming the base film, contamination of the surface can be prevented by once removing it from the air atmosphere, thus reducing fluctuation of the TFT properties and variation in the threshold voltage of the fabricated TFT (FIG. 18A).

Then, a publicly known crystallizing technique is then used to form a crystalline silicon film 6003b from the amorphous silicon film 6003a. For example, a laser crystallizing or heat crystallizing method (solid phase growth method) may be used. When a laser crystallizing is performed, continuous emission excimer laser may be used. Here a crystalline silicon film 6003b was formed by a crystallization method using a catalyst element, according to the technique disclosed in Japanese Laid-Open Patent Publication No. 7-130652. Before the crystallization step, although it will depend on the moisture content of the amorphous silicon film, heat treatment is preferably effect for about one hour at 400–500° C. to reduce the moisture content to not more than 5 atomic % prior to crystallization. Crystallization of the amorphous silicon film causes rearrangement of the atoms to a more dense form, so that the thickness of the crystalline silicon film that is fabricated is reduced by about 1–15% from the thickness of the original amorphous silicon film (55 nm in this embodiment) (FIG. 18B).

The crystalline silicon film 6003b is then separated into island-like sections to form island-like semiconductor layers 6004–6007. A mask layer 6008 is then formed by a silicon oxide film with a thickness of 50–100 nm by plasma CVD or sputtering (FIG. 18C).

Then, a resist mask 6009 was provided, and boron (B) was added as a p-type impurity element at a concentration of about $1\times10^{16}$ to $5\times10^{17}$ atoms/cm$^3$ for the purpose of controlling the threshold voltage on the entire surface of the island-like semiconductor layers 6005–6007 forming the n-channel TFT. The addition of boron (B) may be accomplished by an ion doping method, or it may be added simultaneously with formation of the amorphous silicon film. While the addition of boron (B) is not necessarily essential, the semiconductor layers 6010–6012 were preferably formed with boron (B) added thereto to keep the threshold voltage of the n-channel TFT in the prescribed range (FIG. 18D).

To form the LDD regions of the n-channel TFT of the driver circuit, an n-type impurity element is selectively added to the island-like semiconductor layers 6010, 6011. For this purpose, resist masks 6013–6016 are formed beforehand. The n-type impurity element used may be phosphorus (P) or arsenic (As), and in this case an ion doping method was employed using phosphine (PH$_3$) for addition of phosphorus (P). The phosphorus (P) concentration of the formed impurity regions 6017, 6018 may be in the range of $2\times10^{16}$ to $5\times10^{19}$ atoms/cm$^3$. Throughout the present specification, the concentration of the n-type impurity element in the impurity regions 6017–6019 formed here will be represented as (n$^-$). The impurity region 6019 is a semiconductor layer for formation of the storage capacitor of the pixel portion, and phosphorus (P) was added at the same concentration in this region as well (FIG. 19A).

This is followed by a step of removing the mask layer 6008 by hydrofluoric acid or the like, and activating the impurity elements added in FIG. 18D and FIG. 19A. The activation may be carried out by heat treatment for 1–4 hours at 500–600° C. in a nitrogen atmosphere, or by a laser activation method. These may also be carried out in combination. In this embodiment, a laser activation method was used, with KrF excimer laser light (248 nm wavelength) to form a linear beam, for scanning at an oscillation frequency of 5–300 Hz and an energy density of 100–500 mJ/cm$^2$ with 50–90% linear beam overlap, to treat the entire substrate on which the island-like semiconductor layers had been formed. Note that there are no particular restrictions on the laser light irradiation conditions, and they may be appropriately set by the operator. In addition, the activation may be carried out by continuous light emission excimer laser.

A gate insulating film 6020 is then formed with a silicon-containing insulating film to a thickness of 10–150 nm using plasma CVD or sputtering. For example, a silicon oxynitride film is formed to a thickness of 120 nm. The gate insulating film may also be a single layer or multi-layer structure of other silicon-containing insulating films (FIG. 19B).

Next, a first conductive layer is made to form the gate electrodes. This first conductive layer may be formed as a single layer, but if necessary it may also have a laminated structure of two or three layers. In this embodiment, a conductive layer (A) 6021 made of a conductive metal nitride film and a conductive layer (B) 6022 made of a metal film were laminated. The conductive layer (B) 6022 may be formed of an element selected from among tantalum (Ta), titanium (Ti), molybdenum (Mo) and tungsten (W), or an alloy composed mainly of one of these elements, or an alloy film comprising a combination of these elements (typically a Mo—W alloy film or Mo—Ta alloy film), and the conductive layer (A) 6021 is formed of tantalum nitride (TaN), tungsten nitride (WN), titanium nitride (TiN) or molybdenum nitride (MoN). As alternative materials for the conductive layer (A) 6021 there may be used tungsten silicide, titanium silicide or molybdenum silicide. The conductive layer (B) may have a reduced impurity concentration for the purpose of lower resistance, and in particular the oxygen concentration was satisfactory at 30 ppm or less. For example, tungsten (W) with an oxygen concentration of 30 ppm or less allowed realization of a resistivity of 20 $\mu\Omega$cm or less.

The conductive layer (A) 6021 may be 10–50 nm (preferably 20–30 nm) and the conductive layer (B) 6022 may be 200–400 nm (preferably 250–350 nm). In this embodiment, a tantalum nitride film with a thickness of 30 nm was used as the conductive layer (A) 6021 and a Ta film of 350 nm was used as the conductive layer (B) 6022, and both were formed by sputtering. In this film formation by sputtering, addition of an appropriate amount of Xe or Kr to the Ar sputtering gas can alleviate the internal stress of the formed film to thus prevent peeling of the film. Though not shown, it is effective to form a silicon film doped with phosphorus (P) to a thickness of about 2–20 nm under the conductive layer (A) 6021. This can improve adhesion and prevent oxidation of the conductive film formed thereover, while also preventing diffusion of trace alkali metal elements in the conductive layer (A) or conductive layer (B) into the gate insulating film 6020 (FIG. 19C).

Resist masks 6023–6027 are then formed, and the conductive layer (A) 6021 and conductive layer (B) 6022 are etched together to form gate electrodes 6028–6031 and a capacitor wiring 6032. The gate electrodes 6028–6031 and capacitor wiring 6032 comprise the integrally formed sections 6028a–6032a consisting of the conductive layer (A) and sections 6028b–6032b consisting of the conductive layer (B). Here, the gate electrodes 6029, 6030 formed in the driver circuit are formed so as to overlap with a portion of the impurity regions 6017, 6018 via the gate insulating film 6020 (FIG. 19D).

This is followed by a step of adding a p-type impurity element to form the p-channel TFT source region and drain region of the driver circuit. Here, the gate electrode 6028 is used as a mask to form impurity regions in a self-alignment manner. The region in which the n-channel TFT is formed is covered at this time with a resist mask 6033. The impurity regions 6034 are formed by an ion doping method using diborane (B$_2$H$_6$). The boron (B) concentration of this region is $3\times10^{20}$ to $3\times10^{21}$ atoms/cm$^3$. Throughout this specification, the concentration of the p-type impurity element in the impurity regions 6034 formed here will be represented as (p$^+$) (FIG. 20A).

Next, impurity regions functioning as a source region or drain region were formed in the n-channel TFT. Resist-masks 6035–6037-were formed, and an n-type impurity element was added to form impurity regions 6038–6042. This was accomplished by an ion doping method using phosphine (PH$_3$), and the phosphorus (P) concentration in the regions was in the range of $1\times10^{20}$ to $1\times10^{21}$ atoms/cm$^3$. Throughout the present specification, the concentration of the n-type impurity element in the impurity regions 6038–6042 formed here will be represented as (n$^+$) (FIG. 20B).

The impurity regions 6038–6042 already contain phosphorus (P) or boron (B) added in the previous step, but since a sufficiently high concentration of phosphorus (P) is added in comparison, the influence of the phosphorus (P) or boron (B) added in the previous step may be ignored. As the concentration of phosphorus (P) added to the impurity region 6038 is ½ to ⅓ of the boron (B) concentration added in FIG. 20A, the p-type conductivity is guaranteed so that there is no effect on the properties of the TFT.

This was followed by a step of adding an n-type impurity to form an LDD region in the n-channel TFT of the pixel portion. Here, the gate electrodes 6031 were used as a mask for self-aligning addition of an n-type impurity element by an ion doping method. The concentration of phosphorus (P) added was $1\times10^{16}$ to $5\times10^{18}$ atoms/cm$^3$, and addition of a lower concentration than the concentrations of the impurity elements added in FIG. 19A, FIG. 20A and FIG. 20B, substantially forms only impurity regions 6043, 6044. Throughout this specification, the concentration of the n-type impurity element in these impurity regions 6043, 6044 will be represented as (n$^-$) (FIG. 20C).

This was followed by a step of heat treatment for activation of the n-type or p-type impurity element added at their respective concentrations. This step can be accomplished by the furnace anneal method, laser anneal method or rapid thermal anneal method (RTA method). Here, the activation step was accomplished by the furnace anneal method. The heat treatment is carried out in a nitrogen atmosphere with an oxygen concentration of no greater than 1 ppm and preferably no greater than 0.1 ppm, at 400–800° C. and typically 500–600° C., and for this embodiment the heat treatment was carried out at 550° C. for 4 hours. When a heat resistant material such as a quartz substrate is used for the substrate 6001, the heat treatment may even be at 800° C. for one hour, and this allowed activation of the impurity element and formation of a satisfactory bond between an impurity region to which the impurity element is added and the channel-forming region.

In the heat treatment, conductive layers (C) 6028c–6032c are formed to a thickness of 5–80 nm from the surfaces of the metal films 6028b–6032b forming the gate electrodes 6028–6031 and the capacitor wiring 6032. For example, when the conductive layers (B) 6028b–6032b are of tungsten (W), tungsten nitride (WN) is formed, whereas when tantalum (Ta) is used, tantalum nitride (TaN) may be formed. In the present invention, a laminated structure of a silicon (Si) film, a WN film, and a W film, a laminated structure of a W film and a W film having silicon, a laminated structure of a W film, a W film having silicon, and silicon, a W film having Mo, or a Ta film having Mo is used as a gate electrode. The conductive layers (C) 6028c–6032c may be formed in the same manner by exposing the gate electrodes 6028–6031 to a nitrogen-containing plasma atmosphere, using either nitrogen or ammonia. A step was also performed for hydrogenation of the island-like semiconductor layer by heat treatment at 300–450° C. for 1–12 hours in an atmosphere containing 3–100% hydrogen. This step is a step for terminating the dangling bond of the semiconductor layer by thermally excited hydrogen. Plasma hydrogenation (using plasma-excited hydrogen) may also be carried out as another means for hydrogenation.

When the island-like semiconductor layer was fabricated by a method of crystallization from an amorphous silicon film using a catalyst element, the catalyst element remained in a trace amount in the island-like semiconductor layers. While the TFT can of course be completed even in this condition, it is more preferable for the residual catalyst element to be eliminated at least from the channel-forming region. One means used to eliminate the catalyst element was utilizing the gettering effect by phosphorus (P). The phosphorus (P) concentration necessary for gettering is on the same level as the impurity region (n$^+$) formed in FIG. 20B, and the heat treatment for the activation step carried out here allowed gettering of the catalyst element from the channel-forming region of the n-channel TFT and p-channel TFT (FIG. 20D).

After completion of the steps of activation and hydrogenation, the second conductive film to serve as the gate wiring is formed. This second conductive film may be formed with a conductive layer (D) composed mainly of aluminum (Al) or copper (Cu) as low resistance materials, and a conductive layer (E) made of titanium (Ti), tantalum (Ta), tungsten (W) or molybdenum (Mo). In this embodiment, the conductive layer (D) 6045 was an aluminum (Al) film containing 0.1–2 wt % titanium (Ti), and the conductive layer (E) 6046 was a titanium (Ti) film. The conductive layer (D) 6045 may be formed to 200–400 nm (preferably 250–350 nm), and the conductive layer (E) 6046 may be formed to 50–200 nm (preferably 100–150 nm) (FIG. 21A).

The conductive layer (E) 6046 and conductive layer (D) 6045 were subjected to etching treatment to form the gate wiring connecting the gate electrodes, thus forming gate wirings 6047, 6048 and capacitor wiring 6049. The etching treatment first accomplished removal from the surface of the conductive layer (E) to partway through the conductive layer (D) by a dry etching method using a mixed gas of SiCl$_4$, Cl$_2$ and BCl$_3$, and then wet etching was performed with a phosphoric acid-based etching solution to remove the conductive layer (D), thus allowing formation of a gate wiring while maintaining selective working with the base layer. (FIG. 21B)

A first interlayer insulating film 6050 is formed with a silicon oxide film or silicon oxynitride film to a thickness of 500–1500 nm, after which contact holes are formed reaching to the source region or drain region formed in each island-like semiconductor layer, to form source wirings 6051–6054 and drain wirings 6055–6058. While not shown here, in this embodiment the electrode has a three-layer laminated structure with continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50–500 nm (typically 100–300 nm) as a passivation film 6059. Hydrogenation treatment performed in this state gave favorable results for enhancement of the TFT characteristics. For example, heat treatment may be carried out for 1–12 hours at 300–450° C. in an atmosphere containing 3–100% hydrogen, or a similar effect may be achieved by using a plasma hydrogenation method. Here, an opening may be formed in the passivation film 6059 at the position where the contact holes are to be formed for connection of the pixel electrodes and the drain wirings (FIG. 21C).

Figure 22:
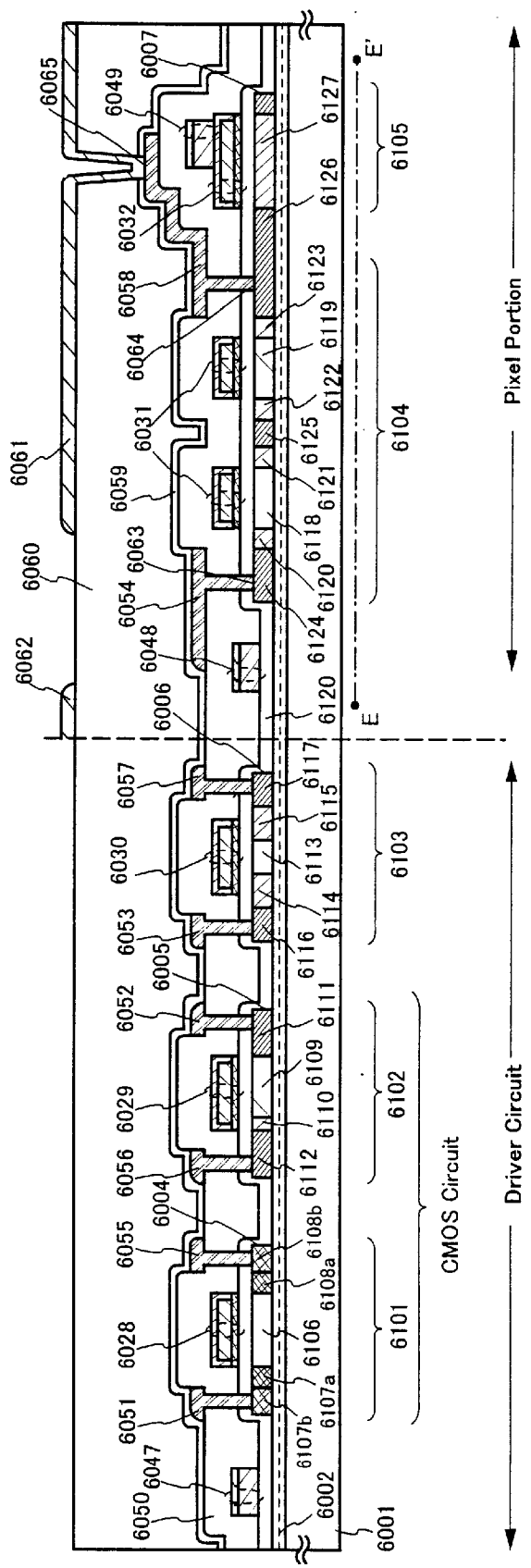
FIG. 22 illustrates the manufacturing process of the TFT used in the present invention.

Thereafter, a second interlayer insulating film 6060 made of an organic resin is formed to a thickness of 1.0–1.5 μm. The organic resin used may be polyimide, acryl, polyamide, polyimideamide, BCB (benzocyclobutene) or the like. Here, after coating onto the substrate, a thermal polymerization type polyimide was used for formation by firing at 300° C. A contact hole reaching to the drain wiring 6058 is then formed in the second interlayer insulating film 6060 and the passivation film 6059, thereby forming pixel electrodes 6061, 6062. The pixel electrodes used may be of a transparent conductive film in the case of a transmitting liquid crystal display device, or of a metal film in the case of a reflective liquid crystal display device. In this embodiment a transmitting liquid crystal display device was used, and therefore an indium-tin oxide (ITO) film was formed by sputtering to a thickness of 100 nm (FIG. 22).

In this manner, a substrate having a driver circuit TFT and a pixel TFT of a pixel portion was completed on the same substrate. A p-channel TFT 6101, a first n-channel TFT 6102 and a second n-channel TFT 6103 were formed on the driver circuit and a pixel TFT 6104 and a storage capacitor 6105 were formed on the pixel portion. Throughout the present specification, this substrate will be referred to as an active matrix substrate for convenience.

The p-channel TFT 6101 of the driver circuit has a channel-forming region 6106, source regions 6107*a*, 6107*b* and drain regions 6108*a*, 6108*b* in the island-like semiconductor layer 6004. The first n-channel TFT 6102 has a channel-forming region 6109, an LDD region 6110 overlapping the gate electrode 6029 (hereunder this type of LDD region will be referred to as $L_{ov}$), a source region 6111 and a drain region 6112 in the island-like semiconductor layer 6005. The length of this $L_{ov}$ region in the channel length direction was 0.5–3.0 μm, and is preferably 1.0–1.5 μm. The second n-channel TFT 6103 has a channel-forming region 6113, LDD regions 6114, 6115, a source region 6116 and a drain region 6117 in the island-like semiconductor layer 6006. These LDD regions are formed of an $L_{ov}$ region and an LDD region not overlapping the gate electrode 6030 (hereunder this type of LDD region will be referred to as $L_{off}$), and the length of this $L_{off}$ region in the channel length direction is 0.3–2.0 μm, and preferably 0.5–1.5 μm. The pixel TFT 6104 has channel-forming regions 6118, 6119, $L_{off}$ regions 6120–6123 and source or drain regions 6124–6126 in the island-like semiconductor layer 6007. The length of the $L_{off}$ regions in the channel length direction is 0.5–3.0 μm, and preferably 1.5–2.5 μm. The capacitor wirings 6032, 6049 and an insulating film made of the same material as the gate insulating film are connected to the drain region 6126 of the pixel TFT 6104, and a storage capacitor 6105 is formed from an n-type impurity element-added semiconductor layer 6127. In FIG. 22 the pixel TFT 6104 has a double gate structure, but it may also have a single gate structure, and there is no problem with a multi-gate structure provided with multiple gate electrodes.

Thus, this embodiment optimizes the structures of the TFTs forming each circuit in accordance with the specifications required for the pixel TFT and driver circuit, thus allowing the operating performance and reliability of the semiconductor device to be improved. In addition, by forming the gate electrodes with a heat resistant conductive material, it is possible to facilitate activation of the LDD regions and source and drain regions, and thus adequately reduce wiring resistance by formation of the gate wirings with low resistance materials. This allows application to display devices having pixel portions (screen sizes) in the class of 4 inches or larger.

Note that in this embodiment, a transmissive type liquid crystal panel is described. However, this invention is not limited to this and it can be applied to a reflection type liquid crystal panel.

[Embodiment 8]

An example of manufacturing an EL (electroluminescent) display using the present invention is explained in embodiment 8.

Figure 23A:
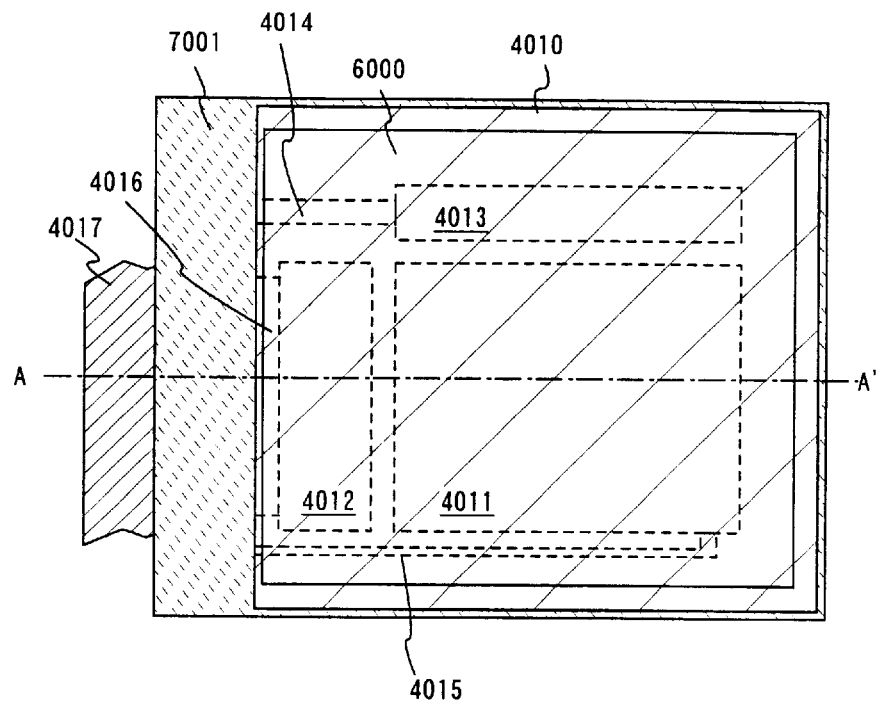
FIGS. 23A and 23B are a plan view and a sectional view of an EL display device using the present invention.

FIG. 23A is a top view of an EL display device using the present invention. In FIG. 23A, reference numeral 4010 is a substrate, reference numeral 4011 is a pixel portion, reference numeral 4012 is a source signal line driver circuit, and reference numeral 4013 is a gate signal line driver circuit. The driver circuits are connected to circuit group for generating a divided video signal of the present invention, through an FPC 4017, via wirings 4014 to 4016.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 23B:
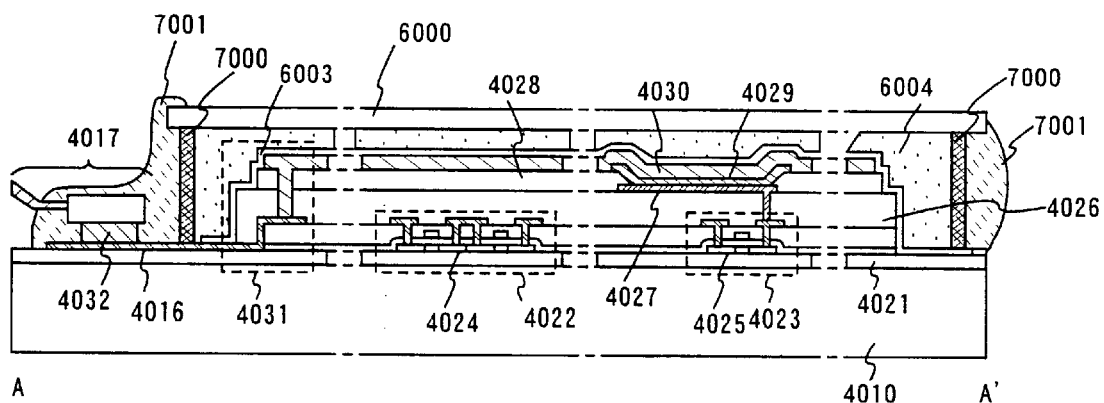

Further, FIG. 23B is a cross sectional structure of the EL display device of this embodiment. A driver circuit TFT 4022 (note that a CMOS circuit in which an n-channel TFT and a p-channel TFT are combined is shown in the figure here), a pixel TFT 4023 (note that only a TFT for correction the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made of a resin material. The pixel electrode is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an opening portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In embodiment 8, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of depositing the EL layer 4029 and the cathode 4030 continuously within a vacuum or a method of forming the EL layer 4029 in an inert gas atmosphere and forming a cathode 4030 without exposing to the air. The above film deposition becomes possible in embodiment 8 by using a multi-chamber method (cluster tool method) film deposition apparatus.

Note that a lamination structure of a LiF (lithium fluoride) film and an Al (aluminum) film is used in embodiment 8 as the cathode 4030. Specifically, a LiF (lithium fluoride) film having a thickness of 1 nm is formed by evaporation on the EL layer 4029, and a 300 nm thick aluminum film is formed on the LiF film. An MgAg electrode which is a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of mm of aluminum foil is sandwiched by a PVF film or a Mylar film.

However, depending upon the light emission direction from the EL element (the light radiation direction), it is necessary for the covering material 6000 to have light transmitting characteristics.

Further, the wiring 4016 is electrically connected to the FPC 4017 through a gap between the sealing material 7000 or an airtight sealing material 7001 and the substrate 4010. Note that although an explanation of the wiring 4016 has been made here, the wirings 4014 and 4015 are also electrically connected to the FPC 4017 by similarly passing underneath the sealing material 7000 and airtight sealing material 7001.

In this embodiment, the covering material 6000 is bonded after forming the filling material 6004, and the sealing material 7000 is attached so as to cover the lateral surfaces (exposed surfaces) of the filling material 6004, but the filling material 6004 may also be formed after attaching the covering material 6000 and the sealing material 7000. In this case, a filling material injection opening is formed through a gap formed by the substrate 4010, the covering material 6000, and the sealing material 7000. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

[Embodiment 9]

Figure 24A:
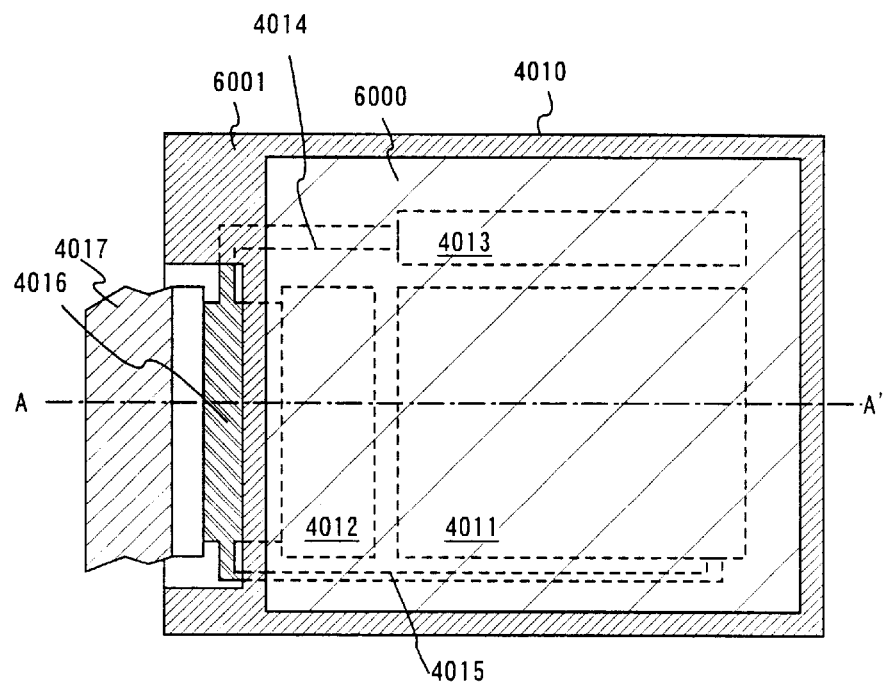
FIGS. 24A and 24B are a plan view and a sectional view of an EL display device using the present invention.
Figure 24B:
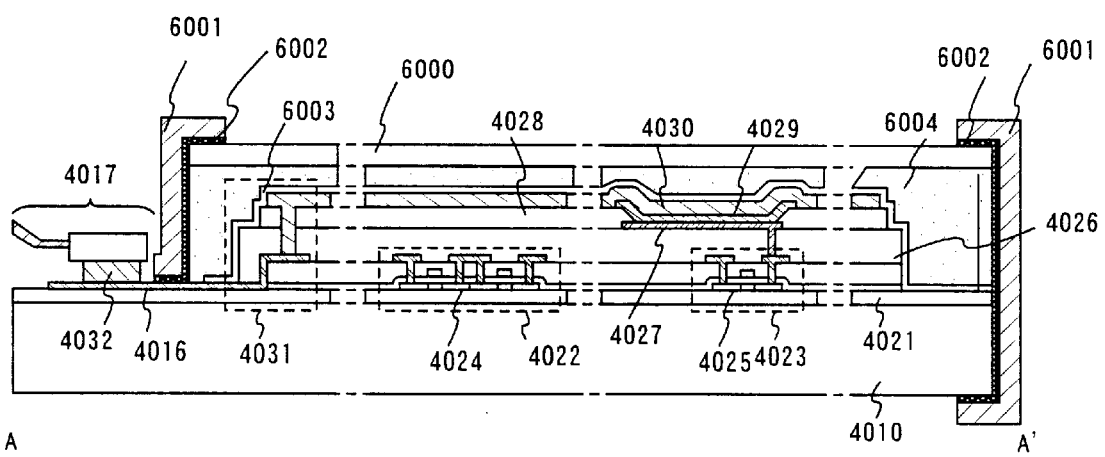

Next, an example of manufacturing an EL display device having a structure which differs from that of embodiment 8 is explained using FIGS. 24A and 24B. Parts having the same reference numerals as those of FIGS. 23A and 23B indicate the same portions, and therefore an explanation of those parts is omitted.

FIG. 24A is a top view of an EL display device of embodiment 9, and FIG. 24B shows a cross sectional diagram in which FIG. 24A is cut along the line A-A'.

In accordance with embodiment 8, manufacturing is performed through the step of forming the passivation film 6003 covering the surface of the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When spacers are provided, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of $\mu$m of aluminum foil is sandwiched by a PVF film or a Mylar film.

However, depending upon the light emission direction from the EL element (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014 and 4015 are also electrically connected to the FPC 4017 by similarly passing underneath the sealing material 6002. The wirings 4014, 4015, and 4016 are connected to a circuit group for generating a divided video signal of the present invention.

Note that the covering material 6000 is bonded after forming a filing material 6004, and the frame material 6001 is attached so as to cover the lateral surfaces (exposed surfaces) of the filling material 6004 in this embodiment, but the filling material 6004 may also be formed after attaching the covering material 6000 and the frame material 6001. In this case, an injection opening of the filling material is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

[Embodiment 10]

Figure 25:
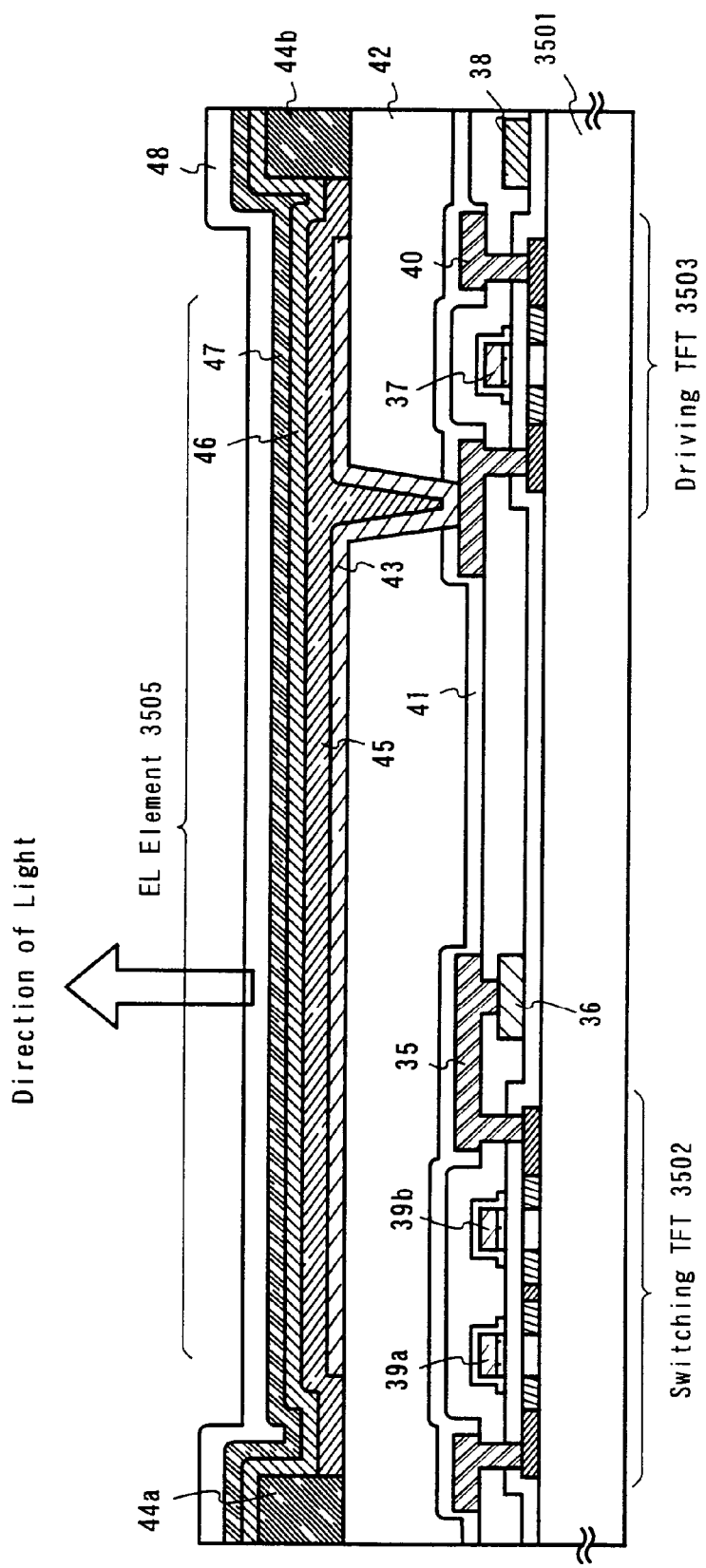
FIG. 25 is a sectional view of an EL display device using the present invention.
Figure 26A:
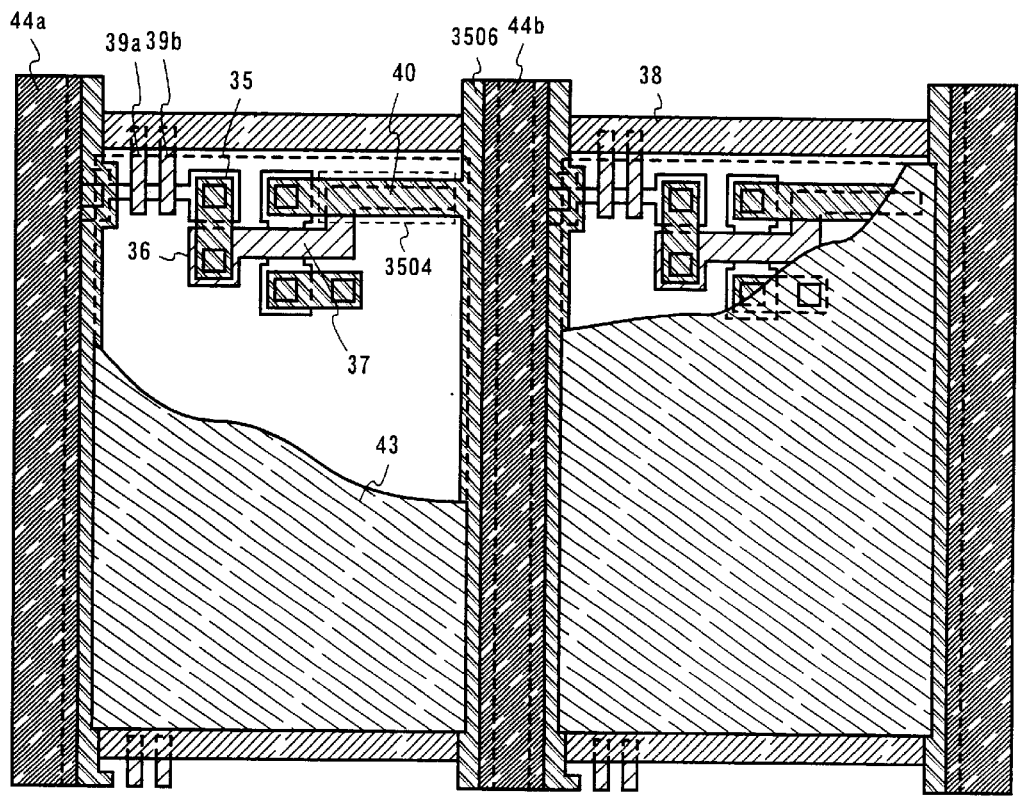
FIGS. 26A and 26B are a plan view and a circuit diagram of the EL display device using the present invention.
Figure 26B:
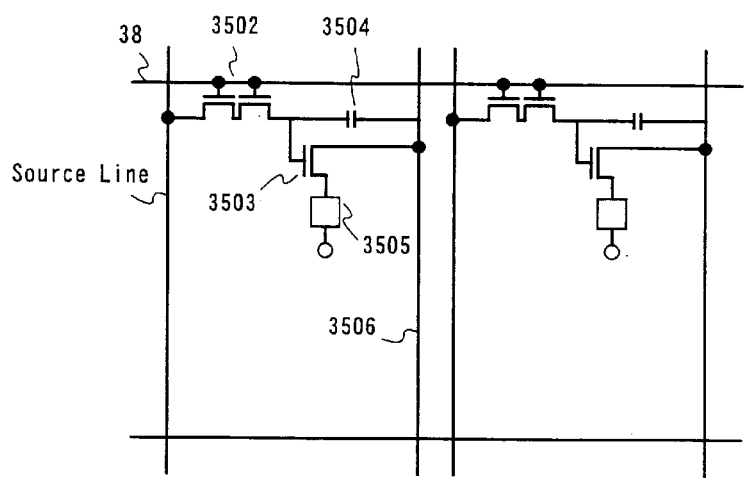

In embodiment 10, FIG. 25 is a more-detailed cross sectional structure, FIG. 26A is a top plan view, and FIG. 26B is a circuit diagram of a pixel portion in the EL display panel. Since common reference numerals are used in FIG. 25, FIG. 26A and FIG. 26B, these figures may be cross-referred.

Referring to FIG. 25, a switching TFT 3502 provided on a substrate 3501 is formed by employing the N-channel TFT which is manufactured by using a known method. In this embodiment, the switching TFT 3502 is formed as a double-gate structure. Since the construction and fabricating process of the double-gate structure are not greatly different from those of a single-gate structure, they shall be omitted from description. However, the double-gate structure is a structure in which two TFTs are, in effect, connected in series, and it has the merit that an OFF current value can be decreased. Although the double-gate structure is employed in this embodiment, it may well be replaced with the single-gate structure or with a triple-gate structure or a multi-gate structure having three or more gates. Further, the switching TFT 3502 may well be formed by employing the P channel TFT.

Besides, a TFT 3503 for driving EL is formed by employing the N channel TFT formed by a known method. On this occasion, the drain wiring 35 of the TFT 3502 for switching is electrically connected to the gate electrode 37 of the TFT for driving EL by a wiring 36. Also, a wiring indicated by numeral 38 is a gate wiring which electrically connects the gate electrodes 39a, 39b of the switching TFT 3502.

Since the TFT for driving EL is an element for controlling the magnitude of a current to flow through the EL element, it is an element through which a large amount of current flows and which is highly liable to deterioration ascribable to heat and also deterioration ascribable to hot carriers. Therefore, the structure of the present invention in which an LDD region is provided on the drain side of the TFT for driving EL so as to overlap the gate electrode through a gate insulating film is very effective.

In addition, although the TFT 3503 for driving EL is shown as a single-gate structure in this embodiment, it may well have a multi-gate structure in which a plurality of TFTs are connected in series. Further, it may well have a structure in which a plurality of divided channel forming regions are, in effect, formed by connecting a plurality of TFTs in parallel, whereby heat can be radiated at a high efficiency. Such a structure is effective as a measure against the deterioration ascribable to the heat.

As shown in FIG. 26A, a wiring to serve as the gate electrode 37 of the TFT for driving EL 3503 overlies the drain wiring 40 of the TFT 3503 for driving EL through an insulating film in a region indicated by numeral 3504. On this occasion, a capacitor is formed in the region indicated by numeral 3504. The capacitor 3504 functions to hold a voltage which is applied to the gate of the TFT for driving EL 3503. Incidentally, the drain wiring 40 is connected to a current supply line (power supply line) 3506 and is kept supplied with a constant voltage.

A first passivation film 41 is provided on the switching TFT 3502 and the TFT 3503 for driving EL, and it is overlaid with a flattening film 42 made of a resin insulating film. It is very important to flatten stepped parts ascribable to the TFTs, by employing the flattening film 42. Since an EL layer to be formed later is very thin, it sometimes incur an inferior luminescence due to the existence of the stepped parts. It is accordingly desirable to flatten the substrate structure before the formation of a pixel electrode so that the EL layer can be formed as flat as possible.

In addition, numeral 43 designates the pixel electrode (the cathode of the EL element) which is made of an electrically conductive film of high reflectivity, and which is electrically connected to the drain of the TFT 3503 for driving EL. The pixel electrode 43 should preferably be formed of a conductive film of low resistance, such as an aluminum alloy film, a copper alloy film or a silver alloy film, or a multilayer film consisting of the above conductive films. Of course, a multilayer structure including any other conductive film may well be employed.

Besides, a luminescent layer 45 is formed in a groove (corresponding to a pixel) which is defined by banks 44a, 44b made of an insulating film (preferably, of resin). Incidentally, although only one pixel is illustrated here, luminescent layers corresponding to the respective colors of R (red), G (green) and B (blue) may well be separately formed. Any of 7 conjugate polymeric materials is employed as an organic EL material for the luminescent layer. Typical polymeric materials are based on polyphenylene vinylene (PPV), polyvinyl carbazole (PVK), polyfluorene, etc.

Although the PPV-based organic EL materials include various types, it is recommended to employ any of materials stated in, for example, H. Shenk, H. Becker, O. Gelsen, E. Kluge, W. Kreuder and H. Spreitzer: "Polymers for Light Emitting Diodes", Euro Display, Proceedings, 1999, pp. 33–37, or the official gazette of Japanese Patent Application Laid-open No. 92576/1998.

Regarding practicable luminescent layers, cyanopolyphenylene vinylene may be used for the luminescent layer luminescing in red, polyphenylene vinylene for the luminescent layer luminescing in green, and polyphenylene vinylene or polyalkylphenylene for the luminescent layer luminescing in blue. The thickness of the luminescent layer may be set at 30 nm–150 nm (preferably, 40 nm–100 nm).

The materials mentioned above are mere examples of the organic EL materials applicable to the luminescent layer, and they are not restrictive at all. The EL layer (a layer for luminescence and for performing carrier motion for luminescence) may be formed by optionally combining the luminescent layer and the charge transport layer or charge injection layer).

By way of example, although the polymeric material has been mentioned as the material of the luminescent layer in this embodiment, a low-molecular organic EL material may well be employed. Also, an inorganic material such as silicon carbide can be employed for the charge transport layer or the charge injection layer. Such an organic EL material and an inorganic material may be any of known materials.

In this embodiment, the EL layer has a multilayer structure in which the luminescent layer 45 is overlaid with a hole injection layer 46 made of PEDOT (polythiophene) or PAni (polyaniline). Besides, the hole injection layer 46 is overlaid with an anode 47 which is formed of a transparent conductive film. In the case of this embodiment, light generated by the luminescent layer 45 is radiated toward the upper side of the substrate structure (upwards of the TFTs), and hence, the anode must be light-transmissive. A compound of indium oxide and tin oxide, or a compound of indium oxide and zinc oxide can be used for the transparent conductive film. Since the transparent conductive film is formed after the formation of the luminescent layer and hole injection layer of low heat resistivity, it should preferably be made of a material which can be deposited at the lowest possible temperature.

When the anode 47 has been formed, the EL element 3505 is finished up. Incidentally, the EL element 3505 here signifies a capacitor which is constituted by the pixel electrode (cathode) 43, luminescent layer 45, hole injection layer 46 and anode 47. Since the area of the pixel electrode 43 is substantially in agreement with that of one pixel as seen from FIG. 26A, the whole pixel functions as the EL element. Accordingly, the utilization efficiency of the luminescence is very high, and a bright image display is realized.

Meanwhile, in this embodiment, the anode 47 is further overlaid with a second passivation film 48. A silicon nitride film or a silicon oxynitride film is favorable as the second passivation film 48. This film 48 has the purpose of cutting off the EL element from the exterior, and it has both the significance of preventing the deterioration of the organic EL material attributed to oxidation and the significance of suppressing degassing from the organic EL material. Thus, the reliability of the EL display device is heightened.

As described above, the EL display panel of the present invention includes the pixel portions formed of the pixel having the structure as shown in FIG. 25, and it also includes the switching TFT of sufficiently low OFF current and the TFT for driving EL immune against the injection of hot carriers. It is accordingly possible to offer the EL display panel which has a high reliability and which is capable of good image display.

[Embodiment 11]

In this embodiment, there will be described a construction in which the structure of the EL element 3505 is reversed in the pixel portion stated in Embodiment 10 with reference to FIG. 27. Incidentally, since the points of difference from the structure shown in FIG. 25 lie only in parts of the EL element and the TFT for driving EL, the others shall be omitted from description.

Figure 27:
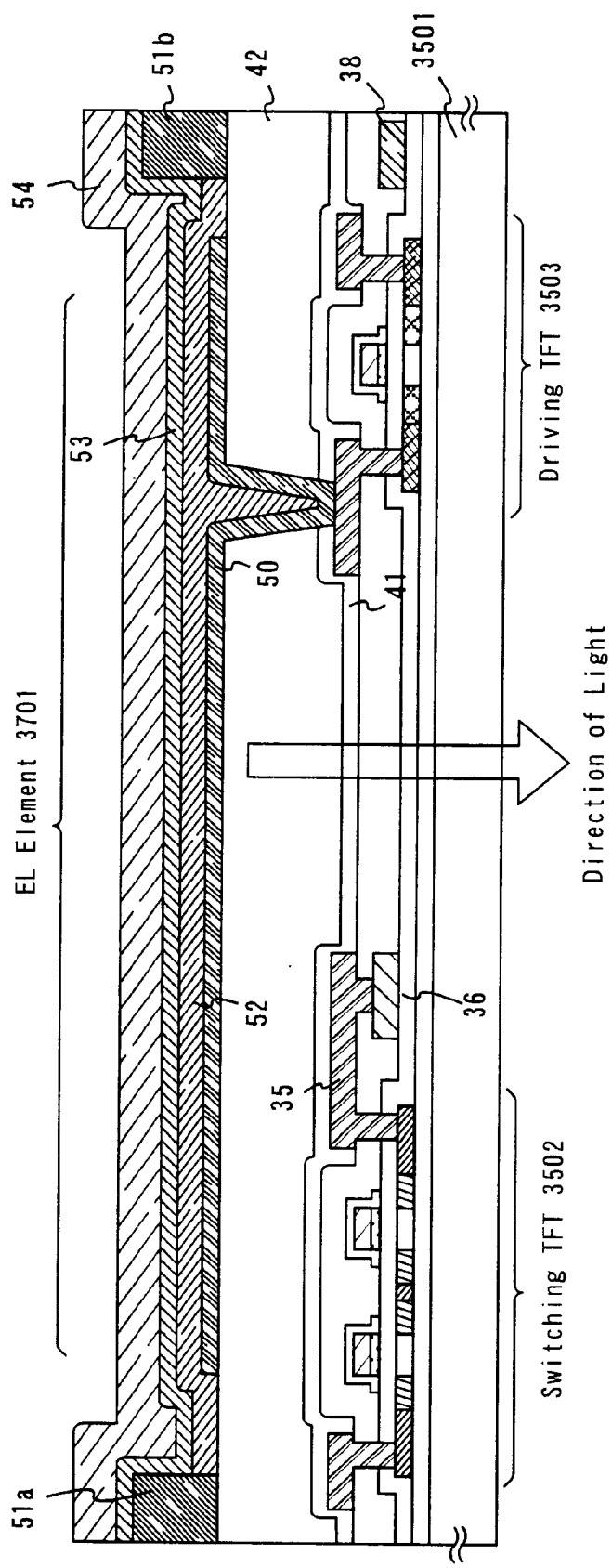
FIG. 27 is a sectional view of an EL display device using the present invention.

Referring to FIG. 27, a TFT 3503 for driving EL is formed using the P channel TFT manufactured by a know method.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may be employed.

Besides, after banks 51a and 51b made of an insulating film have been formed, a luminescent layer 52 made of polyvinylcarbazole is formed on the basis of the application of a solution. The luminescent layer 52 is overlaid with an electron injection layer 53 made of potassium acetylacetonate (expressed as "acacK"), and a cathode 54 made of an aluminum alloy. In this case, the cathode 54 functions also as a passivation film. Thus, an EL element 3701 is formed.

In the case of this embodiment, light generated by the luminescent layer 52 is radiated toward a substrate formed with TFTs as indicated by an arrow.

[Embodiment 12]

In this embodiment, examples in the case where a pixel has a structure different from that of the circuit diagram shown in FIG. 26B will be described with reference to FIGS. 28A–28C. Here in this embodiment, numeral 3801 desig-
nates the source wiring of a switching TFT 3802, numeral 3803 the gate wiring of the switching TFT 3802, numeral 3804 a TFT for driving EL, numeral 3805 a capacitor, each of numerals 3806 and 3808 a current supply line, and numeral 3807 an EL element.

Figure 28A:
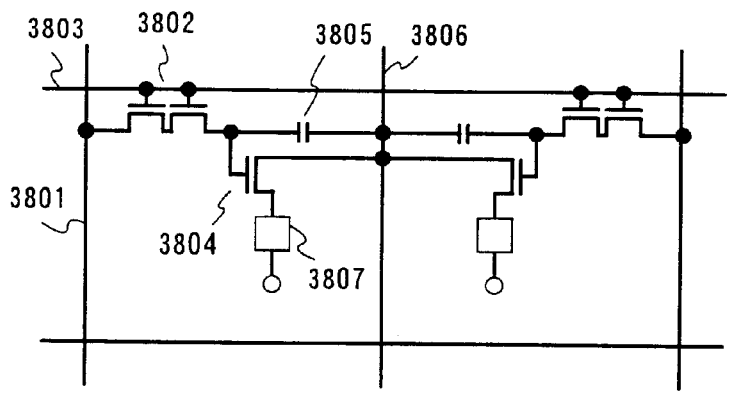
FIGS. 28A to 28C are circuit diagrams of an EL display device using the present invention.

FIG. 28A illustrates the example in the case where the current supply line 3806 is made common to two pixels. That is, this example features that the two pixels are formed in line symmetry with respect to the current supply line 3806. In this case, the number of the power supply lines can be decreased, so that a pixel portion can be endowed with a still higher definition.

Figure 28B:
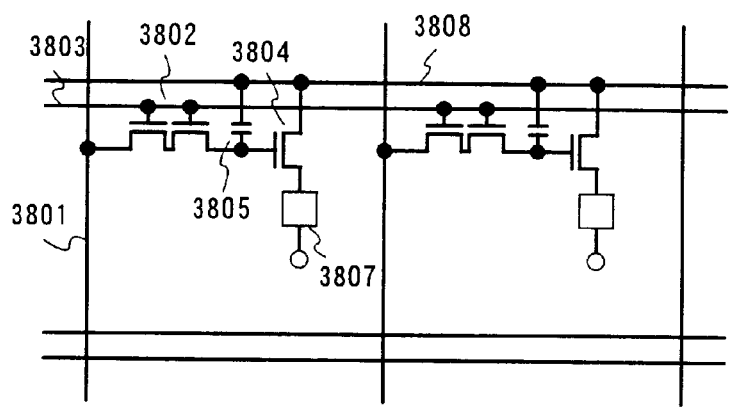

Besides, FIG. 28B illustrates the example in the case where the current supply line 3808 is laid in parallel with the gate wiring 3803. In the structure of FIG. 28B, the current supply line 3808 and the gate wiring 3803 are laid so as not to overlie each other, but when both are formed in different layers, they can be laid so as to overlie each other through an insulating film. Since, in this case, the power supply line 3808 and the gate wiring 3803 can share an occupation area, a pixel portion can be endowed with a still higher definition.

Figure 28C:
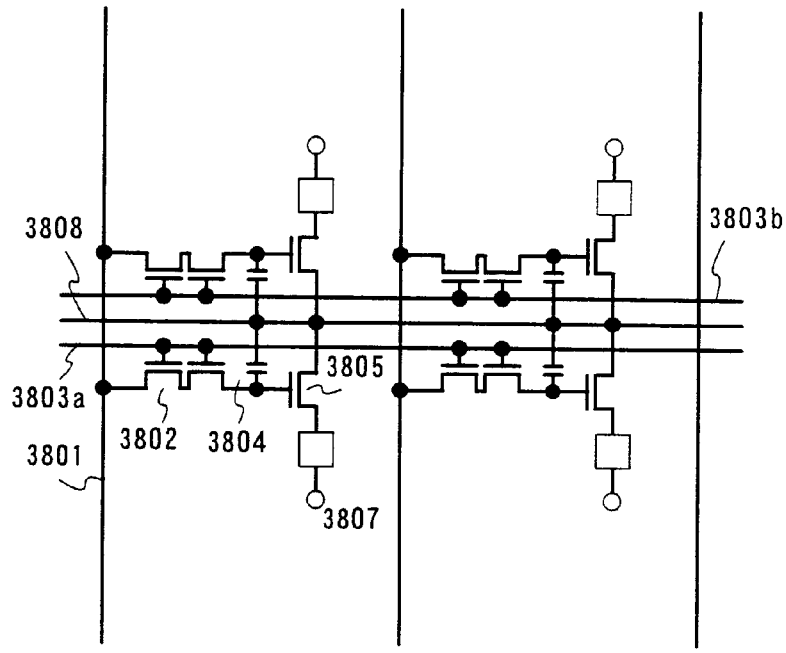

In addition, the example illustrated in FIG. 28C features that the current supply line 3808 is laid in parallel with the gate wiring 3803 in the same manner as in the structure of FIG. 28B, and further that two pixels are formed in line symmetry with respect to the current supply line 3808. It is also effective that the current supply line 3808 is laid so as to overlie either of the gate wiring 3803 of the two pixels. In this case, the number of the power supply lines can be decreased, so that a pixel portion can be endowed with a still higher definition.

[Embodiment 13]

In the structure of Embodiment 10 shown in FIGS. 26A and 26B, the capacitor 3504 is disposed in order to hold the voltage applied to the gate of the TFT 3503 for driving EL. It is also possible, however, to dispense with the capacitor 3504. In the case of Embodiment 10, the NTFT of the present invention is employed as the TFT 3503 for driving EL, so that the LDD region provided so as to be overlapped by the gate electrode through the gate insulating film is included. A parasitic capacitance generally called "gate capacitance" is formed in the overlapping domain. Embodiment 13 features that the parasitic capacitance is positively utilized instead of the capacitor 3504.

Since the capacitance of the parasitic capacitance changes depending upon the area of the overlap between the gate electrode and the LDD region, it is determined by the length of the LDD region included in the overlapping regions.

Also in each of the structures of Embodiment 12 as shown in FIGS. 28A, 28B and 28C, the capacitor 3805 can be similarly omitted.

[Embodiment 14]

In the present embodiment, a multiplexer circuit is provided in the circuit group for generating the divided video signals illustrated in FIG. 1. When a plurality of signals outputted from the multiplexer circuit (distribution signals) are inputted to a plurality of D/A conversion circuit corresponding to the signals, respectively, the combination of the plurality of distribution signals and the plurality of D/A conversion circuits is structured to be changed every time a predetermined time period elapses.

All of the plurality of D/A conversion circuits are theoretically of the same structure. However, actually, the characteristics of the individual D/A conversion circuits are not completely the same. Even if an identical digital signal is inputted, depending on the D/A conversion circuit, the outputted analog signal may have a different potential. The characteristics of a D/A conversion circuit depend on the manufacturing error of circuit elements of the D/A conversion circuit and the ambient temperature of the D/A conversion circuit.

Therefore, the potential of an analog signal outputted from a D/A conversion circuit is always influenced by the characteristics of the D/A conversion circuit. It follows that an analog video signal outputted from a D/A conversion circuit having different characteristics has potential difference from analog video signals outputted from other D/A conversion circuits.

When an analog video signal having potential difference is converted to a divided video signal for divided driving and is sampled by the source signal line driving circuit, the image signal inputted to a pixel by the sampling also has potential difference. The potential difference of the image signal is displayed as a brighter or darker portion, and a stripe due to the brightness/darkness (a division stripe) is visually recognized by an observer.

A circuit group for generating divided video signals according to the present embodiment is described with reference to FIG. 32. It is to be noted that, here, a case where an analog-driven active matrix semiconductor display device is dividedly driven into m divisions is described.

Reference numerals 401, 402, 403, 404, 406, and 407 denote a control circuit, an A/D conversion circuit, a γ correction circuit, a multiplexer circuit, a dividing circuit group, and a replacement data circuit, respectively. Since the structure of a portion 408 surrounded by a dashed line is the same as that illustrated in FIG. 2, the description thereof is omitted in the present embodiment. The dividing circuit group 406 has one dividing circuit, though it is not shown in the figure.

An Hsync signal and a Vsync signal are inputted to the control circuit 401. A clock signal (CK), a start pulse signal (SP), and the like for driving the source signal line driving circuit are inputted from the control circuit 401 to the source signal line driving circuit. Further, signals for driving the A/D conversion circuit 402, the γ correction circuit 403, the dividing circuit 406, and the replacement data circuit 407 are inputted from the control circuit 401 to the respective circuits.

An analog video signal having image information is inputted to the A/D conversion circuit 402. The analog video signal inputted to the A/D conversion circuit 402 is converted to a digital video signal by the A/D conversion circuit 402 and is inputted to the γ correction circuit 403. The digital video signal inputted to the γ correction circuit 403 is, after γ correction, inputted to the multiplexer circuit 404.

The digital video signal after the γ correction inputted to the multiplexer circuit 404 is switched and distributed to multiple output terminals. Then, 1 distribution signals, for example, are outputted from the multiplexer circuit 404. It is to be noted that, when the digital video signal outputted from the γ correction circuit 403 is n bits, 1 distribution signals are digital signals of n bits, respectively.

Figure 33:
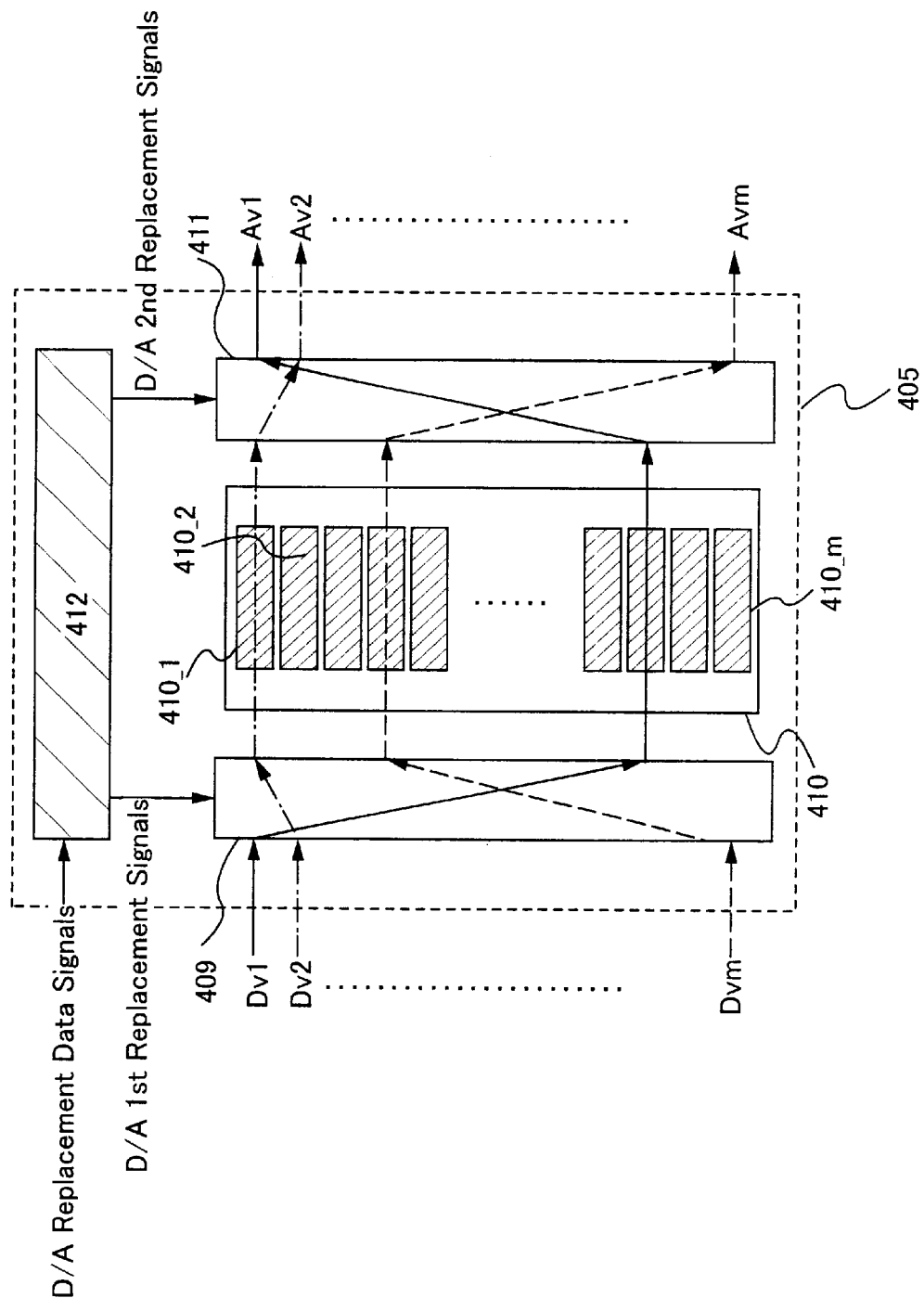
FIG. 33 is a block diagram of part of the circuit group for generating divided video signals.

The 1 distribution signals are simultaneously inputted to a D/A first replacing circuit 409. FIG. 33 is a detailed block diagram of a portion 405 surrounded by a dashed line. Reference numerals 409, 410, 411, and 412 denote the D/A first replacing circuit, a D/A conversion circuit group, a D/A second replacing circuit, and a D/A replacement data processing circuit, respectively. The D/A conversion circuit group 410 has at least 1 D/A conversion circuits (410_1 to 410_m).

The D/A first replacing circuit 409 inputs the inputted digital distribution signals (Dv1 to Dv1) to the D/A conversion circuits (410_1 to 410_m), respectively, using a D/A first replacement signal inputted from the D/A replacement data processing circuit 412. Here, the 1 digital distribution signals (Dv1 to Dvm) to be inputted, uniquely correspond to the 1 D/A conversion circuits (410_1 to 410_m), respectively. Further, which digital distribution signal of the 1 digital distribution signals is inputted to which D/A conversion circuit of the 1 D/A conversion circuits is determined by the D/A first replacement signal inputted from the D/A replacement data processing circuit 412.

The 1 digital distribution signals (Dv1 to Dvm) inputted to the D/A conversion circuits (410_1 to 410_m) are converted by the respective D/A conversion circuits to 1 analog distribution signals (Av1 to Avm), and are inputted to the D/A second replacing circuit 411.

The D/A second replacing circuit 411 inputs the 1 analog distribution signals (Av1 to Avm) outputted from the D/A conversion circuits (410_1 to 410_m) to predetermined 1 dividing circuits, respectively, using a D/A second replacement signal inputted from the D/A replacement data processing circuit 412. More specifically, independently of which of the 1 digital distribution signals (Dv1 to Dvm) is inputted to which of the D/A conversion circuits (410_1 to 410_m) using the D/A first replacement signal, the 1 analog distribution signals (Av1 to Avm) outputted from the 1 D/A conversion circuits (410_1 to 410_m) are inputted to the predetermined I dividing circuits, respectively.

The 1 analog distribution signals (Av1 to Avm) inputted to the 1 dividing circuits are converted to m divided video signals and outputted. The rest of the description is the same as the description of the embodiment mode, and thus, is omitted.

By the above structure according to the present invention, even if a stripe due to the brightness/darkness (a division stripe) is displayed on the screen caused by potential difference between an analog distribution signal outputted from a D/A conversion circuit having different characteristics and analog distribution signals outputted from other D/A conversion circuits, since the place where the division stripe is displayed moves every time a predetermined time period elapses, the division stripe is unliable to be visually recognized by an observer.

It is to be noted that, in the present invention, to set the time period from a time point when the combination of the digital distribution signals and the D/A conversion circuits changes to a time point when the combination changes again such that a division stripe is unliable to be visually recognized by an observer is important. In other words, the time period from a time point when the combination of the digital distribution signals and the D/A conversion circuits changes to a time point when the combination changes again, also corresponds to the time period from a time point when the information of the D/A first replacement signal and the second replacement signal changes to a time point when the information of the D/A first replacement signal and the second replacement signal changes again.

The time period until the combination of the digital distribution signals and the D/A conversion circuits is preferably as short as possible. The shorter the time period is, the more unliable a division stripe is to be visually recognized by an observer. In the present embodiment, the combination of the digital distribution signals and the D/A conversion circuits is set to be changed every time one frame period elapses.

Therefore, according to the present invention, when divided driving is performed, a division stripe is unliable to be visually recognized by an observer. Further, since divided driving is performed, even if the horizontal number of pixels of the active matrix semiconductor display device increases, flicker of the displayed image can be prevented while the driving frequency of the source signal line driving circuit is suppressed, and images having many tones can be displayed with a high precision and with a high resolution.

Further, by the structure illustrated in the present embodiment, a division stripe is more unliable to be visually recognized by an observer compared with the cases of the structures illustrated in Embodiment Mode 1 and Embodiment 3.

Figure 32:
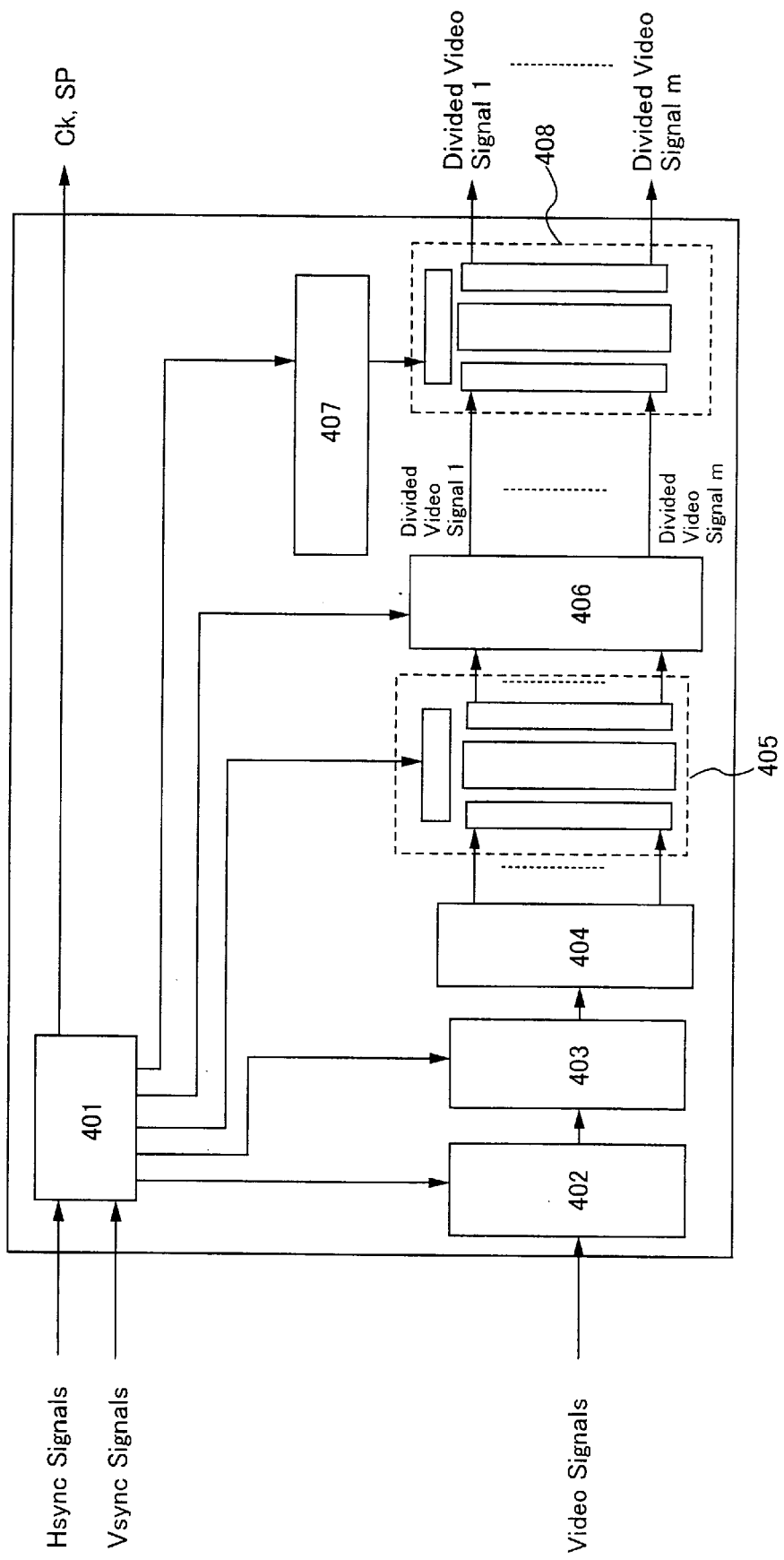
FIG. 32 is a block diagram of a circuit group for generating divided video signals according to the present invention.

In addition to FIGS. 32 and 33, the combination of the D/A conversion circuit and the signal can be replaced before inputting the signal to the D/A conversion circuit, and the replaced combination can be returned to the former state after outputting the signal from the buffer circuit. Describing in detail, the digital distribution signals outputted from the multiplexer 404 are replaced in the D/A replacing circuit 409 before inputting into the D/A conversion circuit (410_1 to 410_m), then the analog distribution signals outputted from the D/A conversion circuit are directly inputted into the dividing circuit 406 without via the D/A second replacing circuit 411. After that, the divided video signals outputted from the dividing circuit are directly inputted into the buffer circuit (109_1 to 109_m) without via the first replacing circuit 108, and the divided video signals outputted from the buffer circuit is replaced and returned to the former state in the second replacing circuit.

[Embodiment 15]

The present invention can be used in various semiconductor display devices (typically, an active matrix liquid crystal display device, an active matrix EL display, an active matrix EC display and the like). Namely, the present invention can be implemented in all semiconductor display devices in which these electro-optical devices are built into a display portion.

Following can be given as such semiconductor display devices: video cameras; digital cameras; projectors (rear type or front type); head mounted displays (goggle type displays); car navigation systems; personal computers; portable information terminals (mobile computers, portable telephones or electronic books etc.) etc. Examples of these are shown in FIGS. 29, 30 and 31.

Figure 29A:
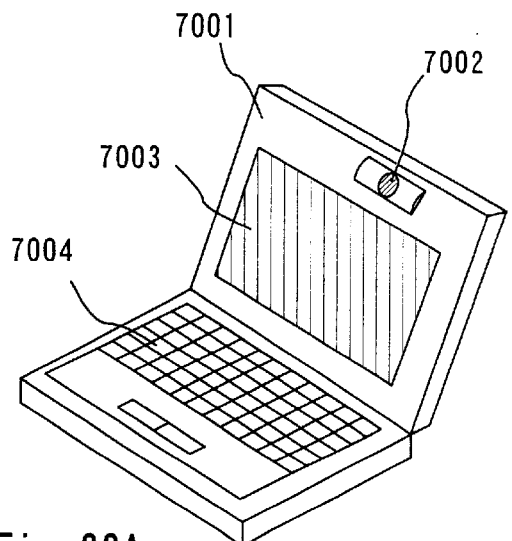
FIGS. 29A to 29E illustrate semiconductor display devices using the present invention.

FIG. 29A is a personal computer which comprises: a main body 7001; an image input section 7002; a display device 7003; and a key board 7004. The semiconductor display device of the present invention can be applied to the display device 7003.

Figure 29B:
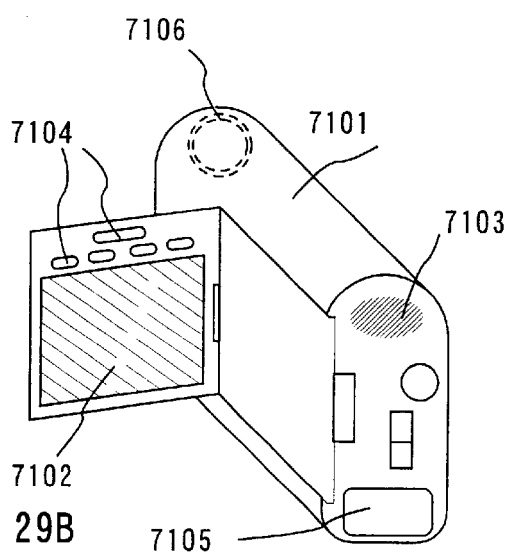

FIG. 29B is a video camera which comprises: a main body 7101; a display device 7102, a voice input section 7103; operation switches 7104; a battery 7105 and an image receiving section 7106. The semiconductor display device of the present invention can be applied to the display device 7102.

Figure 29C:
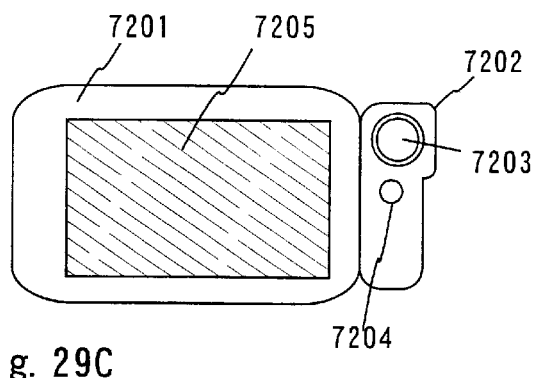

FIG. 29C is a mobile computer which comprises: a main body 7201; a camera section 7202; an image receiving section 7203; operation switches 7204 and a display device 7205. The semiconductor display device of the present invention can be applied to the display device 7205.

Figure 29D:
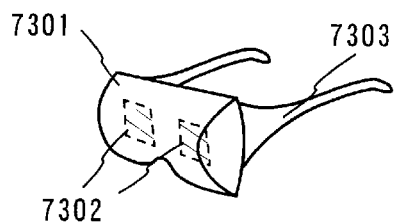

FIG. 29D is a goggle type display which comprises: a main body 7301; a display device 7302; and an arm section 7303. The semiconductor display device of the present invention can be applied to the display device 7302.

Figure 29E:
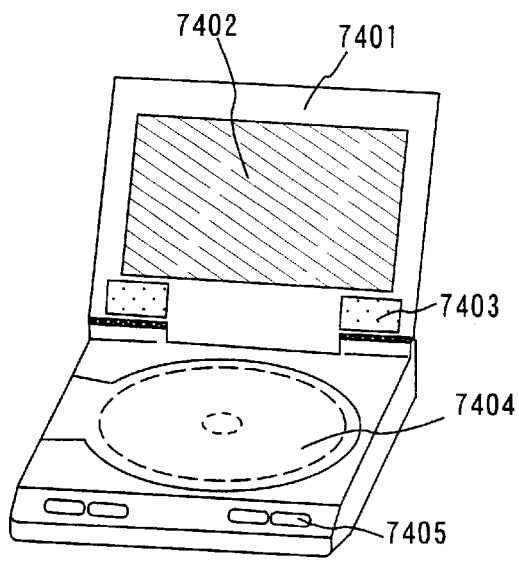

FIG. 29E is a player using a recording medium which records a program (hereinafter referred to as a recording medium) which comprises: a main body 7401; a display device 7402; a speaker section 7403; a recording medium 7404; operation switches 7405. This device uses DVD (digital versatile disc), CD, etc. for the recording medium, and can be used for music appreciation, film appreciation, games and Internet. The semiconductor display device of the present invention can be applied to the display device 7402.

Figure 30A:
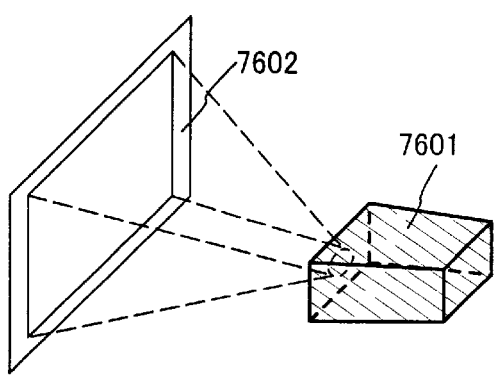
FIGS. 30A to 30D illustrate liquid crystal projectors using the present invention.

FIG. 30A is a front type projector which comprises: an optical light source system and a display device 7601; and a screen 7602. The semiconductor display device of the present invention can be applied to the display device 7601.

Figure 30B:
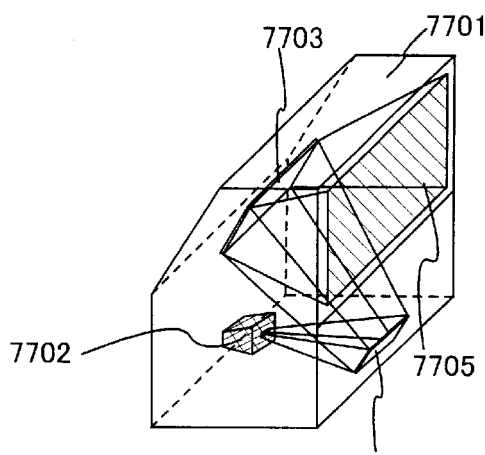

FIG. 30B is a rear type projector which comprises: a main body 7701; an optical light source system and a display device 7702; a mirror 7703; a mirror 7704; and a screen 7705. The semiconductor display device of the present invention can be applied to the display device 7702.

Figure 30C:
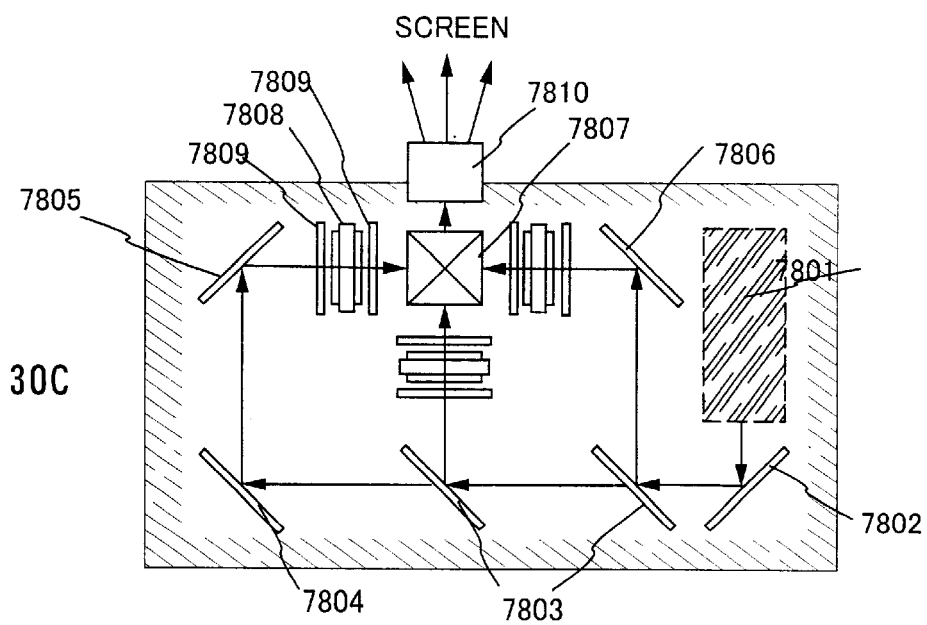

FIG. 30C is a diagram which shows an example of the structure of the optical light source system and display devices 7601 and 7702 of FIGS. 30A and 30B. Each of the optical light source system and display device 7601 and 7702 comprises: an optical light source system 7801; mirrors 7802 and 7804 to 7806; a dichroic mirror 7803; an optical system 7807; a display device 7808; a phase differentiating plate 7809; and a projection optical system 7810. The projection optical system 7810 comprises a plurality of optical lenses having a projection lens. Though the present embodiment shows an example of 3-plate type in which 3 display devices 7808 are used, this is not to limit to this example and a single plate type may be used for instance. Further, an operator may appropriately dispose an optical lens, a film which has a function to polarize light, a film which adjusts a phase difference and an IR film, etc in the optical path shown by an arrow in FIG. 30C.

Figure 30D:
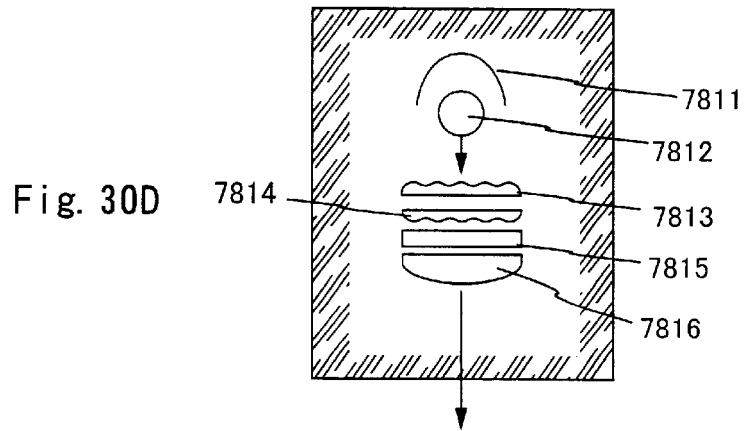

FIG. 30D is a diagram showing an example of a structure of the optical light source system 7801 of FIG. 30C. In the present embodiment the optical light source system 7801 comprises: a reflector 7811; a light source 7812; lens arrays 7813 and 7814; a polarizer conversion element 7815; and a condensing lens 7816. Note that the optical light source system shown in FIG. 30D is merely an example and the structure is not limited to this example. For instance, an operator may appropriately dispose an optical lens, a film which has a function to polarize light, a film which adjusts a phase difference and an IR film, etc.

Figure 31A:
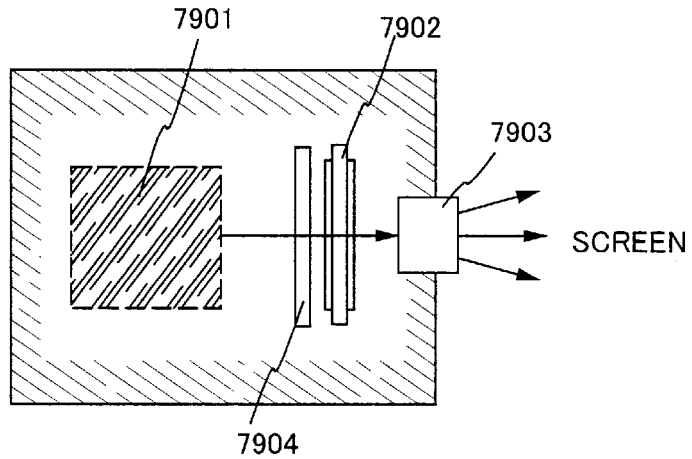
FIGS. 31A to 31C are single plate type liquid crystal projectors using the present invention.

While FIG. 30C shows an example of three-plate type, FIG. 31A is a diagram showing an example of a single plate type. The optical light source system and a display device shown in FIG. 31A comprises: an optical light source system 7901, a display device 7902, and a projection optical system 7903. The projection optical system 7903 comprises a plurality of optical lenses including a projection lens. The light source system and a display device shown in FIG. 31A can be applied to the optical light source systems and display devices 7601 and 7702 shown in FIGS. 30A and 30B. An optical light source system shown in FIG. 30D may be used as the optical light source system 7901. Note that a color filter is disposed in the display device 7902 (not shown) and the displayed image is colored.

Figure 31B:
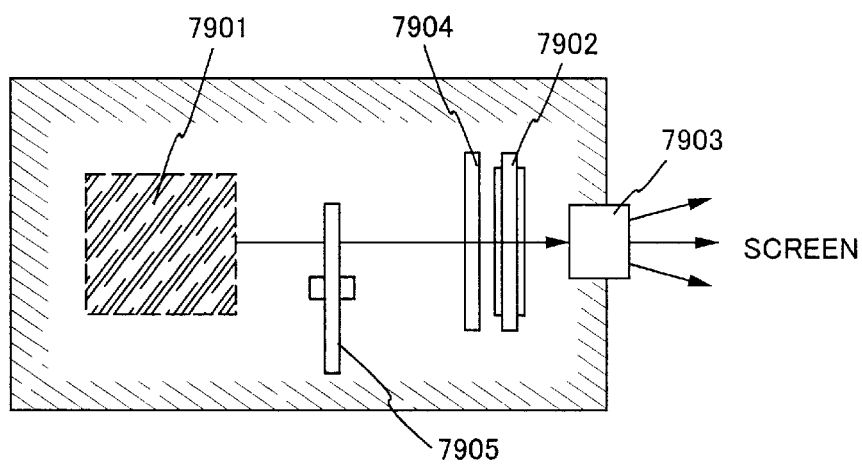

An optical light source system and a display device shown in FIG. 31B is an application of FIG. 31A and the displayed image is colored by using a rotating color filter circular plate 7905 of RGB in place of disposing a color filter. The light source system and a display device shown in FIG. 31B can be applied to the optical light source systems and display devices 7601 and 7702 shown in FIGS. 30A and 30B.

Figure 31C:
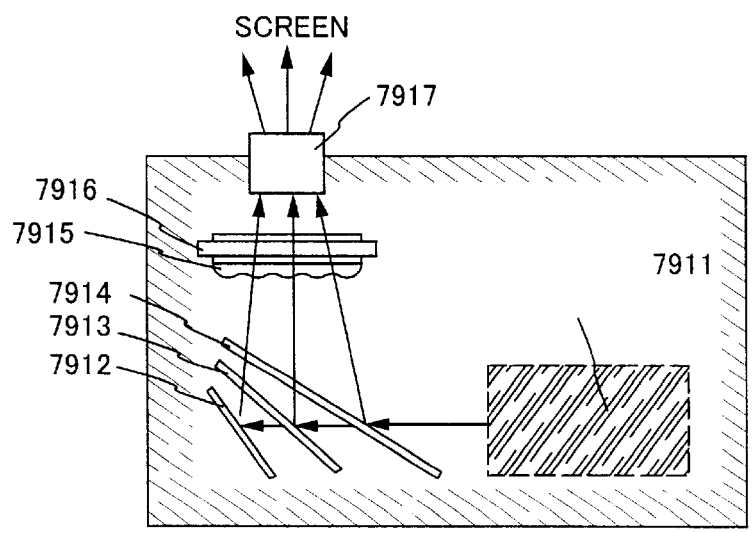

An optical light source system and a display device shown in FIG. 31C is called a color-filter-less single plate system. This system disposed a micro lens array 7915 in the display device 7916 and the displayed image is colored by using a dichroic mirror (green) 7912, a dichroic mirror (red) 7913 and a dichroic mirror (blue) 7914. The projection optical system 7917 comprises a plurality of optical lenses including a projection lens. The light source system and a display device shown in FIG. 31C can be applied to the optical light source systems and display devices 7601 and 7702 shown in FIGS. 30A and 30B. Further as an optical light source system 7911, an optical system using a coupling lens and a collimator lens in addition to the light source may be used.

As described above, the applicable range of the present invention is very large, and it is possible to apply to semiconductor display devices of various fields. By the above structure according to the present invention, even if a stripe due to the brightness/darkness (a division stripe) is displayed on the screen caused by potential difference between a divided video signal outputted from a buffer circuit having different characteristics and other divided video signals, since the place where the division stripe is displayed moves every time a predetermined time period elapses, the division stripe is unliable to be visually recognized by an observer.

Therefore, according to the present invention, when divided driving is performed, a division stripe is unliable to be visually recognized by an observer. Further, since divided driving is performed, even if the horizontal number of pixels of the active matrix semiconductor display device increases, flicker of the displayed image can be prevented while the driving frequency of the source signal line driving circuit is suppressed, and images having many tones can be displayed with a high precision and with a high resolution.

What is claimed is:

1. A semiconductor display device comprising m buffer circuits and a source signal line driving circuit, wherein:

said m buffer circuits correspond to m divided video signals as parallel data, respectively;

said m buffer circuits corresponding to said m divided video signals, respectively, replace one another every time when a predetermined time period elapses;

said m divided video signals inputted to said m buffer circuits are outputted from said m buffer circuits to be inputted to said source signal line driving circuit; and said m divided video signals inputted to said source signal line driving circuit are sampled to be inputted to given m source signal lines corresponding to the m divided video signals, respectively.

2. A semiconductor display device according to claim 1, wherein replacement of said m buffer circuits corresponding to said m divided video signals, respectively, is controlled by a replacement data circuit.

3. A semiconductor device according to claim 1, wherein how said m buffer circuits corresponding to said m divided video signals, respectively, replace one another is determined by a replacement data circuit.

4. A semiconductor display device as claimed in claim 3, wherein:

said replacement data circuit comprises a memory circuit and a counter circuit; and a plurality of replacement data having information with regard to the combination of said m buffer circuits corresponding to the m divided video signals, respectively, are stored in said memory circuit, and one of the replacement data is selected by said counter circuit.

5. A semiconductor display device according to claim 1, wherein said semiconductor display device is selected from the group consisting of an active matrix liquid crystal display device, an active matrix electro-luminescence display device and an active matrix electro-chromic display device.

6. A semiconductor display device according to claim 1, wherein said semiconductor display device is incorporated into an electronic equipment selected from the group consisting of a personal computer, a mobile computer, a goggle type display, a player, a front-type projector, a rear-type projector.

7. A semiconductor display device comprising a dividing circuit, a first replacing circuit, a second replacing circuit, m buffer circuits, and a source signal line driving circuit, wherein:

m divided video signals formed by serial-parallel conversion of a video signal are outputted from said dividing circuit;

said m divided video signals outputted from said dividing circuit are inputted to said first replacing circuit;

said m divided video signals inputted to said first replacing circuit are inputted to said corresponding m buffer circuits, respectively;

said m divided video signals inputted to said m buffer circuits are outputted from said m buffer circuits to be inputted to said second replacing circuit;

the m divided video signals inputted to said second replacing circuit are inputted to given m divided video signal lines corresponding to said m divided video signals, respectively;

said m divided video signals inputted to said m divided video signal lines are inputted to said source signal line driving circuit, to be sampled, and inputted to fixed m source signal lines corresponding to said m divided video signals, respectively; and said m buffer circuits corresponding to said m divided video signals, respectively, replace one another every time when a predetermined time period elapses.

8. A semiconductor display device according to claim 7, wherein replacement of said m buffer circuits corresponding to said m divided video signals, respectively, is controlled by a replacement data circuit.

9. A semiconductor device according to claim 7, wherein how said m buffer circuits corresponding to said m divided video signals, respectively, replace one another is determined by a replacement data circuit.

10. A semiconductor display device as claimed in claim 9, wherein:

said replacement data circuit comprises a memory circuit and a counter circuit; and a plurality of replacement data having information with regard to the combination of said m buffer circuits corresponding to the m divided video signals, respectively, are stored in said memory circuit, and one of the replacement data is selected by said counter circuit.

11. A semiconductor display device according to claim 7, wherein said semiconductor display device is selected from the group consisting of an active matrix liquid crystal display device, an active matrix electro-luminescence display device and an active matrix electro-chromic display device.

12. A semiconductor display device according to claim 7, wherein said semiconductor display device is incorporated into an electronic equipment selected from the group consisting of a personal computer, a mobile computer, a goggle type display, a player, a front-type projector, a rear-type projector.

13. A semiconductor display device comprising a dividing circuit, a first replacing circuit, m buffer circuits, and a source signal line driving circuit, wherein:
   said source signal line driving circuit has a second replacing circuit;
   m divided video signals formed by serial-parallel conversion of a video signal are outputted from said dividing circuit;
   said m divided video signals outputted from said dividing circuit are inputted to said first replacing circuit;
   said m divided video signals inputted to said first replacing circuit are inputted to said corresponding m buffer circuits, respectively;
   said m divided video signals inputted to said m buffer circuits are outputted from said m buffer circuits to be inputted to said second replacing circuit;
   said m divided video signals inputted to said second replacing circuit are sampled to be inputted to given m source signal lines corresponding to said m divided video signals, respectively; and
   said m buffer circuits corresponding to said m divided video signals replace one another every time when a predetermined time period elapses.

14. A semiconductor display device according to claim 13, wherein replacement of said m buffer circuits corresponding to said m divided video signals, respectively, is controlled by a replacement data circuit.

15. A semiconductor device according to claim 13, wherein how said m buffer circuits corresponding to said m divided video signals, respectively, replace one another is determined by a replacement data circuit.

16. A semiconductor display device as claimed in claim 15, wherein:
   said replacement data circuit comprises a memory circuit and a counter circuit; and
   a plurality of replacement data having information with regard to the combination of said m buffer circuits corresponding to the m divided video signals, respectively, are stored in said memory circuit, and one of the replacement data is selected by said counter circuit.

17. A semiconductor display device according to claim 13, wherein said semiconductor display device is selected from the group consisting of an active matrix liquid crystal display device, an active matrix electro-luminescence display device and an active matrix electro-chromic display device.

18. A semiconductor display device according to claim 13, wherein said semiconductor display device is incorporated into an electronic equipment selected from the group consisting of a personal computer, a mobile computer, a goggle type display, a player, a front-type projector, a rear-type projector.

19. A semiconductor display device comprising a multiplexer circuit, a 1 D/A conversion circuits, and a dividing circuits, wherein:
   said 1 D/A conversion circuits correspond to 1 digital distribution signals outputted from said multiplexer circuit, respectively;
   said 1 D/A conversion circuits corresponding to the 1 digital distribution signals, respectively, replace one another every time when a predetermined time period elapses; and
   said 1 digital distribution signals inputted to said 1 D/A conversion circuits are converted to 1 analog distribution signals and to be inputted to said corresponding given 1 dividing circuits, respectively.

20. A semiconductor display device according to claim 19, wherein said semiconductor display device is selected from the group consisting of an active matrix liquid crystal display device, an active matrix electro-luminescence display device and an active matrix electro-chromic display device.

21. A semiconductor display device according to claim 19, wherein said semiconductor display device is incorporated into an electronic equipment selected from the group consisting of a personal computer, a mobile computer, a goggle type display, a player, a front-type projector, a rear-type projector.

* * * * *